US012341532B2

(12) United States Patent
Anderson

(10) Patent No.: US 12,341,532 B2
(45) Date of Patent: *Jun. 24, 2025

(54) ACCELERATED POLYNOMIAL CODING SYSTEM AND METHOD

(71) Applicant: DARK MATTER COMPUTING, INC., Waco, TX (US)

(72) Inventor: Michael H. Anderson, Udon Thani (TH)

(73) Assignee: STREAMSCALE, INC., Waco, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 18/386,183

(22) Filed: Nov. 1, 2023

(65) Prior Publication Data

US 2024/0063825 A1    Feb. 22, 2024

Related U.S. Application Data

(63) Continuation of application No. 17/747,828, filed on May 18, 2022, now Pat. No. 11,848,686.

(51) Int. Cl.
*H03M 13/11* (2006.01)
*G06F 9/48* (2006.01)
(Continued)

(52) U.S. Cl.
CPC ...... *H03M 13/1575* (2013.01); *G06F 9/4881* (2013.01); *G06F 9/5027* (2013.01);
(Continued)

(58) Field of Classification Search
CPC ........... H03M 13/6516; H03M 13/154; H03M 13/1575; G06F 15/8007; G06F 9/5027; G06F 9/4881
See application file for complete search history.

(56) References Cited

U.S. PATENT DOCUMENTS 4,633,470 A    12/1986  Welch et al.
7,594,095 B1    9/2009  Nordquist
(Continued)

FOREIGN PATENT DOCUMENTS

CN    113485751    10/2021

OTHER PUBLICATIONS

Anvin, H. Peter, "The mathematics of RAID-6," (2007), 9 pages.
(Continued)

*Primary Examiner* — Guy J Lamarre
(74) *Attorney, Agent, or Firm* — Womble Bond Dickinson (US) LLP

(57) ABSTRACT

A system using accelerated error-correcting code in the storage and retrieval of data, wherein a single-instruction-multiple-data (SIMD) processor, SIMD instructions, non-volatile storage media, and an I/O controller implement a polynomial coding system including: a data matrix including at least one vector and including rows of at least one block of original data; a check matrix including more than two rows of at least one block of check data in the main memory; and a thread that executes on a SIMD CPU core and including: a parallel multiplier that multiplies the at least one vector of the data matrix by a single factor; and a parallel linear feedback shift register (LFSR) sequencer or a parallel syndrome sequencer configured to order load operations of the original data into at least one vector register of the SIMD CPU core and respectively compute the check data or syndrome data with the parallel multiplier.

20 Claims, 26 Drawing Sheets

(51) Int. Cl.
  *G06F 9/50*     (2006.01)
  *G06F 15/80*    (2006.01)
  *H03M 13/00*    (2006.01)
  *H03M 13/03*    (2006.01)
  *H03M 13/15*    (2006.01)
  *H04L 1/00*     (2006.01)
  *H04L 1/1812*   (2023.01)

(52) U.S. Cl.
  CPC ...... *G06F 15/8007* (2013.01); *H03M 13/154* (2013.01); *H03M 13/6516* (2013.01)

(56) References Cited

U.S. PATENT DOCUMENTS

| | | | |
|---|---|---|---|
| 8,683,296 | B2 | 3/2014 | Anderson et al. |
| 9,722,632 | B2 | 8/2017 | Anderson |
| 11,848,686 | B2 * | 12/2023 | Anderson ........... G06F 15/8007 |
| 2006/0288193 | A1 | 12/2006 | Hsu |
| 2009/0154690 | A1 | 6/2009 | Wu |
| 2011/0078415 | A1 | 3/2011 | Johnson et al. |
| 2015/0135182 | A1 | 5/2015 | Liland et al. |
| 2019/0102180 | A1 | 4/2019 | Hari et al. |

OTHER PUBLICATIONS

Chien, R. T., "Cyclic Decoding Procedures for Bose-Chaudhuri-Hocquenghem Codes," IEEE Transactions on Information Theory 10.4 (1964): 357-363.

Clarke, C. K. P., "Reed-Solomon error correction," BBC R&D White Paper WHP031 (2002), 47 pages.

Lim, Raymond S., "A Decoding Procedure for the Reed-Solomon Codes," NASA Technical Paper 1286 (1978), 26 pages.

Maddock, Robert, et al. "Surviving Two Disk Failures Introducing Various RAID 6 Implementations," Xyratex, Issue 3.0, Oct. 2007, 16 pages.

Plank, James S., "A Tutorial on Reed-Solomon Coding for Fault-Tolerance in RAID-like Systems," Software—Practice & Experience, 27(9):995-1012, Sep. 1997.

Plank, James S., et al., "Note: Correction to the 1997 Tutorial on Reed-Solomon Coding," Technical Report CS-03-504, University of Tennessee, Apr. 2003, 6 pages.

Plank, James S., "All About Erasure Codes:—Reed-Solomon Coding-LDPC Coding," ICL, Aug. 20 (2004): 2004, 53 pages.

* cited by examiner

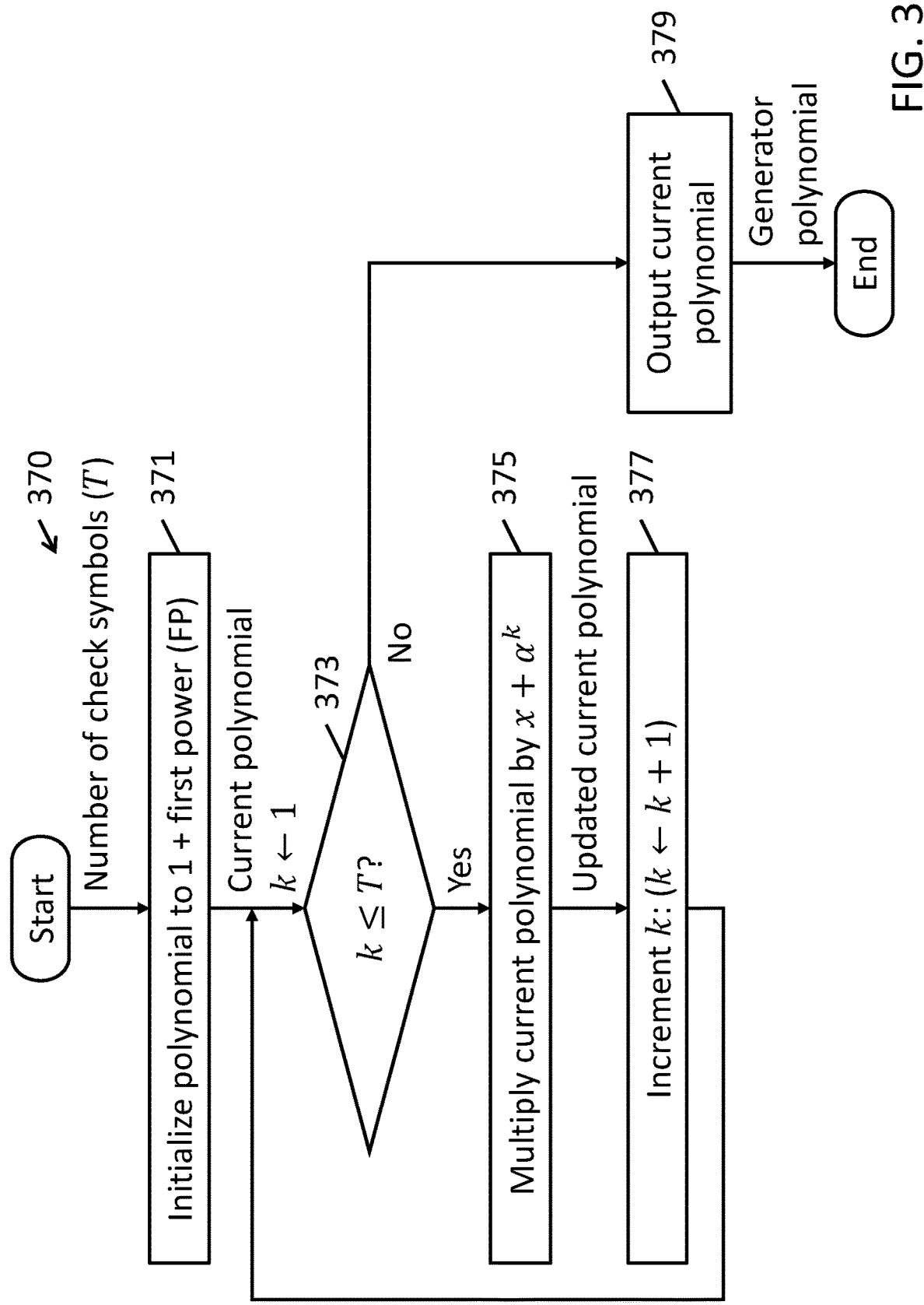

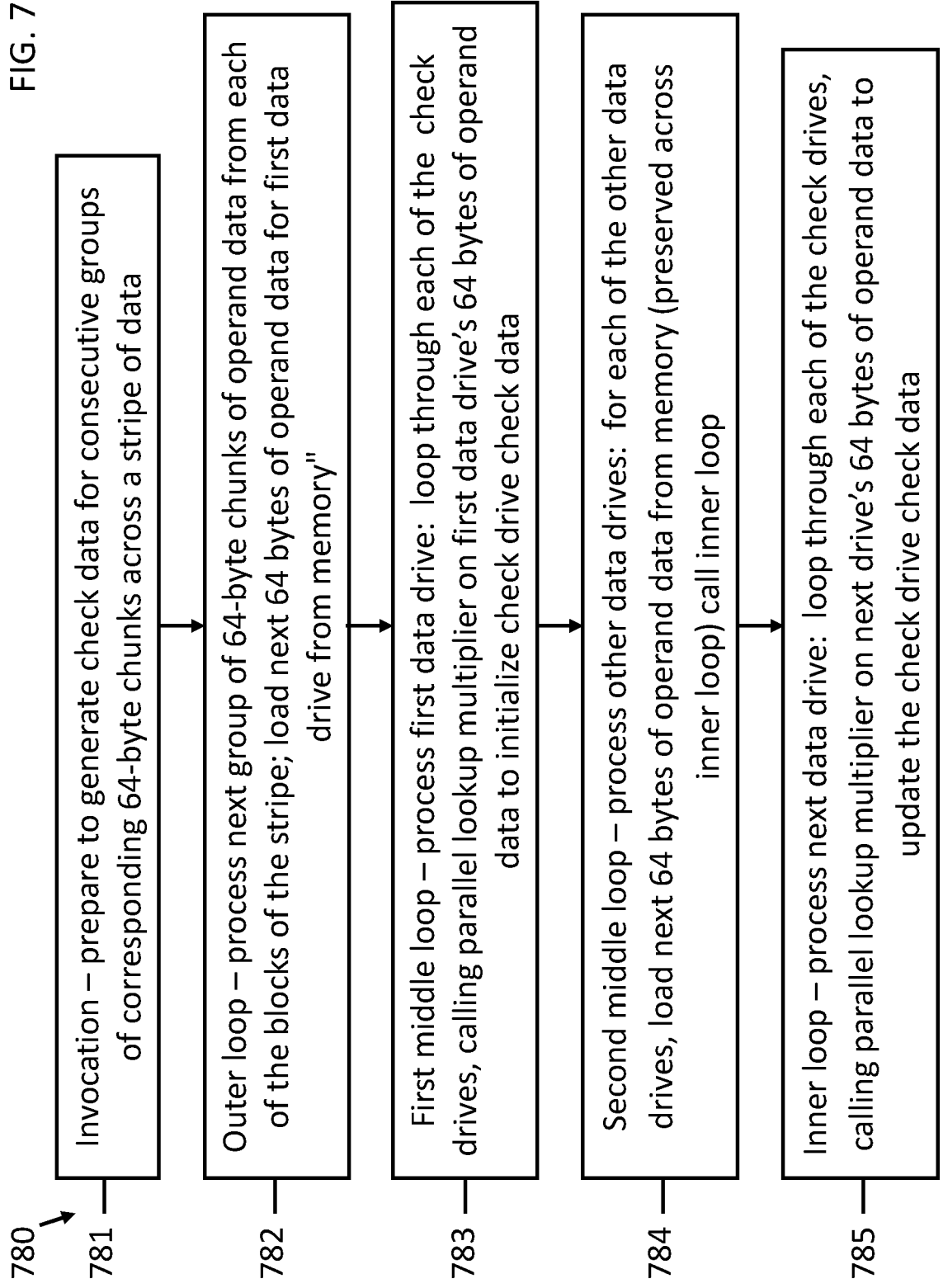

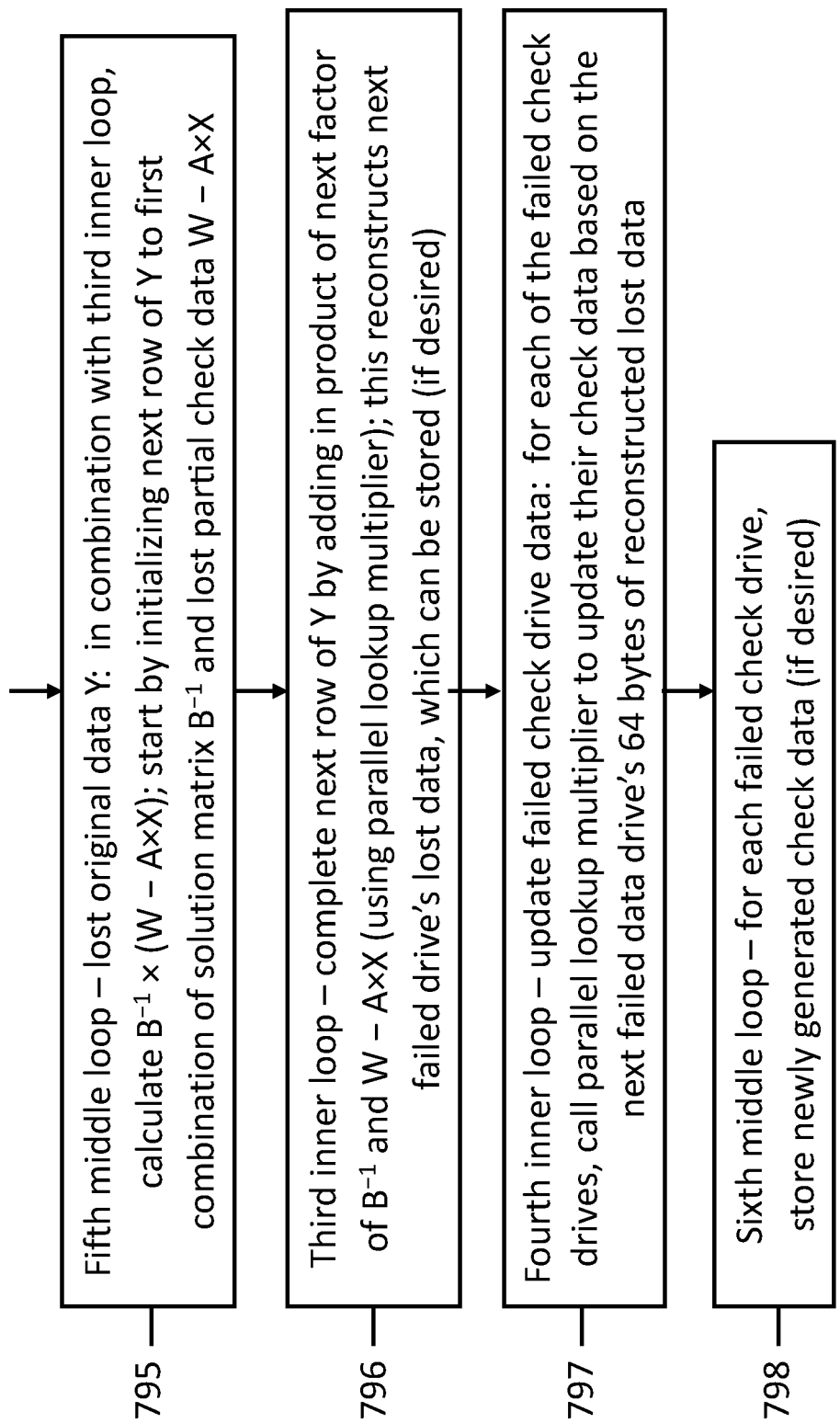

795 — Fifth middle loop – lost original data Y: in combination with third inner loop, calculate $B^{-1} \times (W - A \times X)$; start by initializing next row of Y to first combination of solution matrix $B^{-1}$ and lost partial check data $W - A \times X$ 796 — Third inner loop – complete next row of Y by adding in product of next factor of $B^{-1}$ and $W - A \times X$ (using parallel lookup multiplier); this reconstructs next failed drive's lost data, which can be stored (if desired)

797 — Fourth inner loop – update failed check drive data: for each of the failed check drives, call parallel lookup multiplier to update their check data based on the next failed data drive's 64 bytes of reconstructed lost data 798 — Sixth middle loop – for each failed check drive, store newly generated check data (if desired)

ACCELERATED POLYNOMIAL CODING SYSTEM AND METHOD

CROSS-REFERENCE TO RELATED APPLICATION(S)

This application is a continuation of U.S. patent application Ser. No. 17/747,828, filed May 18, 2022, the disclosure of which is incorporated herein by reference in its entirety.

BACKGROUND

1. Field

Aspects of embodiments of the present disclosure are directed toward systems and methods for polynomial encoding and error recovery using a linear feedback shift register (LFSR) or matrices generated by an LFSR.

2. Description of Related Art

An error-correcting code (ECC) is useful for forward error-correction in applications like a redundant array of independent disks (RAID) or high-speed communication systems. In a typical error correcting code, data (or original data) is organized in stripes, each of which is broken up into N equal-sized blocks, or data blocks, for some positive integer N. The data for each stripe is thus reconstructable by putting the N data blocks together. However, to handle situations where one or more of the original N data blocks gets lost, error correcting codes also encode an additional M equal-sized blocks (called check blocks or check data) from the original N data blocks, for some positive integer M.

The N data blocks and the M check blocks are all the same size. Accordingly, there are a total of N+M equal-sized blocks after encoding. The N+M blocks may, for example, be transmitted to a receiver as N+M separate packets, or written to N+M corresponding storage drives (e.g., hard disk drives, solid state storage devices, or flash memory chips). For ease of description, all N+M blocks after encoding will be referred to as encoded blocks, though some (for example, N of them) may contain unencoded portions of the original data. That is, the encoded data refers to the original data together with the check data.

The M check blocks build redundancy into the system, in a very efficient manner, in that the original data (as well as any lost check data) can be reconstructed if any N of the N+M encoded blocks are received by the receiver, or if any N of the N+M storage devices are functioning correctly. Note that such an error correcting code is also referred to as "optimal."

The above information disclosed in this Background section is only for enhancement of understanding of the present disclosure, and therefore it may contain information that does not form the prior art that is already known to a person of ordinary skill in the art.

SUMMARY

Aspects of embodiments of the present invention address these problems by providing a practical polynomial coding system that, for byte-level RAID processing (where each byte is made up of 8 bits), performs well even for values of N+M as large as 255 drives. Previous art, such as the Intel ISA-L library, employs a default Vandermonde encoding matrix that is limited to 14 drives or fewer. By contrast, using an LFSR (or a matrix generated by an LFSR), polynomial codes support both erasure coding and unknown error decoding, thereby improving both system reliability and system performance.

Higher check disk count can offer increased reliability and decreased cost. The higher reliability comes from factors such as the ability to withstand more drive failures. The decreased cost arises from factors such as the ability to create larger groups of data drives. For example, systems with two checks disks are typically limited to group sizes of 10 or fewer drives for reliability reasons. With a higher check disk count, larger groups are available, which can lead to fewer overall components for the same unit of storage and hence, lower cost.

Aspects of embodiments of the present disclosure relate to systems and methods for polynomial encoding and error recovery using a linear feedback shift register (LFSR) or matrices generated by an LFSR.

Further aspects are directed to a system and method for implementing a fast solution matrix algorithm for Reed-Solomon codes. While known solution matrix algorithms compute an N×N solution matrix (see, for example, J. S. Plank, "A Tutorial on Reed-Solomon Coding for Fault-Tolerance in RAID-like Systems," Software—Practice & Experience, 27(9):995-1012, September 1997, and J. S. Plank and Y. Ding, "Note: Correction to the 1997 Tutorial on Reed-Solomon Coding," Technical Report CS-03-504, University of Tennessee, April 2003), requiring $O(N^3)$ operations, regardless of the number of failed data drives, aspects of embodiments of the present invention compute only an F×F solution matrix, where F is the number of failed data drives. The overhead for computing this F×F solution matrix is approximately $F^3/3$ multiplication operations and the same number of addition operations. Not only is $F \leq N$, in almost any practical application, the number of failed data drives F is considerably smaller than the number of data drives N. Accordingly, the fast solution matrix algorithm according to some embodiments is considerably faster than any known approach for practical values of F and N.

Further aspects are directed to employing a separate encoding and decoding scheme to achieve superior results. For encoding, either an LFSR or a matrix generated by an LFSR generates the redundant symbols. For decoding, a Vandermonde matrix applied to both the received data and redundant symbols result in superior error correction ability.

Further aspects are directed to reducing or minimizing the number of constants that must be fetched from main memory in order to compute either an encoding or decoding result.

According to one embodiment of the present disclosure, a system adapted to use accelerated error-correcting code (ECC) processing to improve the storage and retrieval of digital data distributed across a plurality of drives, includes: at least one processor including at least one single-instruction-multiple-data (SIMD) central processing unit (CPU) core that executes SIMD instructions and loads original data from a main memory and stores check data to the main memory, the SIMD CPU core including at least 16 vector registers, each of the vector registers storing at least 16 bytes; at least one system drive including at least one non-volatile storage medium that stores the SIMD instructions; a plurality of data drives each including at least one non-volatile storage medium that stores at least one block of the original data, the at least one block including at least 512 bytes; more than two check drives each including at least one non-volatile storage medium that stores at least one block of the check data; and at least one input/output (I/O) controller that stores the at least one block of the check data from the main memory to the check drives, wherein the processor, the SIMD instructions, the non-volatile storage media, and the I/O controller are configured to implement a polynomial coding system including: a data matrix including at least one vector and including a plurality of rows of at least one block of the original data in the main memory, each of the rows being stored on a different one of the data drives; a check matrix including more than two rows of the at least one block of the check data in the main memory, each of the rows being stored on a different one of the check drives; and a thread that executes on the SIMD CPU core and including: at least one parallel multiplier that multiplies the at least one vector of the data matrix by a single factor to compute parallel multiplier results including at least one vector; and a parallel linear feedback shift register (LFSR) sequencer wherein the parallel LFSR sequencer orders load operations of the original data into at least one of the vector registers and computes the check data with the at least one parallel multiplier and stores the computed check data from the vector registers to the main memory.

The processing core may include a plurality of processing cores; the thread may include a plurality of threads; and the polynomial coding system may further include a scheduler for generating the check data by: dividing the data matrix into a plurality of data matrices; dividing the check matrix into a plurality of check matrices; assigning corresponding ones of the data matrices and the check matrices to the threads; and assigning the threads to the processing cores to concurrently generate portions of the check data corresponding to the check matrices from respective ones of the data matrices.

The SIMD instructions implementing the at least one parallel multiplier of the thread may include a GF2P8MULB instruction.

A primitive polynomial of a Galois field of a Galois field multiplication instruction of the processing core may be different from a primitive polynomial of a Galois field of a polynomial code of the polynomial coding system, and the SIMD instructions may include instructions corresponding to the at least one parallel multiplier include instructions that, when executed by the processing core, cause the processing core to implement a parallel lookup Galois field multiplier.

The instructions that implement the parallel lookup Galois field multiplier may include a SIMD shuffle instruction.

The LFSR sequencer may be configured to compute T check symbols of the check data by supplying K data symbols of the original data to a LFSR configured with T coefficients supplied to T taps of the LFSR, wherein the T coefficients are coefficients of a generator polynomial.

According to one embodiment of the present disclosure, a system adapted to use accelerated error-correcting code (ECC) processing to improve the storage and retrieval of digital data distributed across a plurality of drives, includes: at least one processor including at least one single-instruction-multiple-data (SIMD) central processing unit (CPU) core that executes SIMD instructions and loads received original data and received check data from a main memory and computes syndrome data; the SIMD CPU core including at least 16 vector registers, each of the vector registers storing at least 16 bytes; at least one system drive including at least one non-volatile storage medium that stores the SIMD instructions; a plurality of data drives each including at least one non-volatile storage medium that stores at least one block of the received original data, the at least one block including at least 512 bytes; more than two check drives each including at least one non-volatile storage medium that stores at least one block of the received check data; and at least one input/output (I/O) controller that reads at least one block of the received check data from the check drives and stores the at least one block of the received check data to the main memory, wherein the processor, the SIMD instructions, the non-volatile storage media and the I/O controller implement a polynomial coding system, including: a received data matrix including at least one vector and including at least one row of at least one block of the received original data in the main memory, each row of the at least one row being stored on a different one of the data drives; a received check matrix including at least one row of at least one block of the received check data in the main memory, each row of the at least one row being stored on a different one of the check drives; and a thread that executes on the SIMD CPU core and including: at least one parallel multiplier that multiplies the at least one vector of the received original data by a single factor to compute parallel multiplier results including at least one vector; and a parallel syndrome sequencer wherein the parallel syndrome sequencer: orders load operations of the received original data into at least one of the vector registers and load operations of the received check data into at least one of the vector registers; and computes the syndrome data with the at least one parallel multiplier.

The at least one processor may include a plurality of processing cores; the thread may include a plurality of threads; and the polynomial coding system may further include a scheduler for generating the syndrome data by: dividing the received data matrix into a plurality of received data matrices; dividing the received check matrix into a plurality of received check matrices; assigning corresponding ones of the received data matrices and the received check matrices to the threads; and assigning the threads to the processing cores to concurrently compute the syndrome data based on respective ones of the received check matrices and the received data matrices.

The SIMD instructions implementing the at least one parallel multiplier of the thread may include a GF2P8MULB instruction.

A primitive polynomial of a Galois field of a Galois field multiplication instruction of the SIMD CPU core may be different from a primitive polynomial of a Galois field of a polynomial code of the polynomial coding system, and the SIMD instructions may include instructions corresponding to the at least one parallel multiplier include instructions that, when executed by the SIMD CPU core, cause the SIMD CPU core to implement a parallel lookup Galois field multiplier.

The instructions that implement the parallel lookup Galois field multiplier may include a SIMD shuffle instruction.

According to one embodiment of the present disclosure, a method for improving the storage and retrieval of digital data distributed across a plurality of drives using accelerated error-correcting code (ECC) processing in a system includes: at least one processor including at least one single-instruction-multiple-data (SIMD) central processing unit (CPU) core that executes SIMD instructions and loads original data from a main memory and stores check data to the main memory, the SIMD CPU core including at least 16 vector registers, each of the vector registers storing at least 16 bytes; at least one system drive including at least one non-volatile storage medium that stores the SIMD instructions; a plurality of data drives each including at least one non-volatile storage medium that stores at least one block of the original data, the at least one block including at least 512 bytes; more than two check drives each including at least one non-volatile storage medium that stores at least one block of the check data; and at least one input/output (I/O) controller that stores the at least one block of the check data from the main memory to the check drives, the method including: loading a data matrix including at least one vector and including a plurality of rows of at least one block of the original data into the main memory, each of the rows being stored on a different one of the data drives; loading a check matrix including more than two rows of the at least one block of the check data in the main memory, each of the rows being stored on a different one of the check drives; and executing a thread on the SIMD CPU core, the thread including: at least one parallel multiplier that multiplies the at least one vector of the data matrix by a single factor to compute parallel multiplier results including at least one vector; and a parallel linear feedback shift register (LFSR) sequencer wherein the parallel LFSR sequencer orders load operations of the original data into at least one of the vector registers and computes the check data with the at least one parallel multiplier and stores the computed check data from the vector registers to the main memory in accordance with a polynomial code.

The at least one processor may include a plurality of processing cores; the thread may include a plurality of threads; and the method may further include: dividing the data matrix into a plurality of data matrices; dividing the check matrix into a plurality of check matrices; assigning, by a scheduler, corresponding ones of the data matrices and the check matrices to the threads; and assigning, by the scheduler, the threads to the processing cores to concurrently generate portions of the check data corresponding to the check matrices from respective ones of the data matrices.

The at least one parallel multiplier of the thread may be implemented by one or more SIMD instructions including a GF2P8MULB instruction.

A primitive polynomial of a Galois field of a Galois field multiplication instruction of the SIMD CPU core may be different from a primitive polynomial of a Galois field of the polynomial code, and the SIMD instructions may include instructions corresponding to the at least one parallel multiplier include instructions that, when executed by the SIMD CPU core, cause the SIMD CPU core to implement a parallel lookup Galois field multiplier.

The instructions that implement the parallel lookup Galois field multiplier may include a SIMD shuffle instruction.

The LFSR sequencer may be configured to compute T check symbols of the check data by supplying K data symbols of the original data to a LFSR configured with T coefficients supplied to T taps of the LFSR, wherein the T coefficients are coefficients of a generator polynomial.

According to one embodiment of the present disclosure, a method for improving the storage and retrieval of digital data distributed across a plurality of drives using accelerated error-correcting code (ECC) processing in a system includes: at least one processor including at least one single-instruction-multiple-data (SIMD) central processing unit (CPU) core that executes SIMD instructions and loads received original data and received check data from a main memory and computes syndrome data; the SIMD CPU core including at least 16 vector registers, each of the vector registers storing at least 16 bytes; at least one system drive including at least one non-volatile storage medium that stores the SIMD instructions; a plurality of data drives each including at least one non-volatile storage medium that stores at least one block of the received original data, the at least one block including at least 512 bytes; more than two check drives each including at least one non-volatile storage medium that stores at least one block of the received check data; and at least one input/output (I/O) controller that reads at least one block of the received check data from the check drives and stores the at least one block of the received check data to the main memory, the method including: loading a received data matrix including at least one vector and including at least one row of at least one block of the received original data into the main memory, each row of the at least one row being stored on a different one of the data drives; loading a received check matrix including at least one row of at least one block of the received check data into the main memory, each row of the at least one row being stored on a different one of the check drives; and executing a thread on the SIMD CPU core, the thread including: at least one parallel multiplier that multiplies the at least one vector of the received original data by a single factor to compute parallel multiplier results including at least one vector; and a parallel syndrome sequencer wherein the parallel syndrome sequencer: orders load operations of the received original data into at least one of the vector registers and load operations of the received check data into at least one of the vector registers; and computes the syndrome data with the at least one parallel multiplier in accordance with a polynomial code.

The at least one processor may include a plurality of processing cores; the thread may include a plurality of threads; and the method may further include: dividing the received data matrix into a plurality of received data matrices; dividing the received check matrix into a plurality of received check matrices; assigning, by a scheduler, corresponding ones of the received data matrices and the received check matrices to the threads; and assigning, by the scheduler, the threads to the processing cores to concurrently compute the syndrome data based on respective ones of the received check matrices and the received data matrices.

The SIMD instructions implementing the at least one parallel multiplier of the thread may include a GF2P8MULB instruction.

A primitive polynomial of a Galois field of a Galois field multiplication instruction of the SIMD CPU core may be different from a primitive polynomial of a Galois field of the polynomial code, and the SIMD instructions may include instructions corresponding to the at least one parallel multiplier include instructions that, when executed by the SIMD CPU core, cause the SIMD CPU core to implement a parallel lookup Galois field multiplier.

The instructions that implement the parallel lookup Galois field multiplier may include a SIMD shuffle instruction.

According to one embodiment of the present disclosure, a non-volatile computer readable medium having instructions stored thereon that, when executed by a processor, cause the processor to implement accelerated error-correcting code (ECC) processing to improve the storage and retrieval of digital data distributed across a plurality of drives in a system includes: at least one processor including at least one single-instruction-multiple-data (SIMD) central processing unit (CPU) core that executes SIMD instructions and loads original data from a main memory and stores check data to the main memory, the SIMD CPU core including at least 16 vector registers, each of the vector registers storing at least 16 bytes; at least one system drive including at least one non-volatile storage medium that stores the SIMD instructions; a plurality of data drives each including at least one non-volatile storage medium that stores at least one block of the original data, the at least one block including at least 512 bytes; more than two check drives each including at least one non-volatile storage medium that stores at least one block of the check data; and at least one input/output (I/O) controller that stores the at least one block of the check data from the main memory to the check drives, wherein the instructions stored on the non-volatile computer readable medium, when executed by the at least one processor, cause the at least one processor to: load a data matrix including at least one vector and including a plurality of rows of at least one block of the original data into the main memory, each of the rows being stored on a different one of the data drives; load a check matrix including more than two rows of the at least one block of the check data in the main memory, each of the rows being stored on a different one of the check drives; and execute a thread on the SIMD CPU core, the thread including: at least one parallel multiplier that multiplies the at least one vector of the data matrix by a single factor to compute parallel multiplier results including at least one vector; and a parallel linear feedback shift register (LFSR) sequencer wherein the parallel LFSR sequencer orders load operations of the original data into at least one of the vector registers and computes the check data with the at least one parallel multiplier and stores the computed check data from the vector registers to the main memory in accordance with a polynomial code.

The at least one processor may include a plurality of processing cores; the thread may include a plurality of threads; and the instructions may further include instructions that, when executed by the at least one processor, cause the at least one processor to: divide the data matrix into a plurality of data matrices; divide the check matrix into a plurality of check matrices; assign, by a scheduler, corresponding ones of the data matrices and the check matrices to the threads; and assign, by the scheduler, the threads to the processing cores to concurrently generate portions of the check data corresponding to the check matrices from respective ones of the data matrices.

The instructions implementing the at least one parallel multiplier may include one or more SIMD instructions including a GF2P8MULB instruction.

A primitive polynomial of a Galois field of a Galois field multiplication instruction of the SIMD CPU core may be different from a primitive polynomial of a Galois field of the polynomial code, and the SIMD instructions may include instructions corresponding to the at least one parallel multiplier include instructions that, when executed by the SIMD CPU core, cause the SIMD CPU core to implement a parallel lookup Galois field multiplier.

The instructions that implement the parallel lookup Galois field multiplier may include a SIMD shuffle instruction.

The instructions that implement the LFSR sequencer may include instructions to compute T check symbols of the check data by supplying K data symbols of the original data to a LFSR configured with T coefficients supplied to T taps of the LFSR, wherein the T coefficients are coefficients of a generator polynomial.

According to one embodiment of the present disclosure, a non-volatile computer readable medium having instructions stored thereon that, when executed by a processor, cause the processor to implement accelerated error-correcting code (ECC) processing to improve the storage and retrieval of digital data distributed across a plurality of drives in a system including: at least one processor including at least one single-instruction-multiple-data (SIMD) central processing unit (CPU) core that executes SIMD instructions and loads received original data and received check data from a main memory and computes syndrome data; the SIMD CPU core including at least 16 vector registers, each of the vector registers storing at least 16 bytes; at least one system drive including at least one non-volatile storage medium that stores the SIMD instructions; a plurality of data drives each including at least one non-volatile storage medium that stores at least one block of the received original data, the at least one block including at least 512 bytes; more than two check drives each including at least one non-volatile storage medium that stores at least one block of the received check data; and at least one input/output (I/O) controller that reads at least one block of the received check data from the check drives and stores the at least one block of the received check data to the main memory, wherein the instructions stored on the non-volatile computer readable medium, when executed by the at least one processor, cause the at least one processor to: load a received data matrix including at least one vector and including at least one row of at least one block of the received original data into the main memory, each row of the at least one row being stored on a different one of the data drives; load a received check matrix including at least one row of at least one block of the received check data into the main memory, each row of the at least one row being stored on a different one of the check drives; and execute a thread on the SIMD CPU core, the thread including: at least one parallel multiplier that multiplies the at least one vector of the received original data by a single factor to compute parallel multiplier results including at least one vector; and a parallel syndrome sequencer wherein the parallel syndrome sequencer: orders load operations of the received original data into at least one of the vector registers and load operations of the received check data into at least one of the vector registers; and computes the syndrome data with the at least one parallel multiplier in accordance with a polynomial code.

The at least one processor may include a plurality of processing cores; the thread may include a plurality of threads; and the instructions may further include instructions that, when executed by the at least one processor, cause the at least one processor to: divide the received data matrix into a plurality of received data matrices; divide the received check matrix into a plurality of received check matrices; assign corresponding ones of the received data matrices and the received check matrices to the threads; and assign the threads to the processing cores to concurrently compute the syndrome data based on respective ones of the received check matrices and the received data matrices.

The instructions implementing the at least one parallel multiplier of the thread may include one or more SIMD instructions including a GF2P8MULB instruction.

A primitive polynomial of a Galois field of a Galois field multiplication instruction of the SIMD CPU core may be different from a primitive polynomial of a Galois field of the polynomial code, and the SIMD instructions may include instructions corresponding to the at least one parallel multiplier include instructions that, when executed by the SIMD CPU core, cause the SIMD CPU core to implement a parallel lookup Galois field multiplier.

The instructions that implement the parallel lookup Galois field multiplier may include a SIMD shuffle instruction.

BRIEF DESCRIPTION OF THE DRAWINGS

The accompanying drawings, together with the specification, illustrate exemplary embodiments of the present invention, and, together with the description, serve to explain the principles of the present invention.

FIG. 3C is a flowchart depicting a method for computing the tap values according to one embodiment of the present disclosure.

FIG. 7D is a flowchart of a method for sequencing the Parallel Lookup Multiplier to perform the check data generation according to an embodiment of the present invention.

FIG. 7E through FIG. 7G show an exemplary method for sequencing the Parallel Lookup Multiplier to perform the lost data reconstruction according to an embodiment of the present invention.

DETAILED DESCRIPTION

Figure 1:
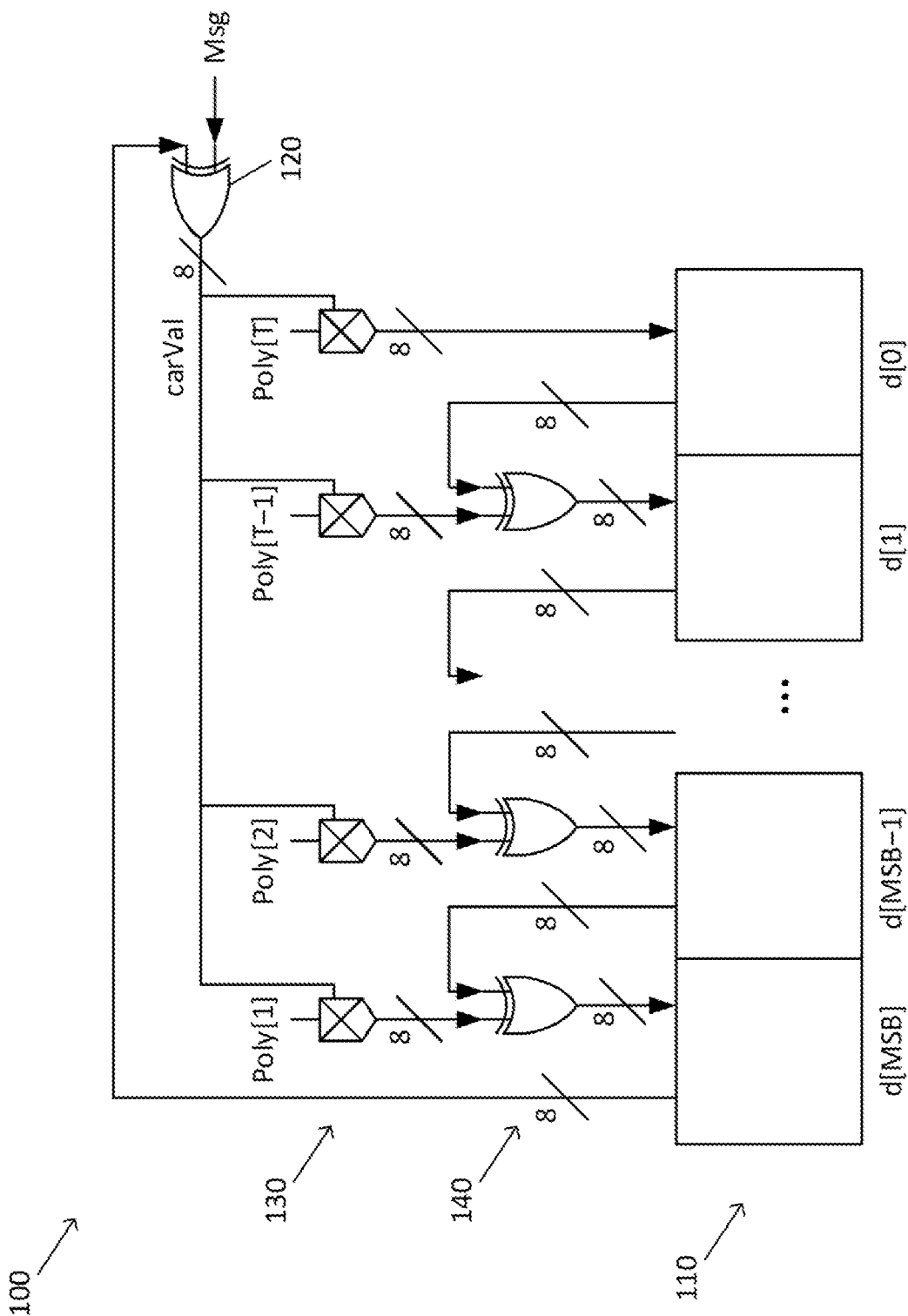
FIG. 1 is a block diagram of a linear feedback shift register configured to compute check symbols according to one embodiment of the present disclosure.

In the following detailed description, only certain exemplary embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

Algebraic block codes are injective mappings that take a sequence of symbols (e.g., a sequence of K symbols) and encode the sequence by adding additional symbols (e.g., an additional T check symbols), in a manner defined by algebraic relations. The algebraic relations allow the original sequence of symbols to be recovered from a subset of any K symbols from the encoded sequence of K+T symbols, based on the T check symbols. Therefore, this encoding provides protection for the sequence of symbols against data loss of up to T symbols of the encoded sequence (e.g., the deletion or corruption of some of the symbols, whether in transit through an unreliable communications systems or at rest in hardware storage that may be susceptible to data corruption or hardware failure).

In general, some error correcting code solutions depend upon two separate mechanisms to recover data: (1) a cyclic redundancy check (CRC), or similar operation, to determine the location of erased or erroneous data; and (2) the recovery of the data at the determined location. To employ this solution, the data must be read a first time to generate a CRC value (or other CRC-like value) to determine data correctness and then the data is read a second time in the process of recovering the lost data. This "two-pass" method can be computationally expensive, especially in cases in which there is a large amount of data to be processed (and therefore performance may be limited by various bottlenecks in communications busses of a computer system).

Some techniques, such as those described in U.S. Pat. No. 9,722,632, allow the determination of both data location and recovery value using existing error correcting codes for performing the encoding of sequences of symbols. However, some of these techniques depend upon searching for the location of data, which may not be computationally reasonable for large codewords with multiple dispersed errors.

One solution to determining both the location of data error (even if dispersed in a large codeword) and recovering that data is described by Welch and Berlekamp in U.S. Pat. No. 4,633,470, which describes an algebraic encoding can be produced that uses a generator polynomial that can be represented as a linear feedback shift register (LFSR). The algebraic encoding described by U.S. Pat. No. 4,633,470 allows for the correction of erasures and errors and has additional benefits, described therein, over alternative encoding schemes such as the common Reed-Solomon encoding scheme.

However, the technique described in U.S. Pat. No. 4,633,470 is generally believed to be too computationally intensive (computationally expensive or inefficient) to apply in the place of existing, comparative error correcting codes. For example, the recovery of lost data using the technique described in U.S. Pat. No. 4,633,470 involves testing every value of the Galois Field in a trial-and-error approach (a Chien search, see, e.g., Chien, Robert. "Cyclic Decoding Procedures for Bose-Chaudhuri-Hocquenghem Codes." *IEEE Transactions on Information Theory* 10.4 (1964): 357-363.) to find the locations of errors.

As such, aspects of embodiments of the present disclosure relate to codes for encoding and decoding sequences of symbols that make use of more powerful codes inspired by the techniques described by Berlekamp using a Linear Feedback Shift Register (LFSR). This includes implementing encoding behavior similar to that of an LFSR in the form of an encoding matrix within the architecture of modern coding systems such as Vandermonde, Cauchy, or LaGrange. In addition, codes based on an LFSR according to various embodiments of the present disclosure are more powerful than comparative error correcting codes (such as the aforementioned Vandermonde, Cauchy, or LaGrange codes), even at the same "size," because LFSR-based codes according to some aspects of embodiments are capable of both locating and correcting errors in a single pass and because they are capable of correcting both erasures and unknown errors.

In addition, in traditional error correcting code systems, in order to perform multiplications at high speed, tables may be loaded in the SIMD registers (vector registers for storing data within a vector processor core or SIMD processor core, where vector registers may be used to store vector operands of SIMD instructions and the results computed by the SIMD instructions) corresponding to the constants in the encoding or decoding table. As the codes get stronger (e.g., with more data symbols and check symbols), proportionally more constant tables have to be loaded into the SIMD registers. For example, for a traditional Reed-Solomon (255, 247) code, the encoding matrix will require 247*8=1,976 entries, corresponding to 1,976 constant tables. By comparison, using an LFSR according to some embodiments of the present disclosure involves the use of an encoding or decoding table with only 8 entries that can be loaded into SIMD registers once and used repeatedly to perform the encoding or decoding process. As the size of the codewords scale, the performance benefits of using a LFSR multiplies.

General background regarding Reed-Solomon codes can be found, for example, in: U.S. Pat. No. 8,683,296 (Anderson); A Decoding Procedure for the Reed-Solomon Codes, Raymond S. Lim, NASA Technical Paper 1286 (1978); and Clarke, C. K. P. "Reed-Solomon Error Correction," BBC R&D White Paper WHP031 (2002), the entire disclosures of which are incorporated herein by reference.

Aspects of various embodiments of the present disclosure may be implemented by a computing system including one or more processing circuits and memory. The memory may store data symbols and check data computed in accordance with embodiments of the present disclosure, in addition to parameters associated with the encoding process and instructions to control the one or more processing circuits to perform the encoding of data (e.g., generating check data to generate a codeword) or decoding of data (e.g., decoding original data from a codeword that includes one or more errors or erasures). In some embodiments, the processing circuit is a vector processor, e.g., a processing core configured to perform single-instruction-multiple-data (SIMD) operations on vectors of data in parallel. Some examples of processing circuits include: a processing core of an x86 architecture processor or an ARM architecture processor supporting SIMD instructions or having an instruction set architecture (ISA) that provides access to SIMD hardware within the processing circuit (e.g., on processors supporting x86 instruction sets, SSE, SSE2, SSE3, SSSE3, SSE4.1, SSE4.2, AVX, AVX2, and AVX-512 and, on processors supporting ARM instruction sets, Neon and Scalable Vector Extension (SVE)). In some cases, multiple processing cores are packaged together into a multi-core central processing unit (CPU) that may share high speed memory (e.g., cache memory). In addition, a single computing system (e.g., sharing a single motherboard or mainboard) may include multiple CPUs connected to a same internal peripheral bus (e.g., Peripheral Component Interconnect Express or PCIe). The term "processor" will be used herein interchangeably with processing circuit as described above.

A Reed-Solomon code is typically parameterized by (N, K), where K is the number of symbols in the input sequence of symbols (or input message) and where N is the number of symbols in the resulting codeword, which includes the K symbols of the original message followed by N−K check symbols. For the sake of convenience, the value N−K will be referred to herein using the variable T (where K+T=N), that is, the codeword of length N includes a K data symbols followed by T check symbols. Each symbol may be 1 or more bits long. For the sake of convenience, examples of the present disclosure will be presented herein where each symbol is 8 bits long (each symbol is one byte), but embodiments of the present disclosure are not limited thereto.

An (N, K) Reed-Solomon code is typically constructed using a code generator polynomial of T factors, the roots of which are consecutive elements of the Galois field (GF) over which the code is defined. Here, continuing the above assumption that each symbol is 8 bits long, operations described herein will be performed in the field $GF(2^8)=GF(256)$, where the elements of the field GF(256) range from 0 to 255. As one example, consider the code generator polynomial $x^4+15x^3+54x^2+120x+64$. The coefficients or constants of this code generator polynomial were obtained by multiplying out $(x+1)(x+2)(x+4)(x+8)$.

The term "erasure code" is contrasted herein with the term "polynomial code." Both Erasure Codes and Polynomial Codes (or more specifically, erasure coding or polynomial coding systems) are generally regarded as impractical for values of M larger than 1 (e.g., RAID-5 systems, such as parity drive systems) or 2 (RAID-6 systems), that is, for more than one or two check drives. For example, see H. Peter Anvin, "The Mathematics of RAID-6," the entire content of which is incorporated herein by reference, p. 7, "Thus, in 2-disk-degraded mode, performance will be very slow. However, it is expected that that will be a rare occurrence, and that performance will not matter significantly in that case." See also Maddock, Robert, et al. "Surviving Two Disk Failures Introducing Various "RAID 6" Implementations." at page 6: "The main difficulty with this technique is that calculating the check codes, and reconstructing data after failures, is quite complex. It involves polynomials and thus multiplication, and requires special hardware, or at least a signal processor, to do it at sufficient speed." In addition, see also Plank, James S. "All About Erasure Codes—Reed-Solomon Coding—LDPC Coding." *ICL*, August 20 (2004): 2004. at slide 15 (describing computational complexity of Reed-Solomon decoding): "Bottom line: When n & m grow, it is brutally expensive." Accordingly, there appears to be a general consensus among experts in the field that erasure coding and polynomial coding systems are impractical for RAID systems for all but small values of M (that is, small numbers of check drives), such as 1 or 2.

Modern disk drives, on the other hand, are much less reliable than those envisioned when RAID was proposed. This is due to their capacity growing out of proportion to their reliability. Accordingly, systems with only a single check disk have, for the most part, been discontinued in favor of systems with two check disks.

In terms of reliability, a higher check disk count is more desirable than a lower check disk count. If the count of error events on different drives is larger than the check disk count, data may be lost and that cannot be reconstructed from the correctly functioning drives. Error events extend well beyond the traditional measure of advertised mean time between failures (MTBF). A simple, real world example is a service event on a RAID system where the operator mistakenly replaces the wrong drive or, worse yet, replaces a good drive with a broken drive. In the absence of any generally accepted methodology to train, certify, and measure the effectiveness of service technicians, these types of events occur at an unknown rate, but certainly occur. A solution for protecting data in the face of multiple error events is to increase the check disk count.

As the count of check disks increases, so does the processing requirement to encode and decode data. Therefore, there is a continuing need to accelerate this processing. The previously-noted Plank, Anvin, and Anderson taught that Erasure Codes for storage systems are optimally composed of an encoding system that produces "parity" as one term of check data, that is, the exclusive-or (XOR) sum of the original data. The historical wisdom was that this would accelerate the overall solution because computing parity is faster than computing sums of products (because multiplication is more computationally expensive than addition).

However, this approach of including a "parity row" weakens the ability of the code to correct errors and limits the ability of the code to efficiently expand to larger configurations. Some of these weaknesses are documented in the public (open source) support ticket ("issues") history of Intel's Intelligent Storage Acceleration Library (ISA-L), which produced an encoding matrix that failed when slightly expanded by an unsuspecting customer or user of the library. In particular, when data is encoded using a Vandermonde matrix and one or more check symbols have failed, then the resulting Vandermonde matrix may be non-invertible, such as when certain check symbols (or check drives) are lost in RAID configurations larger than 10 data symbols and 4 check symbols (e.g., with at least 10 data drives and at least 4 check drives). As a result, a Vandermonde matrix cannot always be used to recover original data that was originally encoded using a Vandermonde matrix, and this inability to recover original data may result in permanent loss of that original data. This permanent loss of original data defeats the purpose of applying an error correcting code to the original data.

As the term is used herein, in a "polynomial code," summing the values of the data symbol and the check symbols of a codeword over the corresponding Galois field (in the case of no errors or erasures in the codeword) results in a GF sum of zero.

Some approaches to error correcting codes (such as those described in Anvin, H. Peter. "The Mathematics of RAID-6." (2007).) relate to computing additional check symbols, in addition to parity symbols (in Anvin, the parity symbols are referred to as P, and the additional check symbols are referred to as Q). In particular, the parity symbols are computed based on GF additions (without GF multiplication) whereas computing the other check symbols may require performing GF multiplications in addition to GF additions.

When the computation of the codeword or check symbols from in input sequence of data values is expressed as an encoding matrix, the computation of the parity symbols may appear as a "parity row" within the encoding matrix. Such codes that include a parity row in the encoding matrix representation of the code may be referred to herein as "erasure codes."

In contrast, the term "polynomial code" is used herein to refer to codes in which, in a codeword without errors or erasures, the Galois field sum of the check symbols equals the Galois field sum of the data symbols. That is, the overall GF sum of the data and all the parity symbols combined is zero. A polynomial code only has a parity row in the (degenerate) case of a code with exactly one parity symbol (e.g., RAID 3, RAID 4, or RAID 5 configurations). However, when a polynomial code has more than one parity symbol (or check symbol), its encoding matrix representation does not have a parity row (e.g., a row of all 1s).

When data is encoded using a polynomial code in accordance with embodiments of the present disclosure, it will always be decodable using a Vandermonde matrix across the whole codeword, so long as no more than T symbols are lost, whether the lost symbols are original data symbols, check symbols, or a combination thereof. In addition, the use of a Vandermonde matrix in decoding allows easy discovery of the locations of the errors or erasures, even if the errors or erasures occur in the check symbols.

In addition, more x86 recent instruction sets for vector processors include a Galois Field vector multiply instruction (GF2P8MULB) that executes in a single processor clock cycle. As such, the use of Galois Field vector multiply instructions reduces the computational overhead associated with computing sums of products, and therefore reduces the speed benefits from computing check data versus a sum of products to the point where performance benefits from using parity are minimal or negligible.

Accordingly, aspects of embodiments of the present disclosure relate to the use of polynomial codes for encoding and decoding data. Some aspects of embodiments relate to the use of a parallel linear feedback shift register (LFSR) sequencer to encode the data. Some aspects of embodiments relate to a parallel syndrome decoder to decode the data. In various embodiments, a parallel multiplier, adder, thread, and i/o controllers are used to accelerate encoding (e.g., using the LFSR sequencer) or to accelerate decoding (e.g., using a parallel syndrome decoder). Furthermore, in some embodiments, specialized vector instructions, such as vector instructions of the Intel® AVX-512 SIMD instruction set are used to further accelerate the encoding and/or decoding of data.

Figure 2:
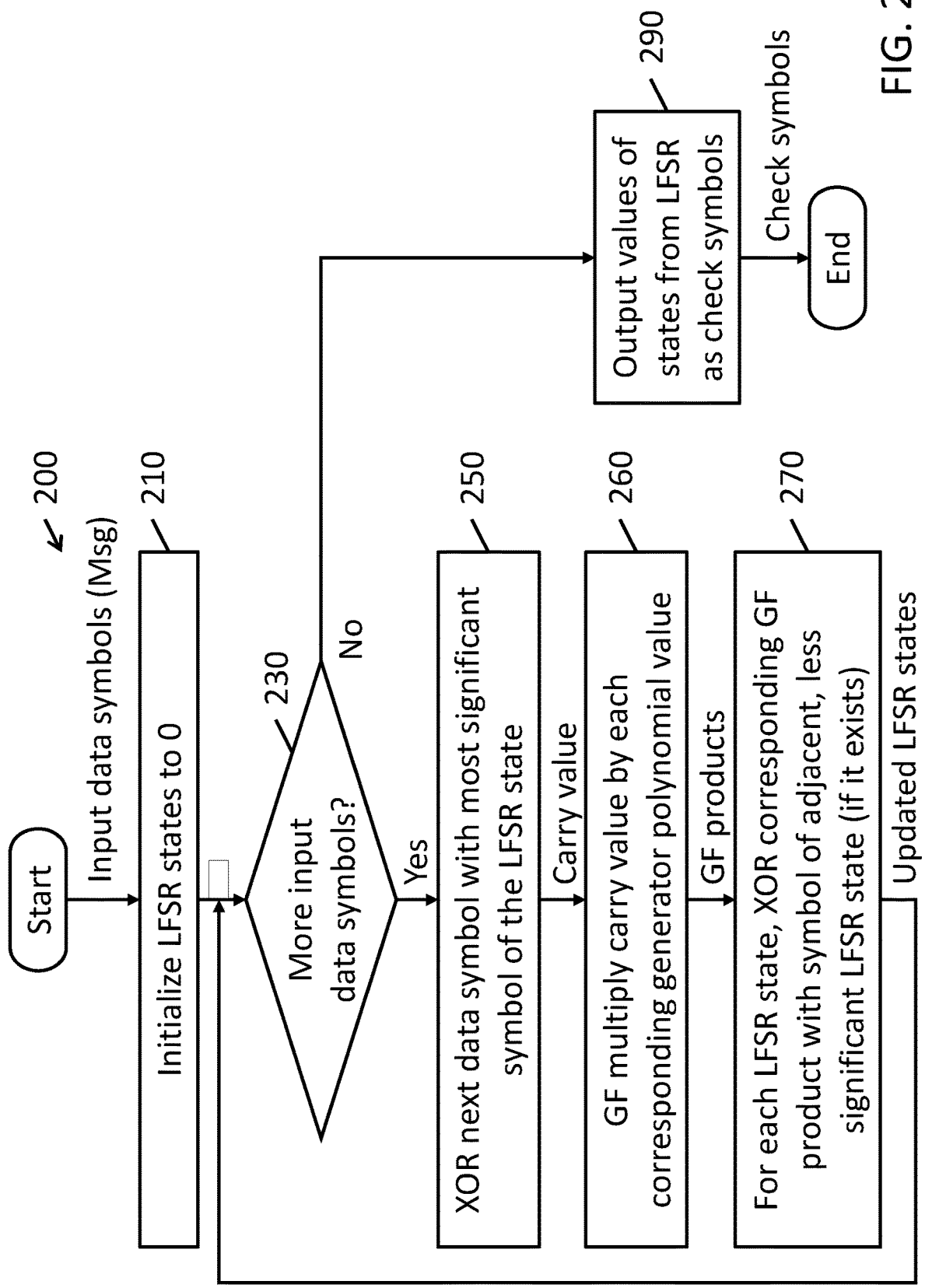
FIG. 2 is a flowchart depicting a method for computing check symbols from an input sequence of data symbols according to one embodiment of the present disclosure.

FIG. 1 is a block diagram of a linear feedback shift register (LFSR) configured to compute check symbols according to one embodiment of the present disclosure. FIG. 2 is a flowchart depicting a method 200 for computing check symbols from an input sequence of data symbols according to one embodiment of the present disclosure.

A LFSR 100 as shown in FIG. 1 may be implemented, for example, by a processor and memory, such as where the memory stores instructions that, when executed by the processor, cause the processor to perform operations associated with the method 200 of FIG. 2. At various times during performing the method, various data values and instructions may be stored internally within the processor, such as within registers (e.g., vector registers) and/or caches of the processor.

As shown in FIG. 1, the LFSR 100 is configured to generate T check values from an input message (Msg) that is supplied to the LFSR 100 one symbol at a time. After the entire input message (e.g., up to K symbols) has been supplied to the LFSR, the final output of the LFSR corresponds to the final values stored in the states 110 of the LFSR. The states of the LFSR are labeled d[MSB], d[MSB−1], . . . , d[1], d[0], where MSB is set to T−1 and refers to the highest numbered position in the LFSR. As seen in FIG. 1, the value of each state 110 is computed based on the previous state (e.g., the next lower numbered state), and the highest numbered state is referred to as the most significant byte (MSB) or most significant symbol among the states of the LFSR.

In operation 210, the processor initializes the states of the LFSR to 0. For example, the states of the LFSR may be represented as an array bytes of length T and the initial values of the array may all be set to 0 (e.g., by storing 0 values directly or by setting the value at each location in the LFSR state array to the XOR of the current value with itself). In operation 230, the processor determines if there are more input data symbols from data symbols to process. If so, then, in operation 250, the processor XORs the next data symbol from the input message symbols with the value of the most significant symbol of the LFSR state to compute a carry value (carVal) (see XOR gate 120 of FIG. 1).

In operation 260, the processor multiplies the carry value (carVal) by the coefficient of the generator polynomial (identified as Poly in FIG. 1) corresponding to each position of the LFSR using a Galois field (GF) multiplier 130 to generate T GF products. In particular, the GF multiplier is configured to multiply values in accordance with the Galois field of the coding system (e.g. GF(256)).

In operation 270, the processor updates each state 110 of the LFSR based on the XOR (140) of the computed GF product and the previous state. For example, as shown in FIG. 1, the state d[1] is computed based on the XOR of the state of d[0] and the GF product of the carry value (carVal) and the corresponding coefficient of the generator polynomial (Poly[T−1]).

The processor continues updating the states 110 of the LFSR 100 in this manner until all data symbols of the input message have been consumed. At that point, there are no more input symbols and the processor proceeds to operation 290 to output the values of the LFSR as the check symbols computed from the input data symbols.

As one example of the operation of an LFSR similar to that shown in FIG. 1, consider a four stage LFSR (e.g., having four stages 110) that is based on the generator polynomial $x^4+15x^3+54x^2+120x+64$ noted earlier, where the coefficients or constants of the generator polynomial were obtained by multiplying out $(x+1)(x+2)(x+4)(x+8)$. Using these constants as the taps in a LFSR results in the same "strong" coding described in U.S. Pat. No. 4,633,470. The coefficient of the leading term (here, $x^4$) is always 1 because the coefficients of the generator polynomial for a T-stage LFSR are obtained by multiplying out an expression of the form $\Pi_{i=0}^{T-1} x+p^i$, where p is a prime number (in the example shown above, p=2), such that the highest order term will be the product of the T x terms that each has a coefficient of 1, that is $x^T$. Here, the leading 1 may be thought of as a carry indicator and is not directly used in the computation of each of the output LFSR states.

Figure 3A:
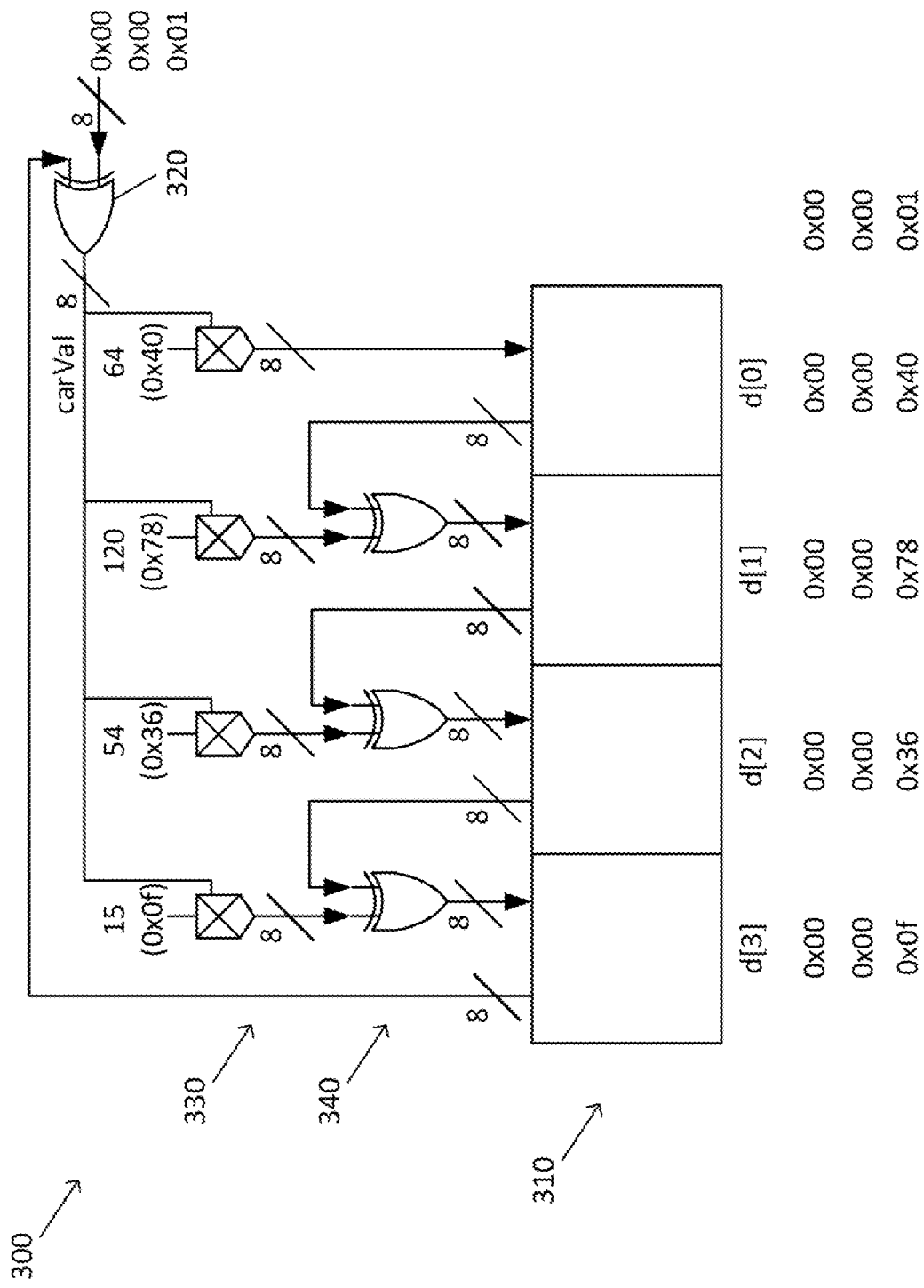
FIGS. 3A and 3B are block diagrams depicting a four stage LFSR configured based on the generator polynomial $x^4+15x^3+54x^2+120x+64$ and the values stored in the four stages of the LFSR after each byte is input to the LFSR according to one embodiment of the present disclosure.
Figure 3B:
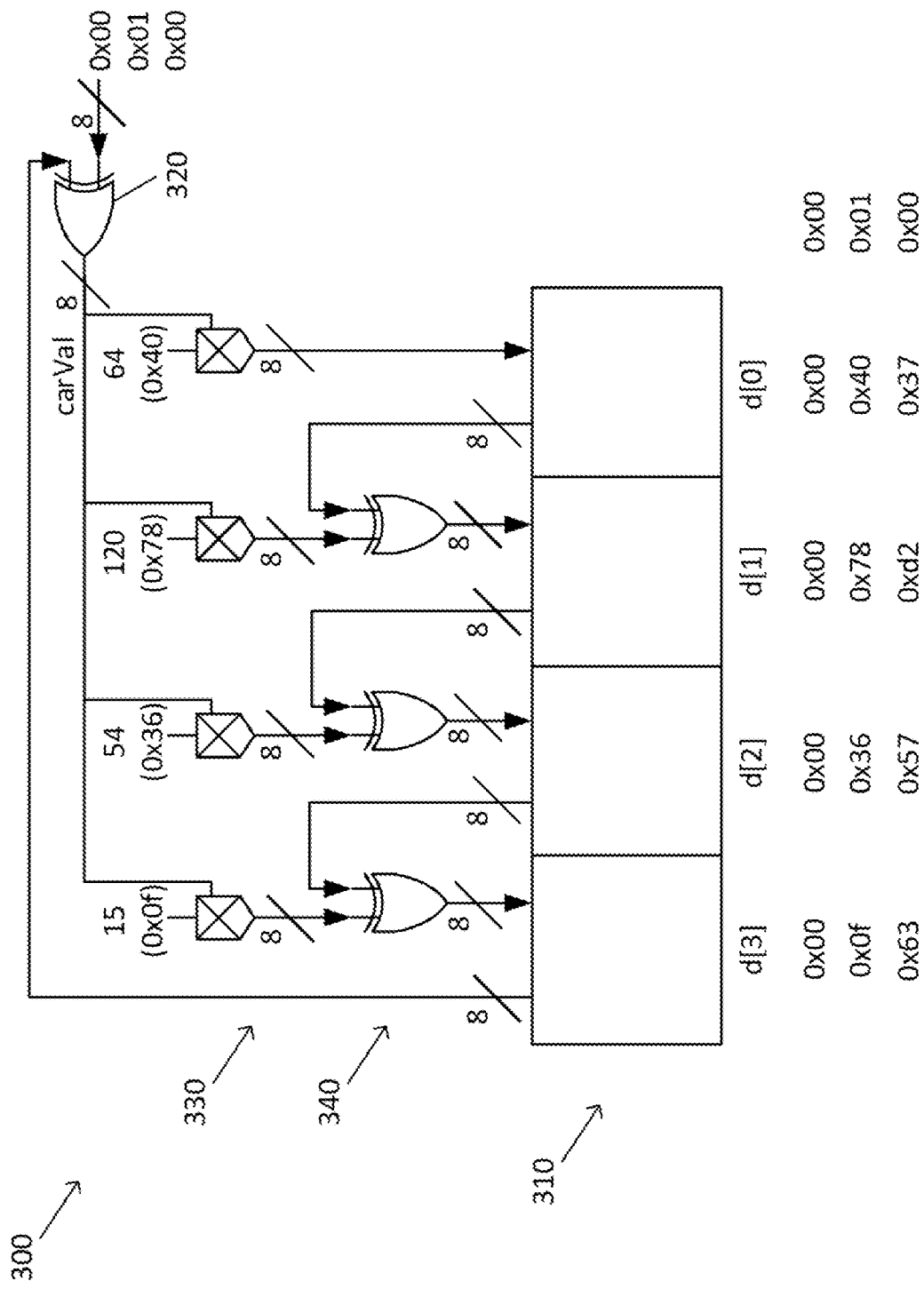

FIGS. 3A and 3B are block diagrams depicting a four stage LFSR configured based on the generator polynomial $x^4+15x^3+54x^2+120x+64$ and the values stored in the four stages of the LFSR after each byte is input to the LFSR according to one embodiment of the present disclosure.

To understand how an LFSR configured with these constants of the generator polynomial relates to a traditional encoding matrix, consider the case where the message (or sequence of data symbols Msg) to be encoded is a string of zero bytes, with a trailing '1' byte (e.g., a sequence of three symbols, one byte per symbol, in hexadecimal: 0x 00 00 01), as shown in FIG. 3A.

The lower portion of FIG. 3A depicts a table showing the current input symbol in the far right column and values stored in the states 310 of the LFSR 300 after that input symbol is fed into the LFSR 300.

As shown in the first two rows of the table of FIG. 3A, when supplying this message as input to the LFSR 300, as long as zeroes are shifted into the LFSR 300, all values of the states 310 remain at zero. However, when the final "1" (or 0x01 as shown in FIG. 3A) is read into the LFSR 300 (as shown in the third line of the table), the taps (or constants of the generator polynomial) supplied to the multipliers 330 on the LFSR (0f 36 78 40) appear on the output (e.g., at the states 310). This will produce the output check values 15, 54, 120 and 64 (or 0x0f 36 78 40 in hexadecimal, as shown in FIG. 3A).

The mathematical result of this is that, given original data 0x00 00 01 and its corresponding check values 0x0f 36 78 40 concatenated into a codeword 0x00 00 01 0f 36 78 40, if a received codeword has the third symbol lost: 0x00 00 ?? 0f 36 78 40 (where the lost symbol is indicated by ??), and we know that all the values other than the last symbol are zero (e.g., 0x00 00 ??), then it is possible to recover the lost data by diving a check symbol by the corresponding constant of the generator polynomial supplied at its LFSR tap. In this example, given check bytes 0x0f 36 78 40, the missing data symbol at the last position can be recovered by dividing the first check byte 0f by the constant 0f, dividing the second check byte 0x36 by 0x36, dividing the third check byte 0x78 by 0x78, or dividing the fourth check byte 0x40 by 0x40. This particular example appears trivial because the erased value is 0x01. However, the linearity of the Galois Field operations performed by the LFSR ensures that the process works for any value of the last byte of the message (e.g., any value from 0x01 to 0xff), where different values of the last byte of the message would generate different check symbols that would be included in the codeword, and where the check symbols particular to the codeword would be divided by the check values that were computed when the input message was 0x00 00 01.

Any of these techniques will recover data correctly in the event that all the message bytes are zero except the last and the lost or erased data in is the last position.

As another example, consider the case where the message (or sequence of data symbols Msg) to be encoded is a string of zero bytes, followed by a '1' byte, and finally a zero byte (e.g., a sequence of three symbols, one byte per symbol, in hexadecimal: 0x 00 01 00), as shown in FIG. 3B (e.g., where the data bytes are all zeroes, except for the second-to-last data byte).

In this case, in a manner similar to that shown in FIG. 3A, as long as the input symbol (or byte) has a value of 0 (0x00), then the states 310 remain at a value of 0 (0x00). As before, when the symbol with value 1 (0x01) is read into the LFSR 300, the states are updated to 0x0f 36 78 40 in hexadecimal, as shown in the second row of the table in FIG. 3B.

However, in contrast to FIG. 3A, there is still an additional symbol to be read from the input (the final 0x00). As a result, the value of 0x0f in d[3] (the most significant symbol) is supplied as feedback to the input, where it is XORed with the final input value (0x00) to produce the carry value (carVal). In this example, because the current input is zero, carVal has the same value as the feedback value from d[MSB], 0x0f). The carry value (carVal) is then GF multiplied by the constants of the generator polynomial corresponding to the different states to generate GF products, which are then XORed with the previous states. This results in a final state of check values 0x63 57 d2 e7, as shown in the third row of the table in FIG. 3B that would be generated based on providing an input message that was all zeroes except for a 1 as the second-to-last symbol (e.g., 0x00 01 00).

Continuing this example, assuming original data symbols 0x00 01 00 and its corresponding check symbols 0x63 57 d2 e7 were concatenated to form a codeword 0x00 01 00 63 57 d2 e7, and assuming that a received codeword had the second-to-last message symbol lost: 0x00 ?? 00 63 57 d2 e7, then the erased data can be recovered in this case by dividing by the first check byte by 0x63, dividing the second check byte by 0x57, dividing the third party byte by d2, or dividing the fourth check byte by e7. (As noted above, the linearity of the Galois Field operations performed by the LFSR ensures that the process works for any value of the last byte of the message, such as any value from 0x01 to 0xff, where different values of the last byte of the message would generate different check symbols that would be included in the codeword but that would be divided by the check values computed when the input message was 0x00 01 00.)

Therefore, by entering a (0x01) into the LFSR, followed by K−1 zeroes (0x00) and saving the output of the LFSR at each step, a full table of K×T values can be constructed, where the i-th row corresponds to the T check values computed when the value 0x01 is in the i-th position in a sequence of data symbols (Msg).

In addition, due to the linearity of the Galois Field operations performed, the check value of message data 0x00 01 00 (0x63 57 d2 e7) and check value of message data 0x00 00 01 (0x0f 36 78 40) can be added (GF added or XOR'd) to produce the check value of message data 0x00 01 01 (0x6c 61 aa a7).

As such, the table generated using an LFSR as described above may be used to compute check values of any input message (or sequence of data symbols) based on a linear combination of the rows of the table (e.g., for each data symbol in the input message, GF multiplying the value of the data symbol by the check values in a row corresponding to the position of the data symbol in the input message to compute check symbols for each position and XORing together the resulting check symbols or GF products).

In other words, the generated table corresponds to a traditional encoding matrix. In particular, in some embodiments, the processor is configured to compute a sequence of T check symbols can for an input sequence of K data symbols by performing a matrix multiplication (a dot product) between the K data symbols and the K×T table of values. This resulting sequence of T check symbols is equivalent or the same as the result that would have been computed as the output of the LFSR by reading the K data symbols into the LFSR one at a time, but benefits from being parallelizable and/or vectorizable and therefore the matrix multiplications performed when computing the check symbols is accelerated when is performed by a vector processor.

For example, given an input message of the sequence (0,0,0,1) that is to be encoded using the RS(8,4) code with generating polynomial g:

$$g(x) = (x+1)(x+2)(x+4)(x+8)$$
$$= x^4 + 15x^3 + 54x^2 + 120x + 64$$

The polynomial that has the message m coordinates as coefficients is:

$$m(x) = 0x^3 + 0x^2 + 0x + 1 = 1$$

The check symbols c are computed by multiplying the message m by the generating polynomial g:

$$c(x) = m(d) \cdot g(x)$$
$$= 1 \cdot x^4 + 15x^3 + 54x^2 + 120x + 64$$
$$= x^4 + 15x^3 + 54x^2 + 120x + 64$$

Combining the message m and the coefficients of c (apart from the highest order coefficient of 1 on $x^4$) results in the codeword (0, 0, 0, 1, 15, 54, 120, 64).

While FIG. 3A and FIG. 3B show one example of a four stage LFSR for simplicity of explanation, embodiments of the present disclosure are not limited thereto, and include the use of LFSRs with fewer than four stages or more than four stages. More generally, a T-stage LFSR configured in accordance with FIG. 1, for example, is used in accordance with embodiments of the present disclosure to compute T check symbols, where the T-stage LFSR is configured with the T constant values Poly supplied as constant inputs to the taps of the LFSR (e.g., as the constant inputs to the GF multipliers 130).

As noted above, the LFSR is configured with constants supplied as taps (e.g., as the constant input to the GF multipliers 130). The values of these taps are set based on the coefficients of a generator polynomial, and where the generator polynomial is computed by multiplying an initial polynomial (e.g., 1) by $\Pi_{N=0}^{T-1} x + \alpha^N$, (where T is the number of check symbols or the length of the LFSR and where α is a prime number such as 2).

FIG. 3C is a flowchart depicting a method 370 for computing the tap values according to one embodiment of the present disclosure based on an input number of check symbols (T). As shown in FIG. 3C, at operation 371, a processor initializes a generator polynomial to the value of 1 plus the first power (FP). In some embodiments, the first power is set to 0, such that the polynomial is initialized to the value of 1. Alternatively, in some embodiments, the first power is set to a non-zero value, such as α. An index variable k is also set to the value of 1. At operation 373, the processor determines whether k≤T. If so, then at operation 375, the processor multiplies the current polynomial by x+$\alpha^k$ to compute an updated current polynomial (e.g., as described, but not limited to, a technique described below with respect to FIG. 3D), and then, at operation 377 the processor increments k (e.g., computes a new value of k by adding 1 to the current value of k) and then continues with checking to see if k≤T at operation 373. Once the value of k is greater than T, the processor outputs, at operation 379, the current polynomial as the generator polynomial for the LFSR with T check symbols (as specified by the input to method 370). The processor may then configure the T taps of the LFSR with the coefficients of the generator polynomial (omitting the coefficient of 1 associated with the highest order term $x^T$ of the polynomial, as noted above).

Figure 3D:
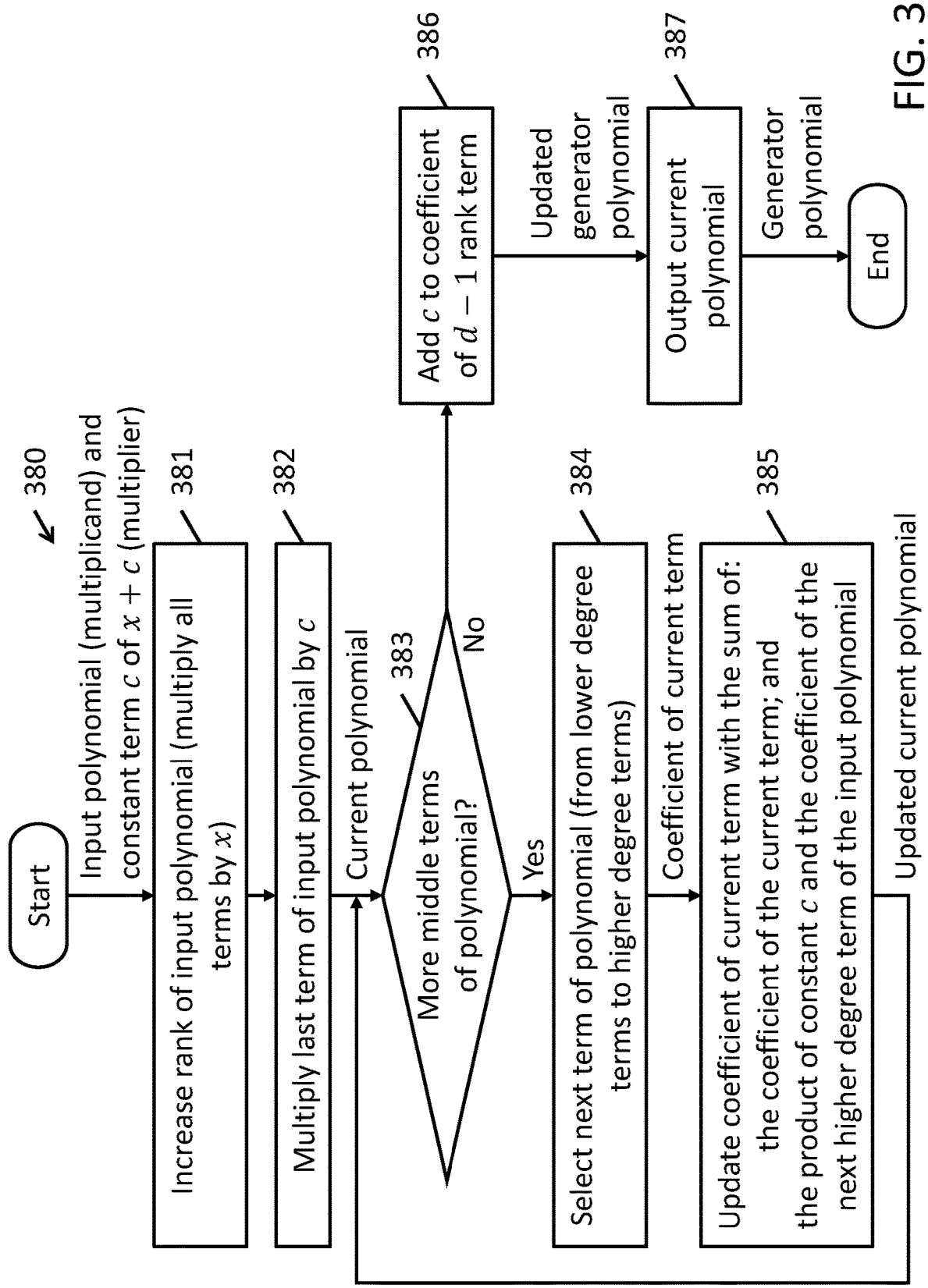
FIG. 3D is a flowchart of a method for multiplying polynomials according to one embodiment of the present disclosure.

FIG. 3D is a flowchart of a method 380 for multiplying polynomials according to one embodiment of the present disclosure. In particular, FIG. 3D illustrates a method for multiplying a polynomial by the polynomial x+c, where c is an input argument to the method 380 (e.g., the coefficient of the first rank or first order term x is assumed to be 1 in this method). In various embodiments of the present disclosure, a polynomial, such as the input polynomial to the method 380 may be represented as an array of bytes, where the first byte is an integer representing the rank (or order) d of the polynomial (the highest exponent on any indeterminant x in the polynomial) and the remaining d+1 bytes of the array represent the coefficients of the terms of the polynomial (e.g., from the rank d term $x^d$ down to the rank 0 term $x^0$). As discussed above, the coefficient of the highest rank term is always 1, and therefore, in some embodiments, is omitted from the representation as being implicitly present.

The method shown in FIG. 3D multiplies an input polynomial by x+c by first, at operation 381, multiplying all of the terms in the input polynomial by x. In the particular example representation, this can be achieved by merely incrementing the value of the first byte of the array representing the polynomial, such that each of the coefficients in the polynomial now represent a higher rank term. For example, $x^2+3x+2$ multiplied by x is $x^3+3x^2+2x$, where the coefficients are the same.

The remaining operations relate to multiplying the input coefficient by the input constant c and summing the resulting coefficients on a per-term basis.

At operation 382, the processor GF multiplies the last term of the input polynomial by the input constant term c to compute the coefficient of the last term of the output polynomial. For example, continuing the above example with the input polynomial $x^2+3x+2$, this is multiplying the coefficient 2 by c, such that the last term is 2c, such that the current polynomial is $x^3+3x^2+2x+2c$.

At operation 383, the processor iterates over the middle terms of the polynomial and enters the loop if there are any additional middle terms to be processed, where middle terms refer to all terms of the polynomial other than the two highest rank terms (rank d and rank d−1) and the 0th rank term of the polynomial. Continuing the above example of $x^3+3x^2+2x+2c$, the only middle term of this polynomial is 2x (the rank d term is $x^3$ and the rank d−1 term is $3x^2$). At operation 384, the processor selects the next middle term of the polynomial, as ordered from lower rank terms to higher rank terms, and extracts the coefficient of the selected current term (e.g., the processor first selects the lower rank term 2x and then, at the next iteration selects the next higher rank term $3x^2$).

At operation 385, the processor updates the coefficient of the current term by computing the GF sum of the current coefficient and the product of the input constant c and the coefficient of the next higher rank term of the input polynomial. Continuing the above example of a current polynomial $x^3+3x^2+2x+2c$ and first selecting term 2x, the coefficient of the current term is 2 and the coefficient of the next higher term is 3. Because this coefficient was unchanged due to the multiplication by x at operation 381, this logically represents the term 3x from the input polynomial $x^2+3x+2$ by c, where multiplying this term by c results in 3cx. This is the term of the same rank that is to be added to the selected term 2x, and therefore the coefficients of these terms are GF added together in the final output for the rank 1 term: 3cx+2x=(3c+2)x. After updating the coefficient of the current term, the process continues with the next iteration of the loop by determining, and 383 if there are more middle terms and processing any additional middle terms in operations 383, 384, and 385. In the above example, there are no additional middle terms because $3x^2$, as the rank d−1 term is not a middle term.

At operation 386, the processor computes the coefficient of the rank d−1 term by GF adding c to the coefficient of this term. In the particular example described above, this relates to computing the product of the highest rank term $x^2$ of the input polynomial $x^2+3x+2$ by c to arrive at $cx^2$, then adding $cx^2$ to the rank d−1 term $3x^2$ to compute an updated rank d−1 term $(3+c)x^2$ of having coefficient 3+c.

At operation 387, the system outputs this updated generator polynomial. Completing the above example, that would be $x^3+(3+c)x^2+(3c+2)x+2c$.

Accordingly, this process of progressively multiplying the generator polynomial by polynomials of the form x+c, where the input constants c are different roots of the generator polynomial, as described above with respect to FIG. 3C, is repeated to compute the coefficients of the taps of an LFSR.

Appendix 1 shows the tap values for the generator 0x11d for values of T from 2 to 32, where N=255, K=223, T=32, primitive polynomial (PP)=29, primitive element (PE)=2, and first power (FP)=0. Appendix 2 shows the tap values for the generator 0x11 b for values of T from 2 to 32, where N=255, K=223, T=32, primitive polynomial (PP)=27, primitive element (PE)=3, and FP=0. Noting that, for the irreducible polynomial 0x11b, the primitive element is 3, whereas the primitive element for the generator 0x11d is 2. This is because 2 is not a generator of the field in 0x11b, but 3 is a generator in 0x11b. While Appendix 1 and Appendix 2 present examples of tap values for various generator for values of T from 2 to 32, embodiments of the present disclosure are not limited thereto and may also be applied, for example, to values of T greater than 32 as well as variations such as different choices of generators or different choices of first powers.

Accordingly, in different embodiments of the present disclosure, an encoding or decoding process is performed by supplying input symbols to an LFSR (e.g., input data symbols in the case of encoding) or by performing a dot product between the input symbols and an equivalent encoding matrix. Some aspects of embodiments of the present disclosure relate to selecting between using an LFSR computation or dot product computation based on the computational approach that is more efficient for the circumstances such as the size of the code, the architecture of the processor used to perform the computation (e.g., size and number of vector registers and available instructions for accelerating GF operations), and the like.

Figure 3E:
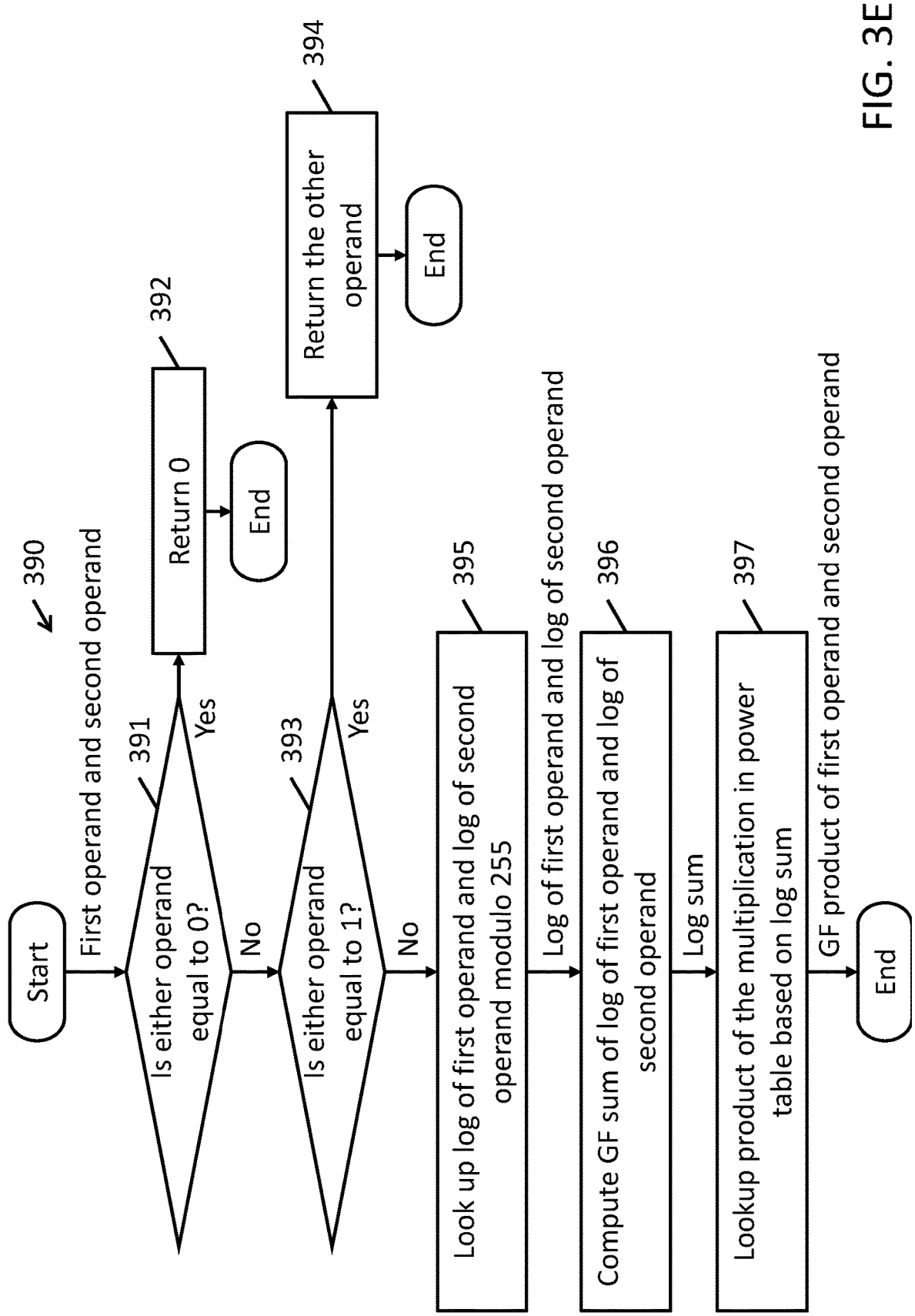
FIG. 3E is a flowchart of a method for GF multiplying values according to one embodiment of the present disclosure.

FIG. 3E is a flowchart of a method 390 for GF multiplying values according to one embodiment of the present disclosure. In some embodiments of the present disclosure, GF multiplication is performed using a lookup table. In more detail, FIG. 3E illustrates a method for GF multiplying two input operands (a first operand and a second operand) by examining log (logarithm) tables. At operation 391, the method 390 handles the trivial case where either the first operand or the second operand is 0 (zero) in which case the method returns the value of 0 at operation 392. If neither operand is 0, then at operation 393, the processor handles the trivial case where either operand (or both operands) is equal to 1. If so, then the processor returns the other operand at operation 394 (in the case where both operands are equal to 1, then the result is also 1).

At operation 395, the processor looks up the log of the first operand and the log of the second operand, both modulo 255 (in the specific case described herein of 8-bit operands and operations in the field GF(256)), where the log tables mapping values of the operand to log values modulo 255 may be pre-calculated, as described in more detail below. In operation 396, the processor computes the GF sum of the log of the first operand and the log of the second operand to compute a log sum, and in operation 397, the processor looks up the product of the multiplication of the first operand and the second operand in a power table based on the log sum that was computed in operation 396.

The power table is a table where each entry, indexed by i, maps to a generator value raised to the power of i modulo 255 (e.g., assuming the field GF(256)). In some embodiments, two (2) is used as the generator value when the primitive polynomial 0x11d and three (3) is used as the generator value when the primitive polynomial 0x11b, where the primitive polynomials are discussed in more detail below. The 0-th entry of the table is always 1 because any positive integer raised to the power of 0 is always 1. To compute the k-th entry of the power table (up until some predetermined maximum power), the processor GF multiplies the k−1-st entry of the power table by the generator value. Accordingly, generating the power table requires only a number of operations on the order of the number of entries in the power table.

The log table is a table that values to their logarithms using the generator value as the base. In some embodiments, the log table is computed by inverting the power table by iterating over the entries in the power table. For example, given a counter value k, the processor looks up the value v in the power table at entry k, then sets the v-th entry in the log table to the counter value k, and performs this for all counter values (e.g., 0 to the number of entries in the power table minus 1).

The particular examples shown in FIG. 1, FIG. 3A, and FIG. 3B depict supplying a single block of data into an LFSR to compute a corresponding set of check symbols. (In some embodiments, a block of data may include, for example, 64 symbols. However, embodiments of the present disclosure are not limited thereto.) However, different blocks of data are independently coded (e.g., the coding of a given block does not depend on the coded values of any previous blocks). Accordingly, a vector processor can compute check symbols for multiple blocks of data in parallel using SIMD instructions.

Figure 3F:
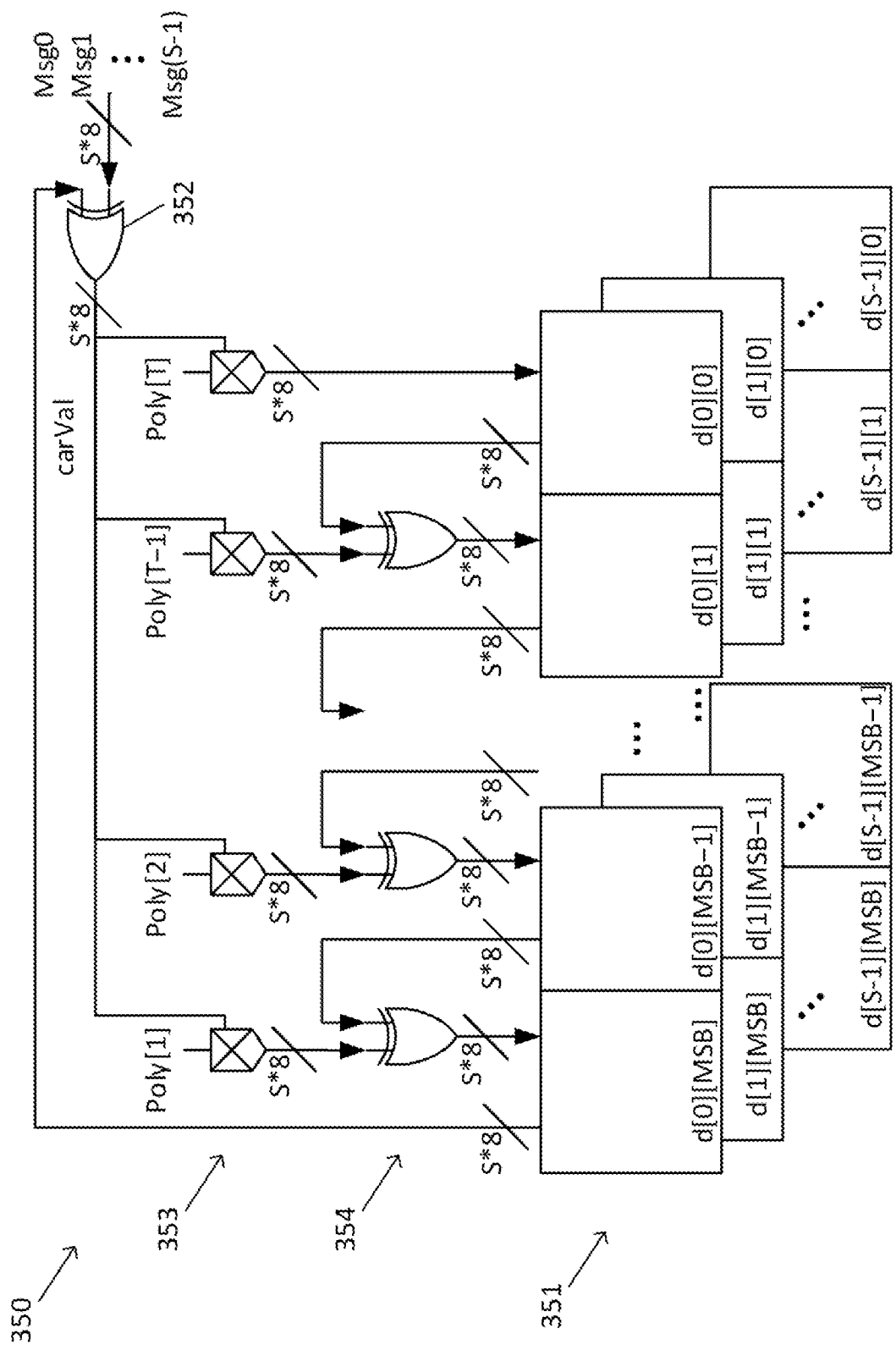
FIG. 3F is a block diagram of a parallel linear feedback shift register configured to compute check symbols of multiple messages in parallel according to one embodiment of the present disclosure.

FIG. 3F is a block diagram of a parallel linear feedback shift register configured to compute check symbols of multiple messages in parallel according to one embodiment of the present disclosure. In the example shown in FIG. 3F, a parallel LFSR 350 can take up to S different inputs in parallel, where the S different inputs are labeled in FIG. 3F as Msg0, Msg1, . . . , MsgS. Each input may include a different sequence of symbols for which the parallel LFSR will compute a corresponding set of S different states 351, where the S different states are shown in FIG. 3F as being indexed from 0 to S−1, and the values of the stages within each individual state may be indexed, as in the LFSR shown above with respect to FIG. 1, from 0 to MSB−1. The various computational components shown in the parallel LFSR 350 of FIG. 3F, including the XOR gate 352, the GF multipliers 353, and the GF adders or XOR gates 354 are implemented using vector operations or SIMD operations of the processor, where the same instruction is applied to multiple different data—in this case, the same operations such as XOR operations and GF multiply operations are performed in parallel to multiple different messages, thereby generating updated state values for multiple different LFSR stages to be updated in parallel.

Accordingly, a parallel LFSR, implemented using SIMD operations of a SIMD processor parallelizes the computation of LFSR state across multiple input messages at once, while operating at the same clock rate (or approximately the same clock rate) as in the case of scalar operations (e.g., operating on a single input message at a time). In various embodiments of the present disclosure, a parallel LFSR using SIMD instructions may be used to perform LFSR operations, such as computing check symbols based on an input sequence of data symbols, on multiple sequences of input symbols in parallel.

Figure 4A:
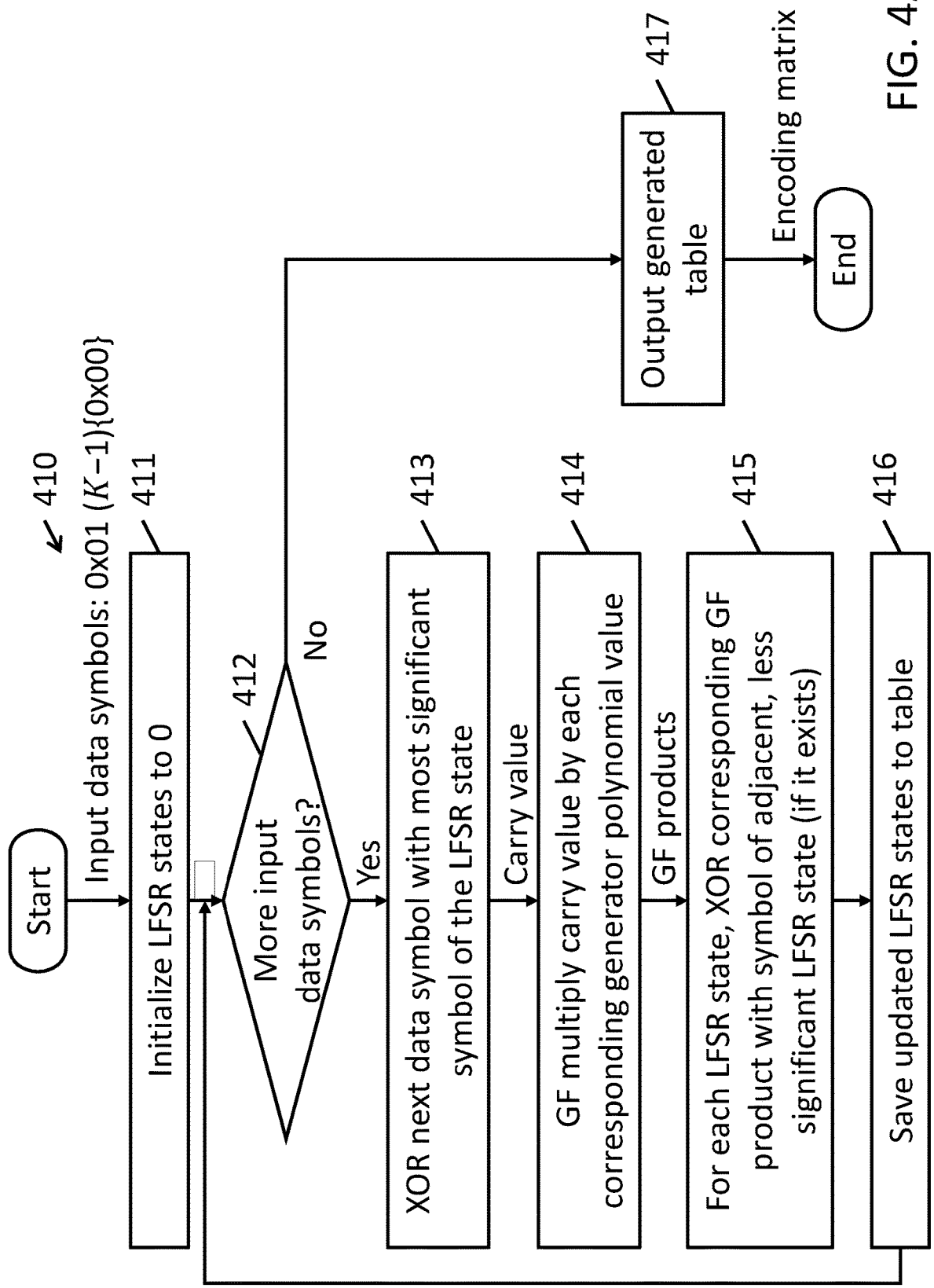
FIG. 4A is a flowchart depicting a method for generating an encoding matrix according to one embodiment of the present disclosure.

FIG. 4A is a flowchart depicting a method for generating an encoding matrix according to one embodiment of the present disclosure. As noted above, the encoding matrix may have dimensions K×T, where K is the length of an input sequence of data symbols in an (N, K) Reed-Solomon code, and T is the number of check symbols (e.g., T+N−K). The method 410 shown in FIG. 4A is substantially similar to the method for computing check values as shown in FIG. 3C with the addition of operation 416 in which the T intermediate states of the T-stage LFSR are saved to a table after each data symbol is read into the LFSR. As noted above, to generate the encoding matrix or table of check values, the input sequence of K data symbols are an initial symbol having a value of "1" (e.g., an initial byte having a value of 0x01) followed by K−1 symbols each having a value of "0" (e.g., (K−1){0x00}). The operations 410, 430, 450, 460, and 470 of FIG. 4A respectively correspond to operations 210, 230, 250, 260, and 270 of FIG. 2 and therefore description thereof will not be repeated in detail herein.

As a result, the method 400 generates a table where an i-th row of the K rows of the table contains the check values that would be generated by the LFSR in response to an input sequence of data symbols where all of the values in the input sequence were zeros except for the i-th symbol in the input sequence, which has a value of 1.

As seen above, according to some embodiments of the present disclosure, computing a table of check factors using an LFSR for particular values of K and T (or, equivalently, N−K) for a given (N, K) Reed-Solomon code involves performing many GF multiply operations. In some embodiments, the GF multiplications are accelerated using lookup tables generated in accordance with a primitive polynomial and primitive element (or generator) associated with the particular Galois field used by the code (e.g., GF($2^8$)).

Specialized instruction sets for performing mathematical operations over Galois fields have been created for modern processors to greatly increase the speed at which certain operations can be performed. This speed increase is largely due to the operations requiring fewer instructions to carry out operations wherein a vector element is multiplying the byte elements of a matrix. One such instruction set is the AVX-512+GFNI "Galois Field New Instructions" that can be utilized to perform multiplication of bytes (Galois Field elements) over GF($2^8$) represented in polynomial representation with Rijndael's reduction polynomial: $x^8+x^4+x^3+x+1$ (represented by the value $2^8+2^4+2^3+2^1+1=283$ in decimal or 0x11b in hexadecimal). The use of such processor instructions provides speed increases in applications including cryptography. In particular the Advanced Encryption Standard (AES) uses the 0x11b field, which is also referred to as the Rijndael field.

Accordingly, in some embodiments implemented on processors having instruction sets that include Galois field operations such as a Galois field multiply (e.g., the GF2P8MULB instructions, including scalar and vector variants, from x86 AVX-512+GFNI or equivalent instructions in other instruction sets), the processor implements the GF multipliers 130 of an LFSR 100 such as that shown in FIG. 1 (or GF multipliers 330 of the example four-stage LFSR 300 shown in FIGS. 3A and 3B) using these Galois field operations to accelerate the computation of check values using the LFSR.

In addition, as noted above, some aspects of embodiments of the present disclosure relate to implementations of encoders and decoders on vector processors, e.g., processors that include SIMD hardware controlled using SIMD instructions or vector instructions. For example, various operations performed in the process of encoding and decoding data in accordance with an LFSR as described herein (or an equivalent encoding matrix or decoding matrix) may be performed using SIMD instructions such that multiple pieces of data are operated on in parallel. For example, check data for multiple sequences of symbols can be computed concurrently in different corresponding portions of SIMD vectors.

As mentioned above, for exemplary purposes and ease of description, data is assumed to be organized in 8-bit bytes, each byte capable of taking on $2^8=256$ possible values. Such data can be manipulated in byte-size elements using GF arithmetic for a Galois field of size $2^8=256$ elements (e.g., in the field $GF(2^8)=GF(256)$). It should also be noted that the same mathematical principles apply to any power-of-two $2^P$ number of elements, not just 256, as Galois fields can be constructed for any integral power of a prime number. Because Galois fields are finite, and because GF operations never overflow, all results are the same size as the inputs, for example, 8 bits.

In a Galois field of a power-of-two number of elements, addition and subtraction are the same operation, namely a bitwise exclusive OR (XOR) of the two operands. This is a very fast operation to perform on any current processor. It can also be performed on multiple bytes concurrently. Because the addition and subtraction operations take place, for example, on a byte-level basis, they can be done in parallel by using, for instance, x86 architecture Streaming SIMD Extensions (SSE) instructions (SIMD stands for single instruction, multiple data, and refers to performing the same instruction on different pieces of data, possibly concurrently), such as PXOR (Packed (bitwise) Exclusive OR) and x86 architecture Advanced Vector Extensions (AVX) instructions such as AVX, AVX2 and AVX-512.

x86 SIMD instructions can process, for example, 16-byte vector registers (XMM registers) in the case of SSE instructions, 32-byte vector registers (YMM registers) in the case of AVX instructions, and 64-byte vector registers (ZMM registers) in the case of AVX-512 instructions, and are able to process such vector registers as though they contain 16 separate one-byte operands (or 8 separate two-byte operands, or four separate four-byte operands, etc.). Accordingly, SSE instructions can do byte-level processing 16 times faster than when compared to processing a byte at a time. Further, there are 16 XMM registers, so dedicating four such registers for operand storage allows the data to be processed in 64-byte increments, using the other 12 registers for temporary storage. That is, individual operations can be performed as four consecutive SSE operations on the four respective registers (64 bytes), which can often allow such instructions to be efficiently pipelined and/or concurrently executed by the processor. In addition, the SSE instructions allow the same processing to be performed on different such 64-byte increments of data in parallel using different cores. Thus, using four separate cores can potentially speed up this processing by an additional factor of 4 over using a single core. Similarly, for example, AVX-512 instructions process 512 bit registers (64-byte registers) and therefore processors providing hardware supporting AVX-512 instructions enable a 4× speedup over corresponding SSE instructions (which operate on 16-byte registers versus the 64-byte registers of AVX-512 instructions).

For example, taking the example of SSE instructions, a parallel adder (Parallel Adder) can be built using vector registers (e.g., the 16-byte XMM registers and four consecutive PXOR instructions. Such parallel processing (that is, 64 bytes at a time with only a few machine-level instructions) for GF arithmetic is a significant improvement over doing the addition one byte at a time. Since the data is organized in blocks of any fixed number of bytes, such as 4096 bytes (4 kilobytes, or 4 KB) or 32,768 bytes (32 KB), a block can be composed of numerous such 64-byte chunks (e.g., 64 separate 64-byte chunks in 4 KB, or 512 chunks in 32 KB). Parallel Adders according to embodiments of the present disclosure are not limited to SSE instructions may be implemented by corresponding vector instructions in other SIMD instruction sets, such as using 64-byte registers (e.g., ZMM registers) available in processors supporting AVX-512.

Multiplication in a Galois field is not as straightforward. While much of it is bitwise shifts and exclusive OR's (i.e., "additions") that are very fast operations, the numbers "wrap" in peculiar ways when they are shifted outside of their normal bounds (because the field has only a finite set of elements), which can slow down the calculations. This "wrapping" in the GF multiplication can be addressed in many ways. For example, the multiplication can be implemented serially (Serial Multiplier) as a loop iterating over the bits of one operand while performing the shifts, adds, and wraps on the other operand. Such processing, however, takes several machine instructions per bit for 8 separate bits. In other words, this technique requires dozens of machine instructions per byte being multiplied. This is inefficient compared to, for example, the performance of the Parallel Adder described above.

As another approach, referred to herein as a Serial Lookup Multiplier, multiplication tables (of all the possible products, or at least all the non-trivial products) can be pre-computed and built ahead of time. For example, a table of 256× 256=65,536 bytes can hold all the possible products of the two different one-byte operands. However, such tables can force serialized access on what are only byte-level operations, and not take advantage of wide (concurrent) data paths available on modern SIMD processors, such as those used to implement the Parallel Adder above.

In still another approach referred to herein as a Parallel Multiplier, the GF multiplication is performed on multiple bytes at a time, because the same factor in the encoding matrix is multiplied with every element in a data block. Thus, the same factor can be multiplied with, for example, 64 consecutive data block bytes at a time in the case of an x86 processor supporting SSE instructions (where the particular number of byte-sized data blocks depends on the size and number of the vector registers of the processor). This is similar to the Parallel Adder described above, except that several more operations are used to perform the GF multiplication operation. While this can be implemented as a loop on each bit of the factor, as described above, only performing the shifts, adds, and wraps on 64 bytes at a time, it can be more efficient to process the 256 possible factors as a (C language) switch statement, with inline code for each of 256 different combinations of two primitive GF operations: Multiply-by-2 and Add. For example, GF multiplication by the factor 3 can be implemented by first doing a Multiply-by-2 followed by an Add. Likewise, GF multiplication by 4 is just a Multiply-by-2 followed by a Multiply-by-2 while multiplication by 6 is a Multiply-by-2 followed by an Add and then by another Multiply-by-2.

While this Add is identical to the Parallel Adder described above (e.g., four consecutive PXOR instructions to process 64 separate bytes), Multiply-by-2 is not as straightforward. For example, in SSE, Multiply-by-2 in GF arithmetic can be implemented across 64 bytes at a time in 4 XMM registers via 4 consecutive PXOR instructions, 4 consecutive PCMPGTB (Packed Compare for Greater Than) instructions, 4 consecutive PADDB (Packed Add) instructions, 4 consecutive PAND (Bitwise AND) instructions, and 4 consecutive PXOR instructions. Though this takes 20 machine instructions, the instructions are very fast and results in 64 consecutive bytes of data at a time being multiplied by 2. As noted above, embodiments of the present disclosure are not limited to implementation using SSE instructions and may be implemented using other types of SIMD instructions such as AVX and AVX-512 instructions.

For 64 bytes of data, assuming a random factor between 0 and 255, the total overhead for the Parallel Multiplier is about 6 calls to multiply-by-2 and about 3.5 calls to add, or about 6×20+3.5×4=134 machine instructions, or a little over 2 machine instructions per byte of data. While this compares favorably with byte-level processing, it is still possible to improve on this by building a parallel multiplier with a table lookup (Parallel Lookup Multiplier) using a SIMD permute or shuffle instruction such as the PSHUFB (Packed Shuffle Bytes) instruction in x86 instruction sets, the TBL (Table vector lookup) instruction in an ARM A64 instruction set, or the VPERMXOR for IBM PowerPC architectures and doing the GF multiplication in 4-bit nibbles (half bytes).

Some SIMD instruction sets include instructions for performing Galois field multiplications. One example is the x86 AVX-512 instruction GF2P8MULB or Galois Field Multiply Bytes instruction, which multiplies two vectors of elements in the field $GF(2^8)$ where the field $GF(2^8)$ is represented in polynomial representation with the reduction polynomial $x^8+x^4+x^3+x+1$. As such, in some embodiments, an appropriate SIMD Galois Field multiplication instruction of the vector instruction set of the processor is used to perform the Galois field multiplications to implement the Parallel Multiplier used in encoders and decoders according to various embodiments of the present disclosure.

In some circumstances, the primitive polynomial associated with the Galois Field instructions of a processor may not be compatible with the primitive polynomial of the code used to encode and decode data. For example, the x86 AVX-512 instruction GF2P8MULB uses a polynomial based on the value 0x11b. On the other hand, some coding systems use a different primitive polynomial, such as a primitive polynomial based on the value 0x11d (the primitive polynomial $x^8+x^4+x^3+x^2+1$ represented by the value $2^8+2^4+2^3+2^2+1=285$ in decimal which is 0x11d in hexadecimal). In such cases, it is possible that the Galois Field instructions of the processor will not produce correct results, and therefore a parallel multiplier based on a primitive polynomial that matches the primitive polynomial of the Galois field of the code used to encode and decode data is used instead. Examples of such parallel multipliers include the parallel multiplier described above and a parallel lookup Galois field multiplier as described below.

Figure 4B:
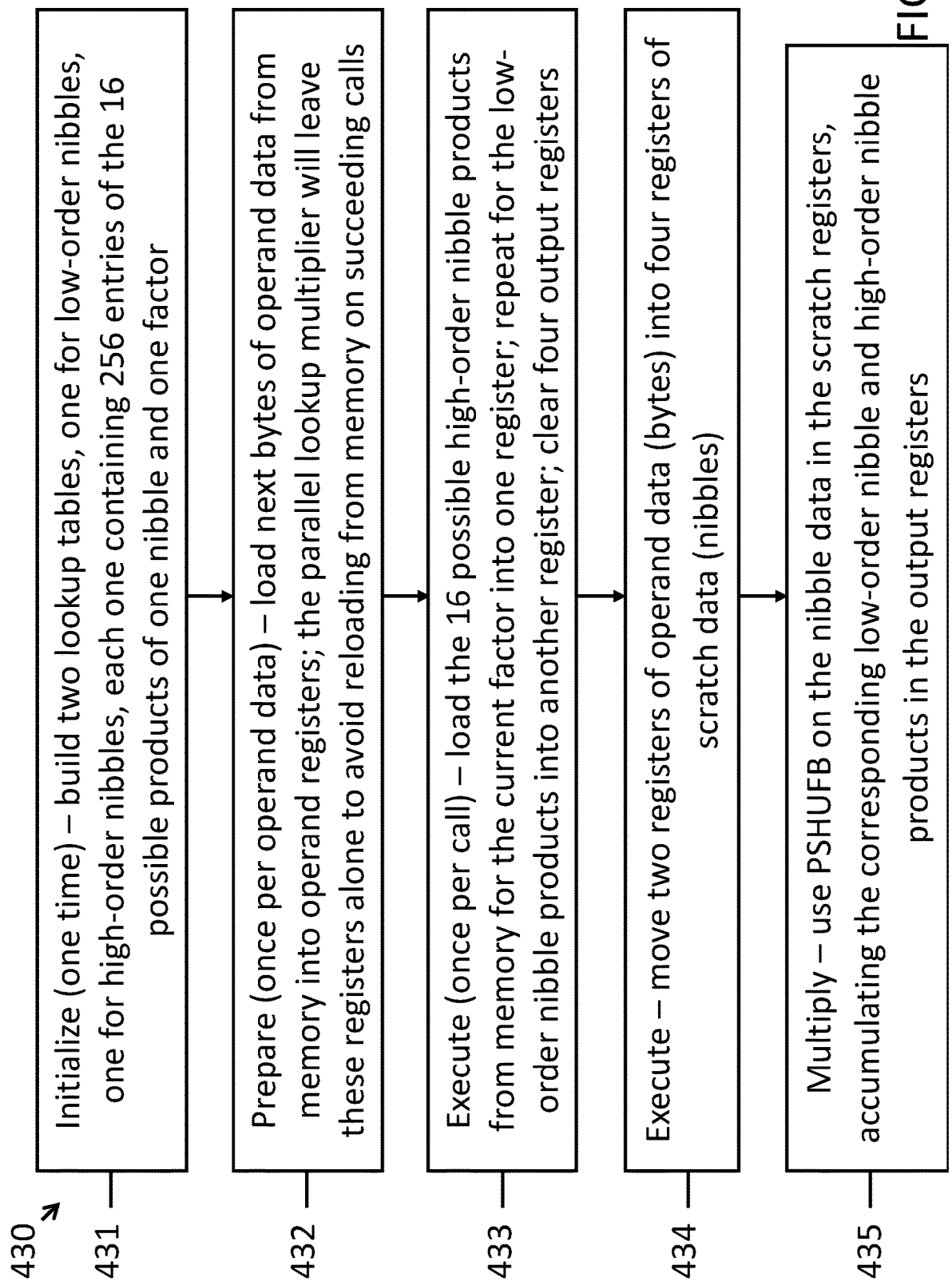
FIG. 4B shows an exemplary method for performing a parallel lookup Galois field multiplication according to an embodiment of the present invention.

FIG. 4B shows an exemplary method 430 for performing a parallel lookup Galois field multiplication according to an embodiment of the present invention.

Referring to FIG. 4B, in step 431, two lookup tables are built once: one lookup table for the low-order nibbles in each byte, and one lookup table for the high-order nibbles in each byte. Each lookup table contains 256 sets (one for each possible factor) of the 16 possible GF products of that factor and the 16 possible nibble values. Each lookup table is thus 256×16=4096 bytes, which is considerably smaller than the 65,536 bytes needed to store a complete one-byte multiplication table. In addition, in the case of SSE instructions, PSHUFB does 16 separate table lookups at once, each for one nibble, so 8 PSHUFB instructions can be used to do all the table lookups for 64 bytes (128 nibbles). The process scales when using processor architectures supporting longer vectors, such as 64 byte registers available in x86 processors supporting AVX-512 (e.g., a VPSHUFB instruction).

Next, in step 432, the Parallel Lookup Multiplier is initialized for the next set of bytes of operand data (such as original data or surviving original data), such as 64 bytes of operand data in the case of an SSE instruction set or 256 bytes in the case of an AVX-512 instruction set In order to save loading this data from memory on succeeding calls, the Parallel Lookup Multiplier dedicates four vector registers for this data, which are left intact upon exit of the Parallel Lookup Multiplier. This allows the same data to be called with different factors (such as processing the same data for another check drive).

Next in step 433, to process these 64 bytes of operand data, the Parallel Lookup Multiplier can be implemented with 2 MOVDQA (Move Double Quadword Aligned) instructions (from memory) to do the two table lookups and 4 MOVDQA instructions (register to register) to initialize registers (such as the output registers). These are followed in steps 434 and 435 by two nearly identical sets of 17 register-to-register instructions to carry out the multiplication 32 bytes at a time. Each such set starts (in step 434) with 5 more MOVDQA instructions for further initialization, followed by 2 PSRLW (Packed Shift Right Logical Word) instructions to realign the high-order nibbles for PSHUFB, and 4 PAND instructions to clear the high-order nibbles for PSHUFB. That is, two registers of byte operands are converted into four registers of nibble operands. Then, in step 435, 4 PSHUFB instructions are used to do the parallel table lookups, and 2 PXOR instructions to add the results of the multiplication on the two nibbles to the output registers.

Thus, the Parallel Lookup Multiplier uses 40 machine instructions to perform the parallel multiplication on 64 separate bytes, which is considerably better than the average 134 instructions for the Parallel Multiplier above, and only 10 times as many instructions as needed for the Parallel Adder. While some of the Parallel Lookup Multiplier's instructions are more complex than those of the Parallel Adder, much of this complexity can be concealed through the pipelined and/or concurrent execution of numerous such contiguous instructions (accessing different registers) on modern pipelined processors. For example, in exemplary implementations, the Parallel Lookup Multiplier has been timed at about 15 CPU clock cycles per 64 bytes processed per CPU core (about 0.36 clock cycles per instruction). In addition, the code footprint is practically nonexistent for the Parallel Lookup Multiplier (40 instructions) compared to that of the Parallel Multiplier (about 34,300 instructions), even when factoring the 8 KB needed for the two lookup tables in the Parallel Lookup Multiplier.

In addition, embodiments of the Parallel Lookup Multiplier can be passed 64 bytes of operand data (such as the next 64 bytes of surviving original data X to be processed) in four consecutive registers, whose contents can be preserved upon exiting the Parallel Lookup Multiplier (and all in the same 40 machine instructions) such that the Parallel Lookup Multiplier can be invoked again on the same 64 bytes of data without having to access main memory to reload the data. Through such a protocol, memory accesses can be minimized (or significantly reduced) for accessing the original data D during check data generation or the surviving original data X during lost data reconstruction.

While one example of a Parallel Lookup Multiplier is presented above and with respect to FIG. 4B in the context of an x86 processor with hardware supporting SSE instructions, embodiments of the present disclosure are not limited thereto and may also be implemented using other vector processors having different vector sizes and/or different numbers of vector registers, therefore possibly resulting in different levels of parallelism (e.g., different number of bytes of operand data that can be multiplied in parallel), such as an x86 processor with hardware supporting AVX-2 or AVX-512 instructions.

Some aspects of embodiments of the present disclosure relate to generating a codeword using a polynomial code based on an LFSR or based on a polynomial encoding matrix.

Figure 5A:
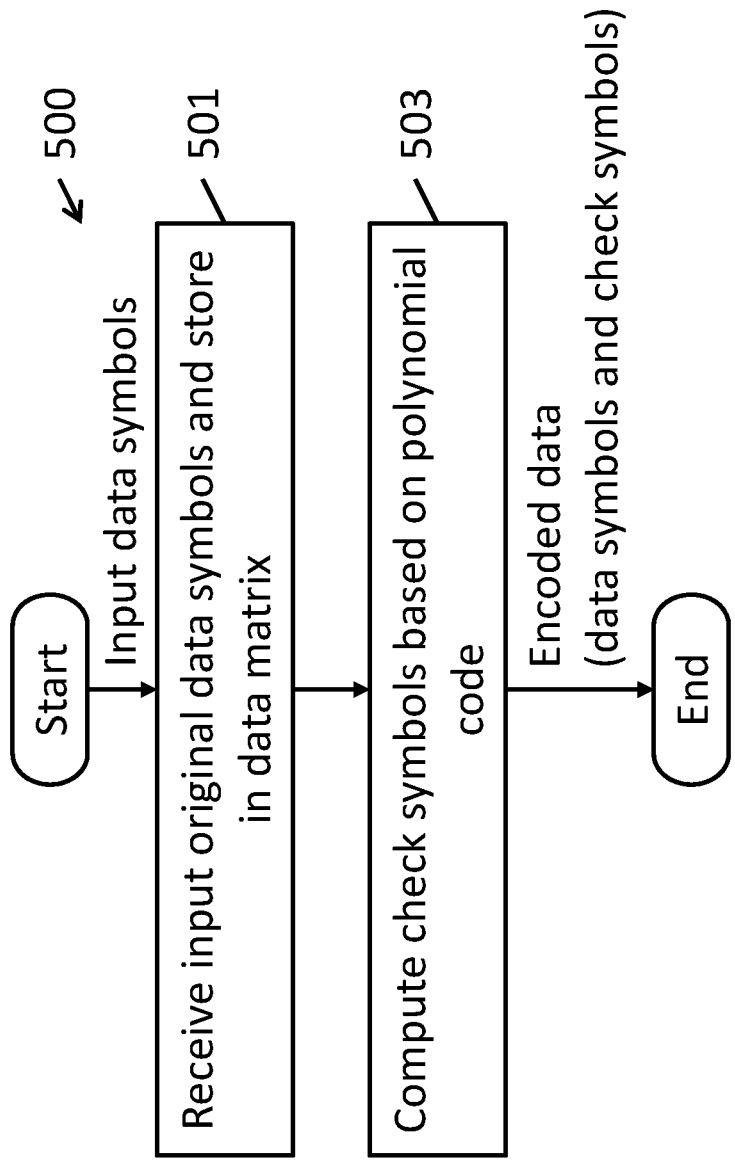
FIG. 5A is a flowchart depicting a method for encoding data using a polynomial code according to one embodiment of the present disclosure.

FIG. 5A is a flowchart depicting a method 500 for encoding data using a polynomial code according to one embodiment of the present disclosure. As shown in FIG. 5A, at operation 501, a processor receives input original data symbols and stores the data symbols in a data matrix.

At operation 503, the processor computes check symbols based on a polynomial code, such as by using an LFSR to compute the check symbols or computing a dot product of the original data symbols with a polynomial encoding matrix, as described above (e.g., using the encoding matrix generated with the method 410 shown in FIG. 4A). As noted above, in some embodiments, a T-stage LFSR 100 is used directly to produce sequence of T check values (or check symbols) based on an input sequence of K data values (or data symbols). Alternatively, in some embodiments, the input sequence of K data values are multiplied by a K×T polynomial encoding matrix (e.g., generated based on the technique described above with respect to FIG. 4) to generate the T check values. The T check values are then concatenated with the K data values to produce a codeword (e.g., the K data values followed by the T check values, for a total of N values or N symbols, where N=K+T).

Figure 5B:
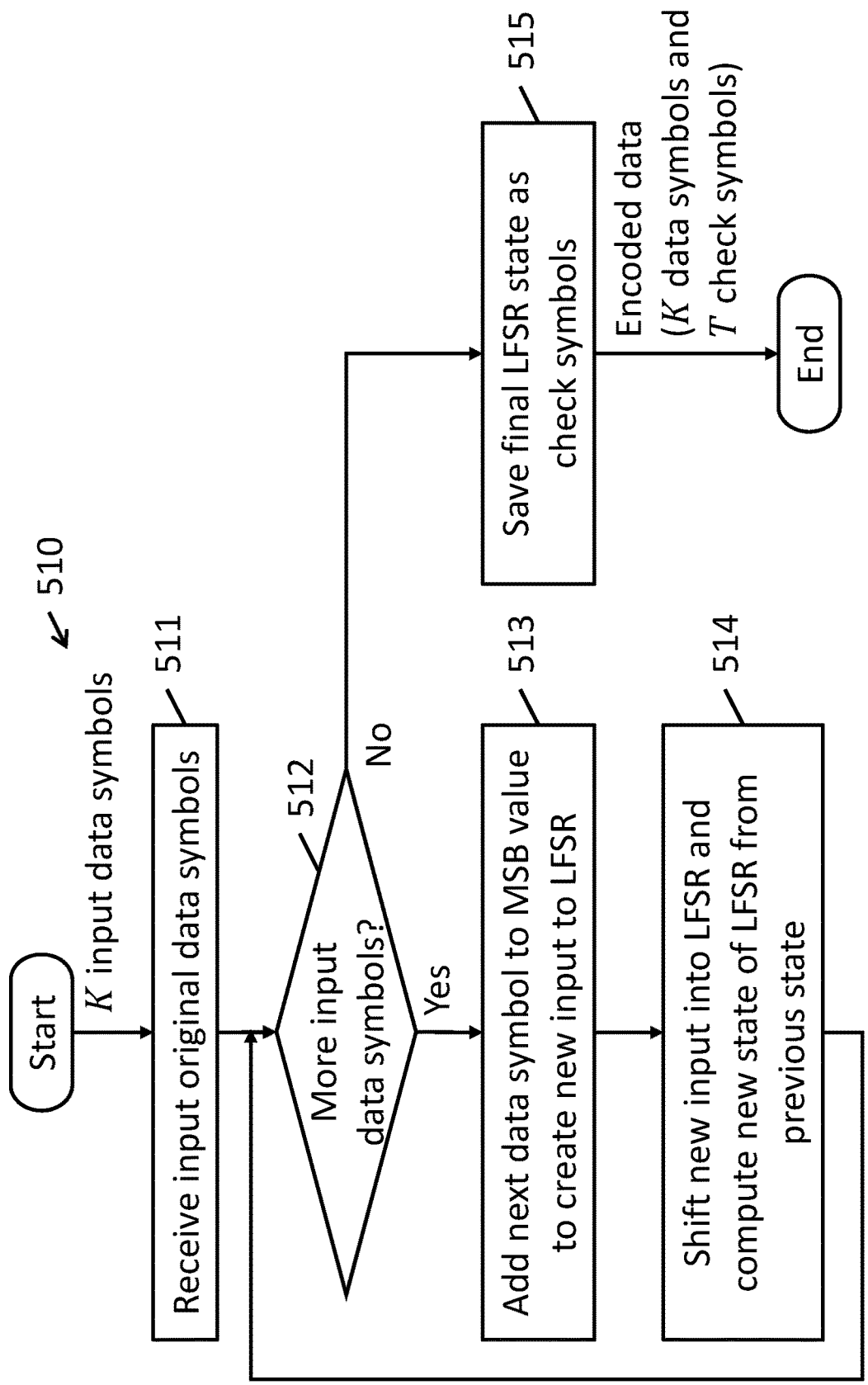
FIG. 5B is a flowchart depicting a method for encoding data using a polynomial code and a LFSR according to one embodiment of the present disclosure.

FIG. 5B is a flowchart depicting a method 510 for encoding data using a polynomial code and a LFSR according to one embodiment of the present disclosure. The method 510 shown in FIG. 5B should generate the same results as the method shown in FIG. 5A, but performs the operations using an explicit LFSR instead of using an encoding matrix. As described above, a T-stage LFSR may be configured to compute the T check symbols from a sequence of K input data symbols using a set of coefficients supplied to the taps of the LFSR (see, e.g., the examples described above with respect to FIG. 1, FIG. 3A, and FIG. 3B). In some embodiments, the processor explicitly implements an LFSR, such as by allocating locations in memory to store the values supplied to the taps of the LFSR, the state of the LFSR, and to perform operations on the input symbols (e.g., by shifting in the input symbols one at a time) and the state of the LFSR to compute an updated state of the LFSR, where the final state of the LFSR after shifting in the K input data symbols represents the T check symbols.

Referring to FIG. 5B, at operation 511, the processor starts with the K input original data symbols to be encoded. At operation 512, the processor iterates over the K input data symbols by determining if there are more input data symbols to process. If so, then at operation 513, the processor adds the next data symbol to the most significant value of the LFSR, noting that, a GF addition can be implemented as a bitwise XOR operation (see, e.g., the carry value fed back from d[MSB] to the XOR gate 120 or the XOR gate 320 as shown in FIG. 3A and FIG. 3B). At operation 514, the processor shifts the new input (the XOR of the MSB value and the data symbol) into the LFSR, including multiplying the values by the coefficients of the generator polynomial fed into the taps and, for LFSR stages other than the first stage d[0], adding the computed GF product to the value of the previous stage. This computes a new state of the LFSR (e.g., values stored in the stages of the LFSR). The processor then returns to operation 512 to determine if there are more input data symbols and, if so, proceeds with shifting in the next input data symbol until all K symbols have been fed in.

After feeding in all K input data symbols, the state of the LFSR (the values stored in the stages) correspond to the computed check symbols, and the processor saves the final LFSR state as the T check symbols at operation 515. As a result, the encoded data includes the K input data symbols and the T check symbols.

The method described with respect to FIG. 5B and shown with respect to an LFSR such as that shown in FIG. 1 can be performed in parallel across multiple sequences of K input data symbols. In particular, the encoding of any sequence of K input data symbols can be performed independently (e.g., the encoding of one sequence of K input data symbols does not depend on values of the encoding of a different sequence of K input data symbols).

In some embodiments of the present disclosure, a Parallel LFSR Sequencer operates on a SIMD processor (e.g., a vector processor), for example, 16-byte vector registers (XMM registers in the case of SSE) or 64-byte vector registers (e.g., in the case of AVX-512). For the sake of generality, the length of a vector register supported by a SIMD processor may be referred to herein as a SIMD length vector register capable of operating on SIMD bytes at a time, e.g., where SIMD=16 bytes in the case of XMM registers and SIMD=64 bytes in the case of AVX-512 registers).

In this case, because the stages of the LFSR, the input data symbols, and the check symbols are each one byte in size, a vector processor having SIMD-length vectors can operate a Parallel LFSR Sequencer that operates on up to SIMD sequences (e.g., 16 input data sequences in the case of SSE or 64 input data sequences) in parallel to generate SIMD different sequences of check data and thereby produce SIMD codewords in parallel. Therefore, using SIMD registers multiplies the amount encoding that is performed on a per-clock cycle basis by performing multiple operations associated with multiple copies of an LFSR within a Parallel LFSR operating on multiple data streams in parallel.

The resulting codewords computed by encoders according to various embodiments of the present disclosure, described above, may then be stored in a data storage system or transmitted over a communications channel. For example, the N symbols of the codeword may be spread across multiple storage drives in a RAID storage system, spread across multiple flash chips of a flash storage system, stored in multiple memory chips of a dynamic random access memory (DRAM) subsystem, or the like. The N symbols of the codeword may also be stored together on a single device (e.g., on a single data storage drive). As another example, the codeword may be transmitted over a communications channel (e.g., a wired or wireless communications channel), such as a communications bus of a computer system (e.g., between a mass storage device and memory, between a processor and a peripheral, between a graphics processing unit and a digital display panel, and the like), or a networking communications channel (e.g., a wired Ethernet connection, a wireless local area network connection or Wi-Fi, a wireless cellular network connection, a satellite data connection, and the like).

In various circumstances, when codeword is stored and/or when the codeword is transmitted, data corruption may occur, where one or more symbols of the codeword are modified (errors) or erased (e.g., unreadable). For example, cosmic radiation may cause one or more bits of information stored in memory and transient voltage changes, electromagnetic interference, and timing errors may cause errors to appear in data while in transmission. Accordingly, the check symbols of the codeword may be used to provide some amount of protection to the data symbols, wherein the original data symbols may be recovered even in the case of the loss (e.g., errors or erasures) of up to T symbols of the K+T symbol codeword.

Some aspects of embodiments of the present disclosure relate to recovering data from a received codeword using a code based on an LFSR, where the received codeword has one or more errors or erasures.

Figure 5C:
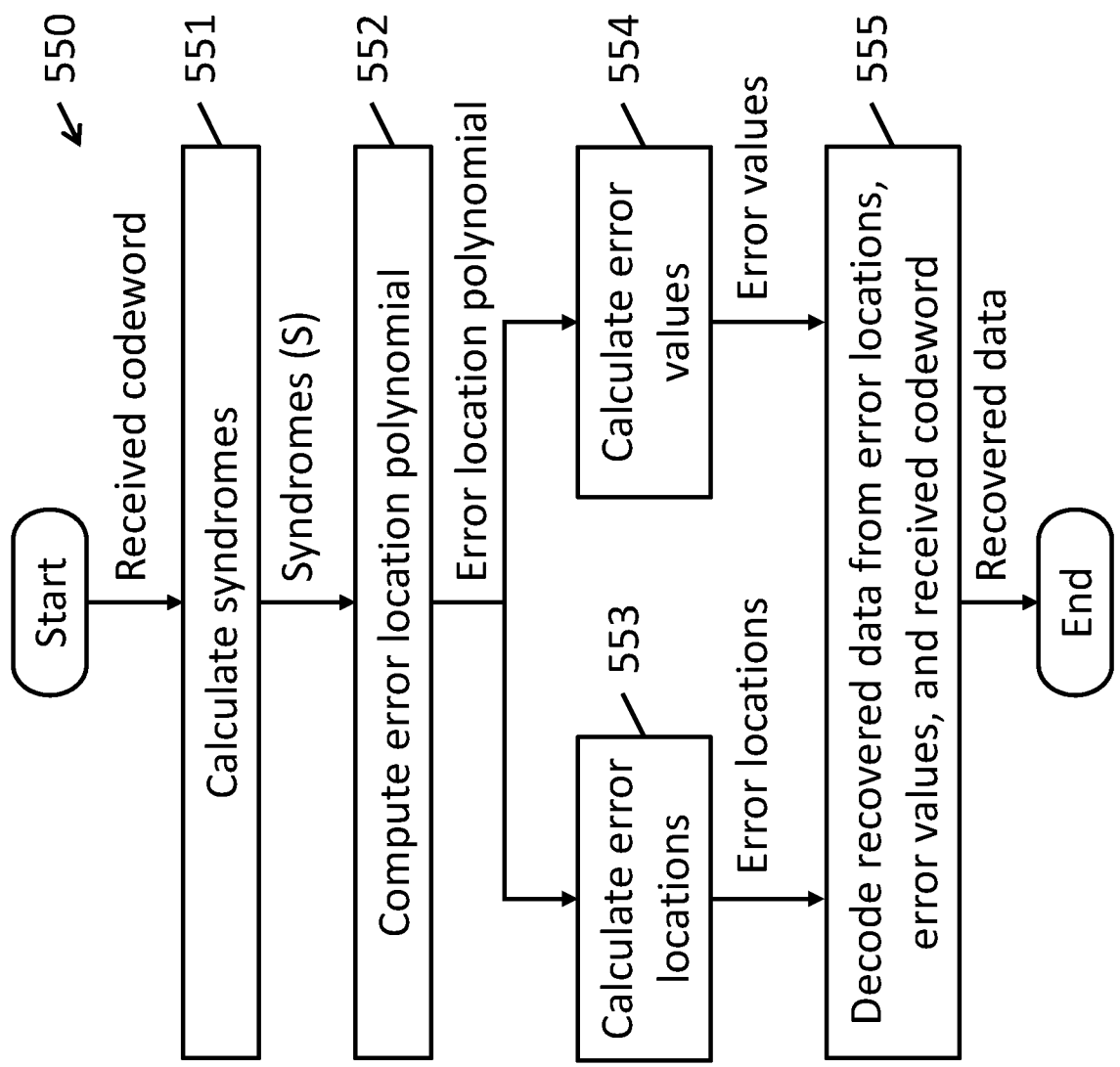
FIG. 5C is a flowchart depicting a method for decoding received data using a code according to one embodiment of the present disclosure.

FIG. 5C is a flowchart depicting a method 550 for decoding received data using a code according to one embodiment of the present disclosure. As shown in FIG. 5C, a processor receives a codeword, which may include one or more errors (e.g., incorrect symbols or erased symbols) among the data symbols and check symbols of the codeword. At operation 551, the processor calculates syndromes S based on the received codeword. The syndromes correspond to the dot product of the whole codeword with the Vandermonde matrix (or the accelerated version using Horner's method). When computing the dot product of the full codeword (the data symbols together with the check symbols) and the Vandermonde matrix, when the check symbols are correct, the result is zero. However, when there is an error, the result is the syndrome of the error.

At operation 552, the processor computes an error location polynomial based on the syndromes. The processor calculates the error locations at 553 using the error location polynomial (e.g., by finding the roots of the error location polynomial using a Chien search). At operation 554, the processor calculates the error values based on the syndromes and the error locator polynomial, and at operation 555, the processor decodes the recovered data based on the error locations, error values, and the received codeword to generate the recovered data.

Details relating to specific techniques for implementing a decoder are presented in Section 3 of Appendix B.

Some aspects of embodiments of the present disclosure relate to methods for calculating syndromes in operation 551, in particular using a technique based on Horner's rule, and therefore may be referred to herein as a parallel Horner sequencer or a parallel syndrome sequencer.

In a parallel syndrome sequencer or parallel Horner sequencer, the processor computes syndromes or Vandermonde row sums that are used to identify both the location and value of errors in the received codeword. Instead of computing a dot product between the received codeword and a Vandermonde matrix, a parallel syndrome sequencer according to some embodiments iteratively computes the syndrome using a method based on Horner's rule for evaluating polynomials. Generally, the process begins by loading the first symbol of every row of the data matrix, adding in the next data element multiplied by that row, and repeating until all of the symbols in the rows have been added. In this way, a single value is used repeatedly to perform the multiplication, rather than indexing into a table of precomputed values, as would be required in a system using a comparative Vandermode matrix.

A parallel syndrome sequencer according to some embodiments of the present disclosure produces the same result as computing a Vandermonde dot product over the whole received codeword, including the check symbols. However, by using Horner's method in computing the syndromes, the processor does not need to store or read a table to load the Vandermonde values, and therefore computes the same result more quickly than (e.g., with fewer memory accesses) than a Vandermonde dot product.

The resulting syndrome values computed by the parallel syndrome sequencer indicates no error (e.g., all of the syndrome values are zero values) or produces the intermediate results (non-zero syndrome values) that are used to compute the error values, as described above and as described, for example, in Section 3 of Appendix B.

Figure 5D:
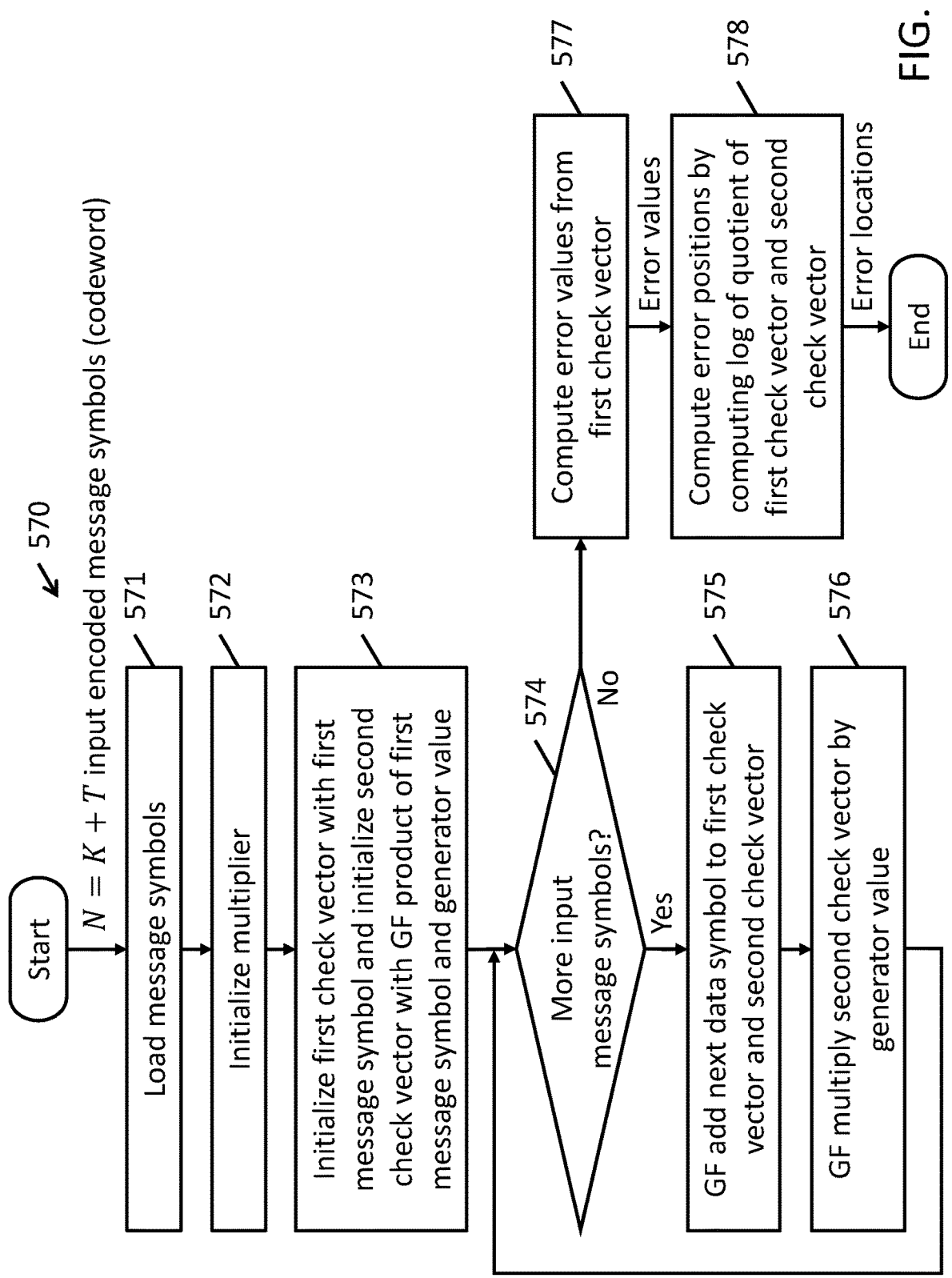
FIG. 5D is a flowchart depicting a method for implementing a parallel syndrome sequencer or parallel Homer sequencer according to one embodiment of the present disclosure.

In various embodiments of the present disclosure, the dot product of the check symbols and the solution matrix is computed using a parallel syndrome decoder or parallel Horner sequencer. FIG. 5D is a flowchart depicting a method 570 for implementing a parallel syndrome sequencer or parallel Homer sequencer according to one embodiment of the present disclosure. As noted above, in a manner similar to that described with respect to a parallel LFSR encoder, a parallel syndrome sequencer or parallel Horner sequencer may be implemented according to various embodiments of the present disclosure by using vector operations on data loaded into vector registers (SIMD-length vector registers) that operate on multiple (SIMD-number) of data streams in parallel (e.g., decoding a SIMD-number of codewords to recover original data). Generally, the technique shown in FIG. 5D proceeds by developing two Vandermonde terms or syndromes (referred to as a first check vector and a second check vector in a parallel syndrome sequencer or parallel Homer sequencer), where the final developed first Vandermonde term (or first check vector) stores the value of the error data and the second Vandermonde term (or second check vector), after being divided by the first Vandermonde term and taking a log, locates the position of the error.

Referring to FIG. 5D, at operation 571, the processor loads message symbols (e.g., the received codeword which includes K data symbols and T check symbols), where the message symbols may include one or more errors. In the case of a parallel syndrome sequencer or parallel Homer sequencer, the loading the message symbols may include loading the symbols of multiple messages into a vector register. At operation 572, the processor initializes a multiplier by loading the constant multiplicands into a register, where the constant multiplicand may be, for example, the generator value $\alpha$ (where, as noted above for the field 0x11d, $\alpha$ is 2 and for the field 0x11b, $\alpha$ is 3). In some embodiments, the processor uses the constant multiplicand multiple times, such as by multiplying the current value in the result register by the constant multiplicand during various iterations, thereby resulting in multiplying the result by higher powers of $\alpha$ (e.g., $\alpha^2$, $\alpha^3$, etc.).

At operation 573, the processor initializes a first Vandermonde term the value of the first symbol (or, in the case of a first check vector, initialized with the first symbol of each of the messages being decoded in parallel) and initializes a second Vandermonde term with the GF product of the first data symbol and the previously loaded constant multiplicands. (Likewise, in the case of a second check vector, the vector is initialized with the product of the previously loaded constant multiplicands with the first symbol of each of the messages being decoded in parallel.)

At operation 574, the processor iterates over the remaining input message symbols by determining if there are more input message symbols of the message to handle. If so, then the processor proceeds with operation 575 and updates the first check vector (or first Vandermonde term) by GF adding the next data symbol to the first check vector (or first Vandermonde term) and also GF adding the next data symbol to the second check vector (or second Vandermonde term). At operation 576, the processor updates the second check vector (or second Vandermonde term) by multiplying the term by the previously loaded constant multiplicands. Because the previously loaded constant multiplicands are loaded once, before the start of the loop, embodiments of the present disclosure reduce the number of computational cycles required during each loop because there is no need to re-load the multiplier table during each loop. These operations in this loop are analogous to a computation using Horner's method because, at each iteration, the second check vector is multiplied by $\alpha$, thereby resulting in a computation that is equivalent to evaluating a polynomial computed by the expansion of the terms of the form $x+\alpha^k$.

After all of the symbols of the message have been processed, the processor exits the loop and proceeds with computing the error values from the first check vector in operation 577. As noted above, the first check vector or first Vandermonde term stores the GF sum of all of the symbols in the message, which is equivalent to computing the check data for all of the symbols in the message. Because it is assumed that a properly coded message will have check symbols that sum to 0, the values stored in the first check vector are the values of the errors in the messages.

At operation 578, the processor computes the error positions by dividing the first check vector by the second check vector, then computing the log of the result, where the resulting vector stores the locations of the errors in the messages.

Figure 6:
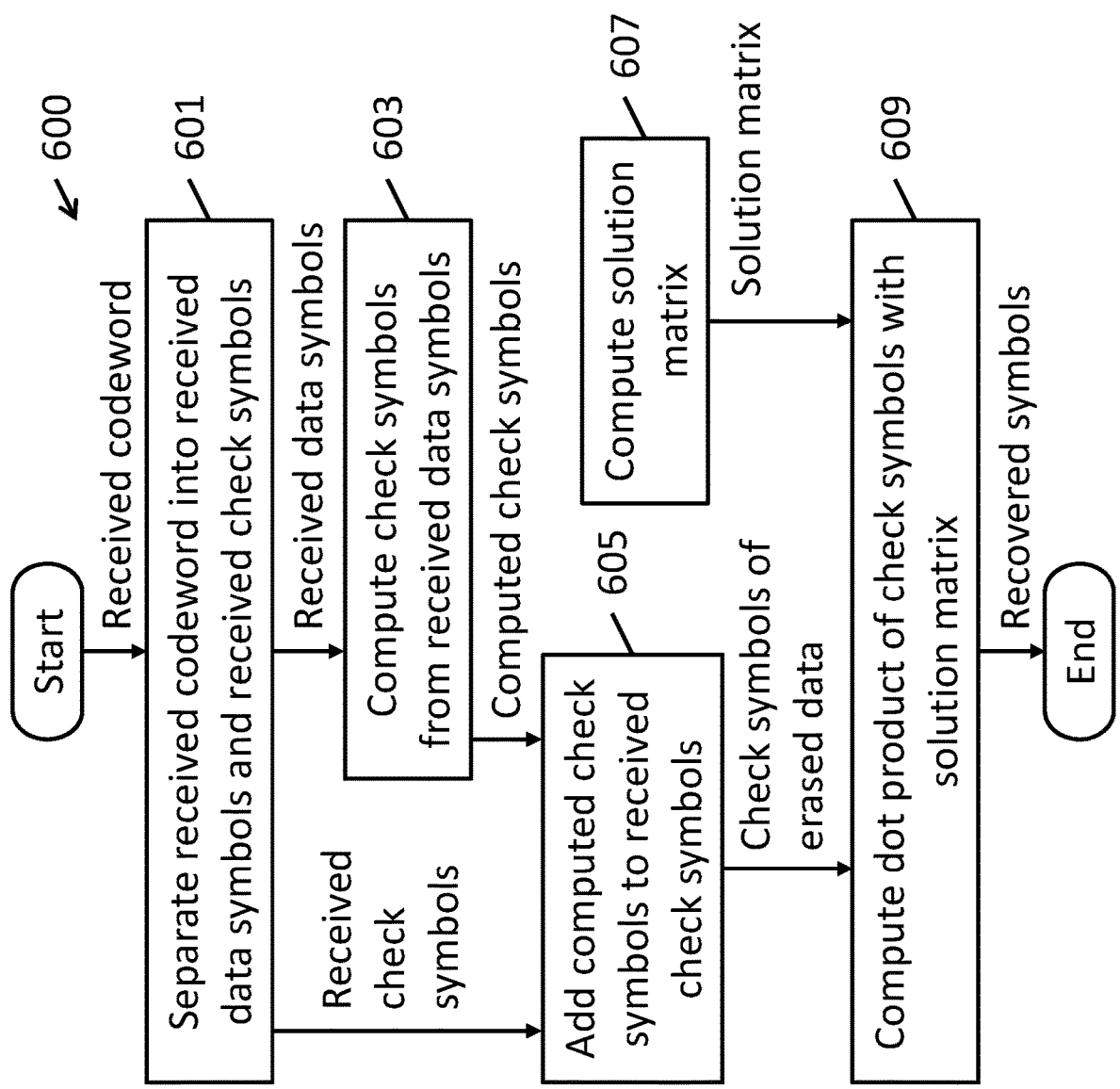
FIG. 6 is a flowchart depicting a method for recovering data from a received codeword according to one embodiment of the present disclosure.

FIG. 6 is a flowchart depicting a method 600 for recovering data from a received codeword according to one embodiment of the present disclosure.

Referring to FIG. 6, in operation 601 the processor separates the received codeword into the received data symbols (e.g., the first K symbols of the N symbol long codeword) and the received check symbols (e.g., the remaining N–K symbols or T symbols of the received codeword).

In operation 603, the processor computes check symbols based on the received data symbols, such as by using a T-stage LFSR (e.g., as shown in FIG. 1) configured with the generator polynomial of the code used to generate the check symbols of the received codeword, or by using the polynomial encoding matrix (generated by such an LFSR) to compute the check symbols again. The received data symbols may include one or more erasures, and therefore zero values (e.g., 0x00) are substituted for the erased data. This produces the check symbols of the original data without the erased data.

In operation 605, the processor adds the computed check symbols to the received check symbols using Galois field addition, which produces the check symbols for the erased data. That is, the Galois field addition operation causes the non-erased data to be "erased" from the received check symbols, leaving only check symbols corresponding to the erased data symbols.

In operation 607, the processor computes a solution matrix by starting with the entries in the encoding matrix that correspond to the F failed positions, which produces an F×F matrix, then inverting the F×F matrix to produce the solution matrix.

In operation 609, the processor recovers the erased data by computing a dot product between the check symbols of the erased data that were computed in operation 605 and the solution matrix computed in operation 607 (e.g., generated by an LFSR using the technique described above with respect to FIG. 4). Here, the corresponding values of the polynomial encoding table refers to the row of the polynomial encoding table corresponding to the position of the erased data within the received codeword.

In some embodiments, a decoding table is used to recover the data from multiple positions. In particular, the decoding table may be constructed by inverting the polynomial encoding table. The decoding table can then be applied to the computed check symbols of the erased data (e.g., computed in operation 605) and can be used to recover multiple lost data symbols in parallel. This approach also has much lower latency than a comparative approach based on a Chien search, and also does not require that the entire field (e.g., the entire field of $2^8$ values, in the case of $GF(2^8)$) be tested to find a solution corresponding to the recovered data.

While FIG. 6, FIG. 5C and FIG. 5D provides examples of a general process for recovering data from a received codeword that includes errors or erasures, some aspects of embodiments of the present disclosure relate to an intelligent decoder (e.g., implemented by a processor), where the intelligent decoder applies different strategies for decoding and/or recovering data based on the particular conditions, where the different strategies provide improved performance in specialized cases.

Figure 7A:
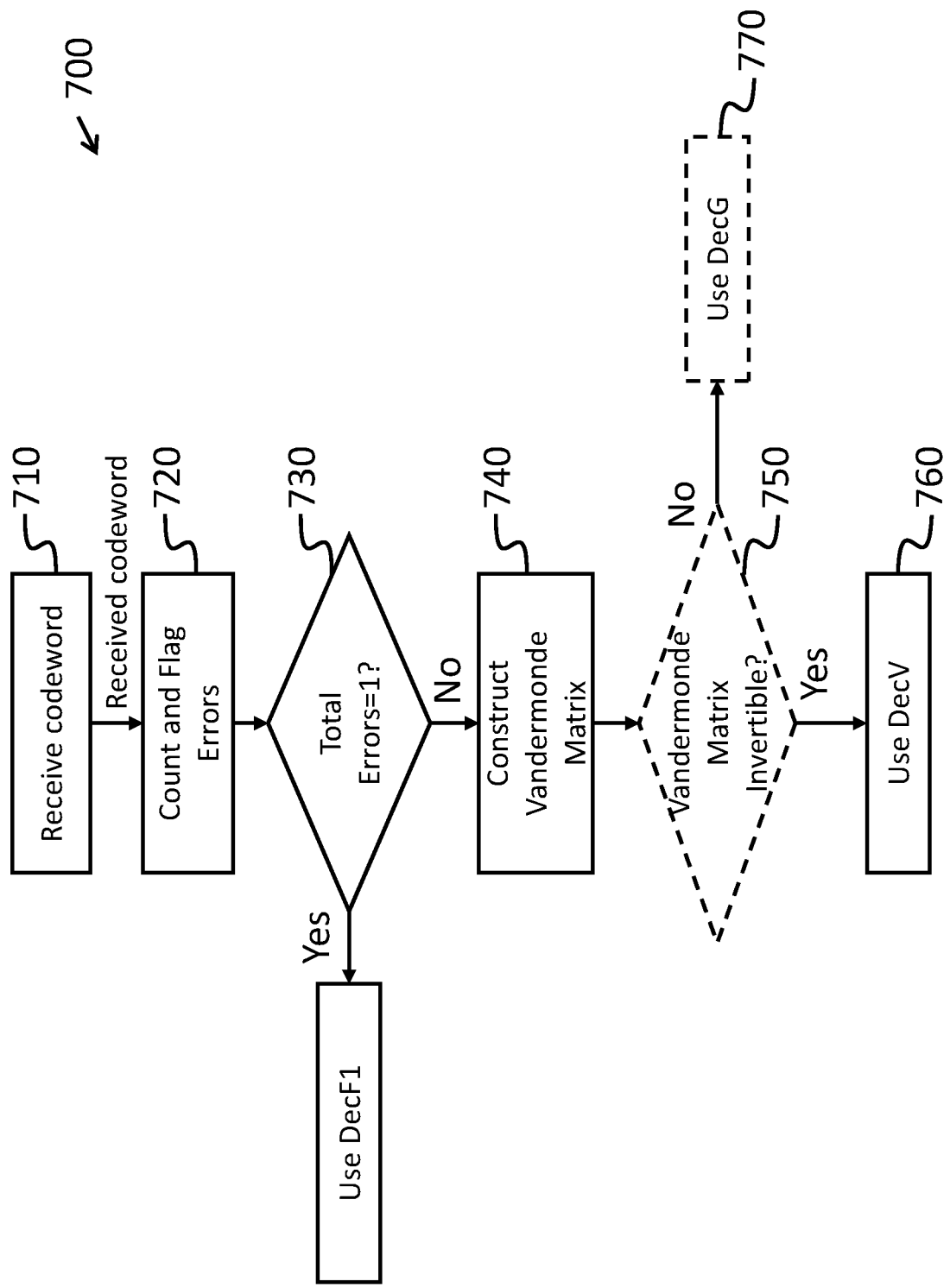
FIG. 7A is a flowchart depicting a method for selecting a decoding strategy according to one embodiment of the present disclosure.

FIG. 7A is a flowchart depicting a method for selecting a decoding strategy according to one embodiment of the present disclosure. Referring to FIG. 7A, the processor may begin with receiving a codeword to be decoded. In operation 720, the processor counts and flags the locations of the errors in the received codeword. In operation 730, the processor determines if the total number of errors found is equal to 1 (e.g., there is only a single error among the symbols in the received codeword). If so, then the processor uses a specialized decoder to handle the case of decoding a single error, where the single error decoder is referred to herein as "DecF1."

Generally, the single error decoder encodes the input codeword using either a well-formed LFSR or a polynomial encoding matrix. The single error decoder then decodes at least two check symbols with the Vandermonde matrix (which is not the same as the polynomial encoding matrix).

Assuming, without loss of generality, that the polynomial code for the LFSR starts with $2^0$ in embodiments where the generator is 2 (or, equivalently, $3^0$ in embodiments where the generator is 3), then the first row of the Vandermonde matrix is a parity row. Compute parity for all of the symbols of the codeword (including the check symbols). If the result is zero, then there is no error in the codeword (this is not expected to occur, because it was determined in operation 720 that the codeword includes exactly one error). If the result if not zero, and there is exactly one error as indicated above, the result is the value of the error. To compute the location of the error, the single error decoder divides the second check symbol (computed with the Vandermonde matrix, not the LFSR) by the first check symbol, then computes the log base 2 ($\log_2$) of the result, such that the error divides out and the value that remains identifies the location of the error.

If there is more than one error, then in operation 740, the processor constructs a Vandermonde matrix.

Section 2 of Appendix A describes a generalized Vandermonde matrix having a form where each column of the matrix is composed of an initial vector $\vec{\alpha}$ raised to a power. The generalized Vandermonde matrix may be used as the encoding matrix when certain conditions are met. In particular, the leftmost column is raised to the zeroth power, resulting in a column of ones. The next column is the vector $\vec{\alpha}$ raised to the first power (in other words, the vector $\vec{\alpha}$ itself), the following column is the vector $\vec{\alpha}$ raised to the second power, and so on. For example, assuming $\vec{\alpha}$ is a column vector, the generalized T×K Vandermonde matrix $V^{T,K}(\vec{\alpha})$ may be represented as:

$$V^{T,K}(\vec{\alpha}) = \begin{bmatrix} \alpha_1^0 & \alpha_1^1 & \alpha_1^2 & \cdots & \alpha_1^{K-1} \\ \alpha_2^0 & \alpha_2^1 & \alpha_2^2 & \cdots & \alpha_2^{K-1} \\ \vdots & \vdots & \vdots & \ddots & \vdots \\ \alpha_T^0 & \alpha_T^1 & \alpha_T^2 & \cdots & \alpha_T^{K-1} \end{bmatrix} = [\vec{\alpha}^0, \vec{\alpha}^1, \vec{\alpha}^2, \vec{\alpha}^3]$$

where:

$$\vec{\alpha} = \begin{bmatrix} \alpha_1 \\ \alpha_2 \\ \vdots \\ \alpha_T \end{bmatrix}$$

and where $\alpha_i$ is the i-th element of the initialization vector $\vec{\alpha}$. The generalized Vandermonde matrix corresponds to the check factors of the encoding matrix.

As a result, every row of the matrix (the i-th row) has the form of a single value ($\alpha_i$) raised to successive powers, e.g., the i-th row has the form:

$$[\alpha_i^0, \alpha_i^1, \alpha_i^2, \alpha_i^3, \ldots]$$

In some embodiments of the present invention, the elements $\alpha_i$ of the initialization vector $\vec{\alpha}$ are also defined in terms of a constant factor a raised to a power, e.g.:

$$\alpha_i = a^{i-1}$$

such that the initialization vector $\vec{\alpha}$ may be defined as:

$$\vec{\alpha} = \begin{bmatrix} \alpha_1 \\ \alpha_2 \\ \alpha_3 \\ \vdots \\ \alpha_T \end{bmatrix} = \begin{bmatrix} a^{1-1} \\ a^{2-1} \\ a^{3-1} \\ \vdots \\ a^{T-1} \end{bmatrix} = \begin{bmatrix} a^0 \\ a^1 \\ a^2 \\ \vdots \\ a^{T-1} \end{bmatrix}$$

For example, when the constant factor a is 2, the initialization vector $\vec{\alpha}$ is defined as:

$$\vec{\alpha} = \begin{bmatrix} 2^0 \\ 2^1 \\ 2^2 \\ 2^3 \\ \vdots \end{bmatrix} = \begin{bmatrix} 1 \\ 2 \\ 4 \\ 8 \\ \vdots \end{bmatrix}$$

In operation 750, the processor determines if the constructed Vandermonde matrix is invertible. If so, then the process continues with a specialized Vandermonde matrix decoder, referred to herein as "DecV."

In more detail, if the data was originally encoded using a polynomial encoding matrix or an LFSR (e.g., parallel LFSR combined with a parallel multiplier) as described above, then the constructed Vandermonde matrix will be invertible, and therefore the data can be decoded using a Vandermonde matrix decoder in operation 760 and described below with respect to FIG. 7B. However, if the data was originally encoded using a Vandermonde encoding matrix, then the constructed Vandermonde matrix is not always invertible, depending on which data is missing, and therefore other approaches must be used instead to perform the decoding, such as those as described below with respect to operation 770 and FIG. 7C. Therefore, in some embodiments, operations 750 and 770 are included in circumstances where the data to be decoded may have been originally encoded using a Vandermonde matrix.

Accordingly, in some embodiments, if the data is known to be encoded using a polynomial encoding matrix or an LFSR and not encoded using a Vandermonde matrix, then operations 750 and 770 are omitted entirely (e.g., are optional, in accordance with different embodiments of the present disclosure, as indicated by the dashed lines in FIG. 7A) and the processor continues directly to decoding using a Vandermonde matrix as described below with respect to FIG. 7B.

Figure 7B:
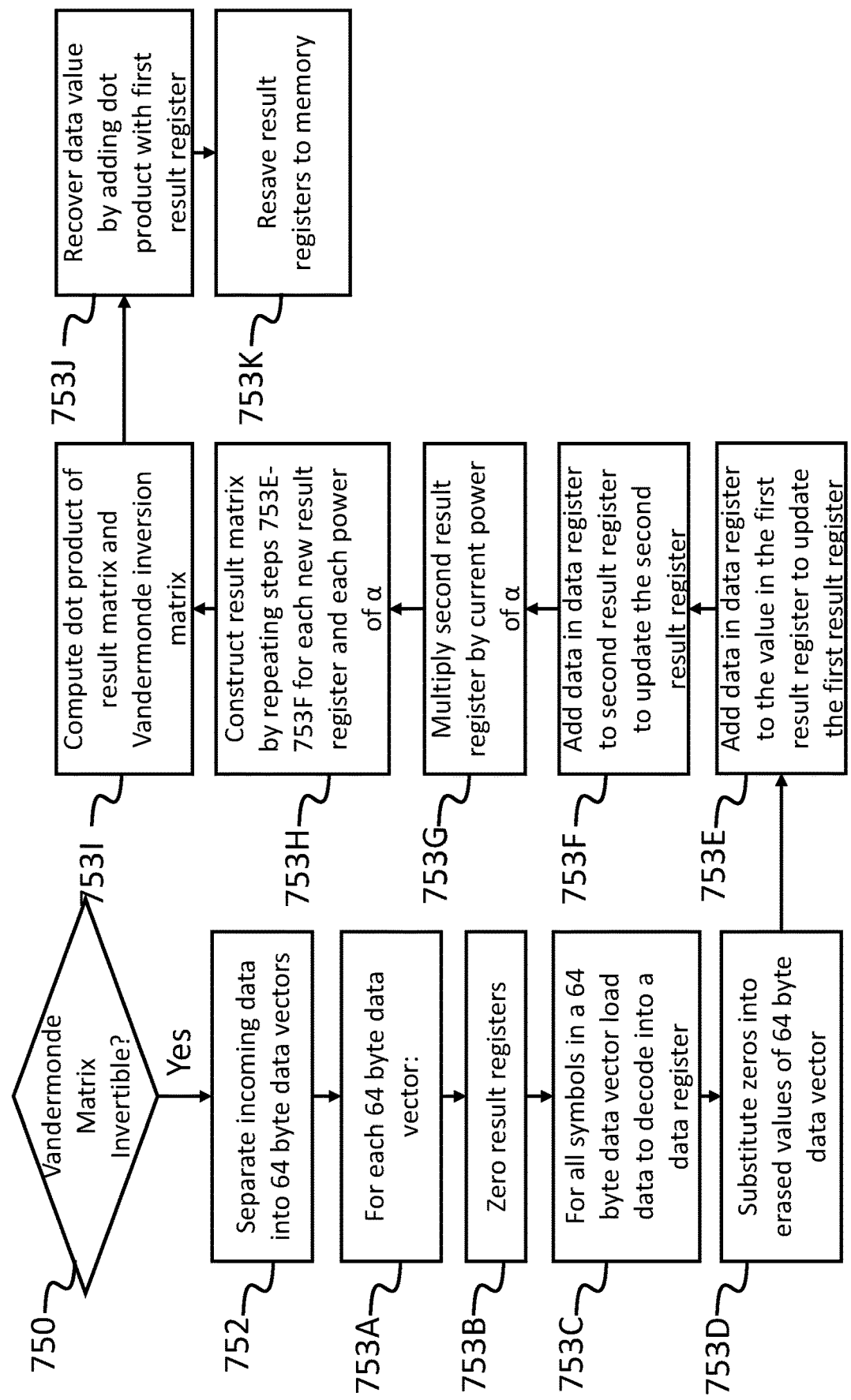
FIG. 7B is a flowchart of a method for decoding a message using a Vandermonde matrix according to one embodiment of the present disclosure.

FIG. 7B is a flowchart of a method for decoding a message using a Vandermonde matrix according to one embodiment of the present disclosure.

After determining that the Vandermonde Matrix is invertible at operation 750, at operation 752, the processor separates the incoming data into separate 64 byte vectors and, at operation 753A, iterates through each 64 byte vector.

At operation 753B, the processor zeroes the result a first result register and a second result register that store the result of the process, and at operation 753C, the processor loads the data to decode (the symbols if the current 64 byte data vector) into a data register. At operation 753D, the processor substitutes zeroes into the erased values of the 64 byte data vector.

At operation 753E, the processor adds the data in the data register with the value in the first result register and saves the sum to the first result register to update the value of the first result register. Likewise, at operation 753F, the processor adds the data in the data register with the value in the second result register and saves the sum to the second result register to update the value of the second result register. At operation 753G, the processor multiplies the value of the second result register by a current power of $\alpha$. At operation 753H, the processor loops back to repeat operations 753E through 753F for each corresponding power of $\alpha$ of the decoding table to construct a result matrix.

At operation 753I, the processor recovers the data value by computing a dot product of the result matrix and a Vandermonde inversion matrix. At operation 753J, the processor recovers the erased data value by adding the dot product computed at operation 753I with the first result register, then result to memory (e.g. main memory) at operation 753K.

Referring back to FIG. 7A, if the Vandermonde matrix is not invertible, then in operation 760 the processor determines if the number of check symbols in the received codeword (T) is among a set of common number of check symbols. In the particular example shown in FIG. 7A, these are for the cases of 4, 8, 16, or 32 check symbols, although embodiments of the present disclosure are not limited thereto and specialized decoders may be implemented for different values of T that may be sufficiently frequently encountered where a specialized decoder may be implemented for these cases. If the number of check symbols is not among the common numbers of check symbols, then a generic decoder, referred to as "DecG" is applied to decode the codeword.

Figure 7C:
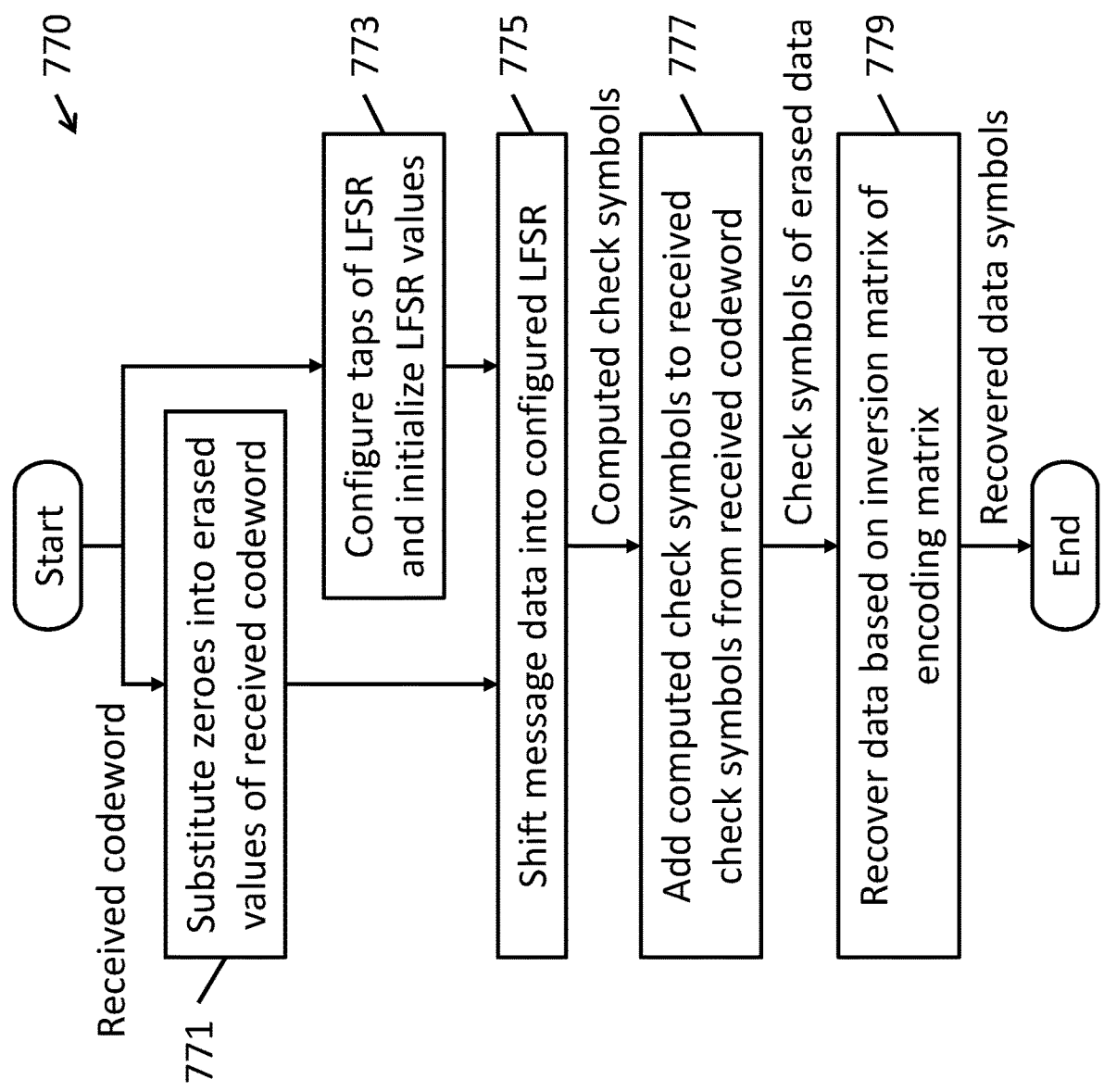
FIG. 7C is a flowchart of a method for decoding a message using an inversion matrix according to one embodiment of the present disclosure.

FIG. 7C is a flowchart of a method 770 for decoding a message using an inversion matrix according to one embodiment of the present disclosure. A general-purpose decoder as described herein with respect to FIG. 7C will decode correctly even if the erasure is in the check symbols. Note that this approach is only needed in cases where the data was originally encoded using a Vandermonde matrix. In addition, this approach incurs a slightly higher computational expense. In particular, regenerating the check symbols from only the data symbol requires fewer operations than regenerating the check symbols from ALL of the symbols. Therefore, from an efficiency point of view, if the erasure does not involve the check symbols, and the check symbols were encoded with Vandermonde, then there are fewer total operations than a general purpose polynomial encoder/Vandermonde decoder. However, using Vandermonde to encode results in the problems described above, such that if particular check symbols are missing, it is impossible to produce the correct symbols to invert the matrix, in which case this, more computationally expensive approach, is needed.

Referring to FIC. 7C, at operation 771, the processor begins with a received codeword includes one or more erased values at known locations, where the processor substitutes zeroes (e.g., 0x00 values) at the locations of the erased values. At operation 773, the processor configures the taps of an LFSR and initializes the values (state) of the LFSR accordingly. The taps are determined based on the coefficients of the generator polynomial that was used to encode the received codeword, where the coefficients may be computed using the method described above, for example, with respect to FIG. 3C and FIG. 3D.

At operation 775, the processor shifts the K symbols of data portion of the message (with zeroes substituted into the erased positions) into the configured LFSR one symbol at a time, where each symbol causes the state of the LFSR (the values stored in the stages of the LFSR) to be updated. The final state of the LFSR after shifting in all of the symbols are the T computed check symbols of the K data symbols of the message.

At operation 777, the processor adds the T computed check symbols to the T received check symbols from the received codeword to compute the check of the erased data.

At operation 779, the processor recovers the erased data symbols by computing a dot product of the check symbols of the erased data and the inversion matrix, where the inversion matrix may be computed by inverting the encoding matrix.

While the method of decoding using an LFSR is described above in the context of a decoding a single message, embodiments of the present disclosure are not limited thereto and, in some techniques, the process is implemented using a parallel LFSR, such as that shown in FIG. 3F, where multiple messages are decoded in parallel using a SIMD processor. For example, multiple messages, based on the length of the vector registers of the SIMD can be decoded in parallel using SIMD operations.

Some aspects of embodiments of the present disclosure relate to the combination of a parallel LFSR sequencer and a parallel syndrome decoder. As discussed above, a parallel LFSR sequencer according to some embodiments of the present disclosure performs the encoding of data (e.g., the generation of check symbols) from input data without needing to repeatedly fetch an encoding matrix into the registers of the processor because, for example, the encoding matrix is represented through repeated GF multiplication by a generator value, as may be implemented through the use of the LFSR. In addition, as discussed above, a parallel syndrome decoder or parallel Horner decoder according to some embodiments of the present disclosure similarly does not need to repeatedly fetch a solution matrix into the registers of the processor because the matrix is represented through repeated GF multiplication of a generator value. As such, embodiments of the present disclosure enable efficient encoding and decoding of data using a processor in a manner that reliably protects encoded data against unknown errors and allows recovery of erased data.

Further embodiments of the present invention are directed towards sequencing this parallel multiplication (and other GF) operations. While the Parallel Lookup Multiplier processes a GF multiplication of 64 bytes of contiguous data times a specified factor, the calls to the Parallel Lookup Multiplier should be appropriately sequenced to provide efficient processing. One such sequencer (Sequencer 1), for example, can generate the check data J from the original data D, and is described further with respect to FIG. 7D.

The M check drives can invoke the Parallel Lookup Multiplier on each 64-byte chunk, using the appropriate factor for the particular combination of data drive and check drive. One consideration is how to handle the data access. Two possible ways are:

1) "column-by-column," i.e., 64 bytes for one data drive, followed by the next 64 bytes for that data drive, etc., and adding the products to the running total in memory (using the Parallel Adder) before moving onto the next row (data drive); and 2) "row-by-row," i.e., 64 bytes for one data drive, followed by the corresponding 64 bytes for the next data drive, etc., and keeping a running total using the Parallel Adder, then moving onto the next set of 64-byte chunks.

Column-by-column can be thought of as "constant factor, varying data," in that the (GF multiplication) factor usually remains the same between iterations while the (64-byte) data changes with each iteration. Conversely, row-by-row can be thought of as "constant data, varying factor," in that the data usually remains the same between iterations while the factor changes with each iteration.

Another consideration is how to handle the check drives. Two possible ways are:

a) one at a time, i.e., generate all the check data for one check drive before moving onto the next check drive; and b) all at once, i.e., for each 64-byte chunk of original data, do all of the processing for each of the check drives before moving onto the next chunk of original data.

While each of these techniques performs the same basic operations (e.g., 40 instructions for every 64 bytes of data for each of the N data drives and M check drives, or 5N(M−1)/8 instructions per byte for the Parallel Lookup Multiplier), empirical results show that combination (2)(b), that is, row-by-row data access on all of the check drives between data accesses performs best with the Parallel Lookup Multiplier. One reason may be that such an approach appears to minimize the number of memory accesses (namely, one) to each chunk of the original data D to generate the check data J. This embodiment of Sequencer 1 is described in more detail with reference to FIG. 4.

FIG. 7D shows an exemplary method 780 for sequencing the Parallel Lookup Multiplier to perform the check data generation according to an embodiment of the present invention.

Referring to FIG. 7D, in step 781, the Sequencer 1 is called. Sequencer 1 is called to process multiple 64-byte chunks of data for each of the blocks across a stripe of data. For instance, Sequencer 1 could be called to process 512 bytes from each block. If, for example, the block size L is 4096 bytes, then it would take eight such calls to Sequencer 1 to process the entire stripe. The other such seven calls to Sequencer 1 could be to different processing cores, for instance, to carry out the check data generation in parallel. The number of 64-byte chunks to process at a time could depend on factors such as cache dimensions, input/output data structure sizes, etc.

In step 782, the outer loop processes the next 64-byte chunk of data for each of the drives. In order to minimize the number of accesses of each data drive's 64-byte chunk of data from memory, the data is loaded only once and preserved across calls to the Parallel Lookup Multiplier. The first data drive is handled specially since the check data has to be initialized for each check drive. Using the first data drive to initialize the check data saves doing the initialization as a separate step followed by updating it with the first data drive's data.

In step 783, the first middle loop is called, in which each of the check drives have their check data initialized by the first data drive's data. In this case, there is a corresponding factor (that varies with each check drive) that needs to be multiplied with each of the first data drive's data bytes. This is handled by calling the Parallel Lookup Multiplier for each check drive.

In step 784, the second middle loop is called, which processes the other data drives' corresponding 64-byte chunks of data. As with the first data drive, each of the other data drives is processed separately, loading the respective 64 bytes of data into four registers (preserved across calls to the Parallel Lookup Multiplier).

In step 785, the inner loop is called for the next data drive. In the inner loop (as with the first middle loop), each of the check drives is associated with a corresponding factor for the particular data drive. The factor is multiplied with each of the next data drive's data bytes using the Parallel Lookup Multiplier, and the results added to the check drive's check data.

Another such sequencer (Sequencer 2) can be used to reconstruct the lost data from the surviving data (using Algorithm 2). While the same column-by-column and row-by-row data access approaches are possible, as well as the same choices for handling the check drives, Algorithm 2 adds another dimension of complexity because of the four separate steps and whether to: (i) do the steps completely serially or (ii) do some of the steps concurrently on the same data. For example, step 1 (surviving check data generation) and step 4 (lost check data regeneration) can be done concurrently on the same data to reduce or minimize the number of surviving original data accesses from memory.

Empirical results show that method (2)(b)(ii), that is, row-by-row data access on all of the check drives and for both surviving check data generation and lost check data regeneration between data accesses performs best with the Parallel Lookup Multiplier when reconstructing lost data using Algorithm 2. Again, this may be due to the apparent minimization of the number of memory accesses (namely, one) of each chunk of surviving original data X to reconstruct the lost data and the absence of memory accesses of reconstructed lost original data Y when regenerating the lost check data. This embodiment of Sequencer 1 is described in more detail with reference to FIGS. 7E-7G.

Figure 7E:
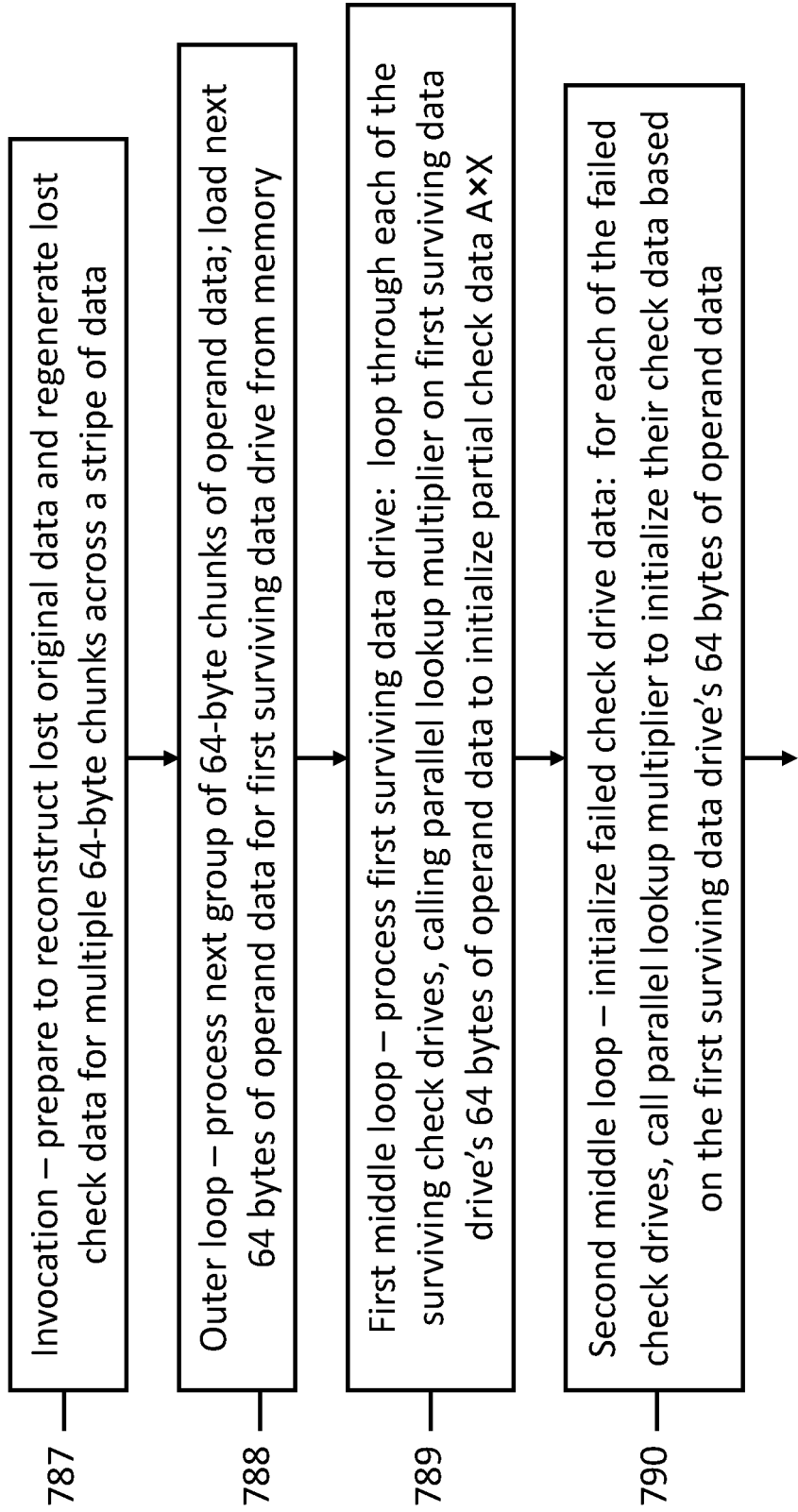
Figure 7F:
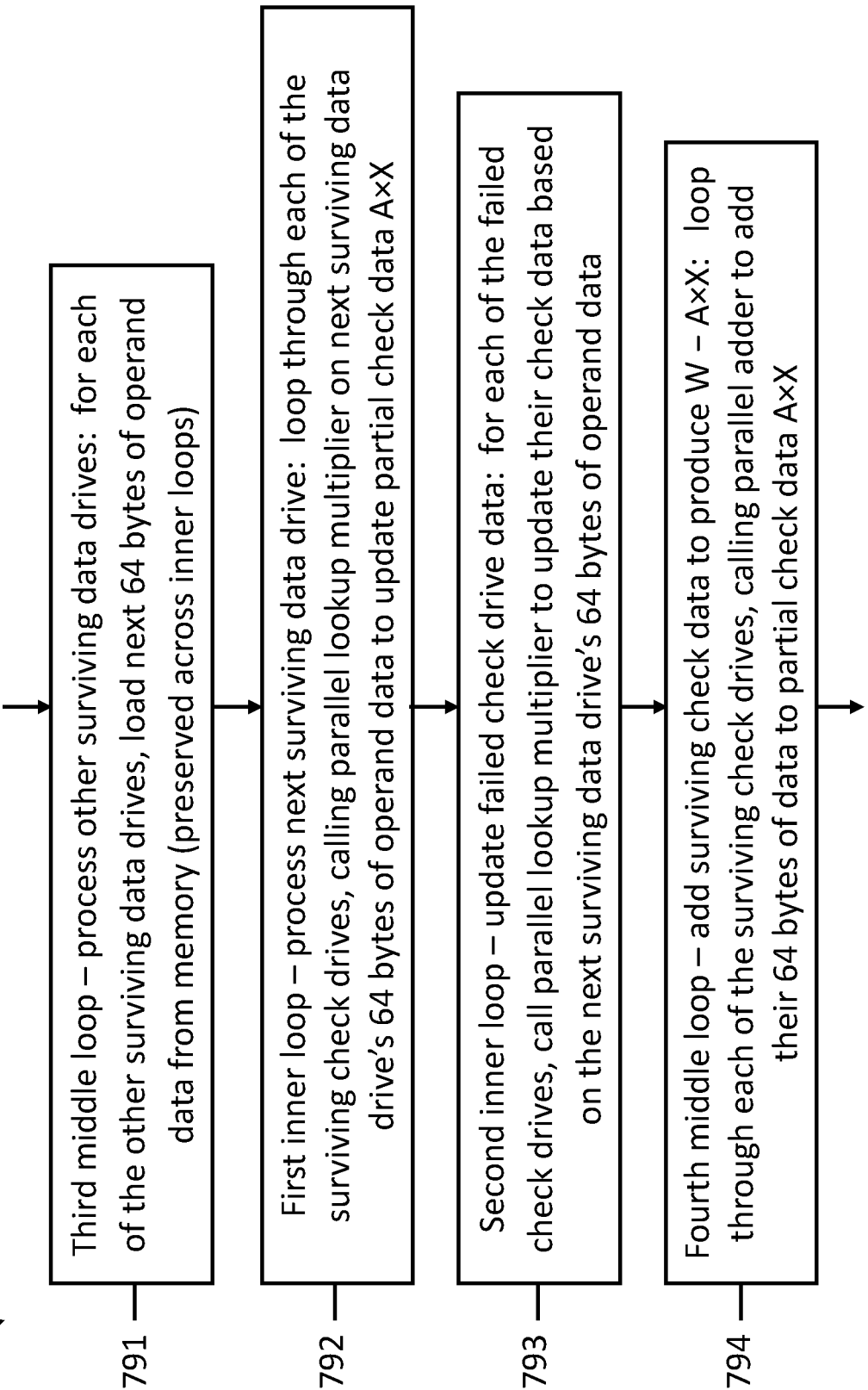

FIGS. 7E-7G show an exemplary method 786 for sequencing the Parallel Lookup Multiplier to perform the lost data reconstruction according to an embodiment of the present invention.

Referring to FIG. 7E, in step 787, the Sequencer 2 is called. Sequencer 2 has many similarities with the embodiment of Sequencer 1 illustrated in FIG. 4. For instance, Sequencer 2 processes the data drive data in 64-byte chunks like Sequencer 1. Sequencer 2 is more complex, however, in that only some of the data drive data is surviving; the rest has to be reconstructed. In addition, lost check data needs to be regenerated. Like Sequencer 1, Sequencer 2 does these operations in such a way as to minimize memory accesses of the data drive data (by loading the data once and calling the Parallel Lookup Multiplier multiple times). Assume for ease of description that there is at least one surviving data drive; the case of no surviving data drives is handled a little differently, but not significantly different. In addition, recall from above that the driving formula behind data reconstruction is $Y=B^{-1} \times (W-A \times X)$, where Y is the lost original data, $B^{-1}$ is the solution matrix, W is the surviving check data, A is the partial check data encoding matrix (for the surviving check drives and the surviving data drives), and X is the surviving original data.

In step 788, the outer loop processes the next 64-byte chunk of data for each of the drives. Like Sequencer 1, the first surviving data drive is again handled specially since the partial check data A×X has to be initialized for each surviving check drive.

In step 789, the first middle loop is called, in which the partial check data A×X is initialized for each surviving check drive based on the first surviving data drive's 64 bytes of data. In this case, the Parallel Lookup Multiplier is called for each surviving check drive with the corresponding factor (from A) for the first surviving data drive.

In step 790, the second middle loop is called, in which the lost check data is initialized for each failed check drive. Using the same 64 bytes of the first surviving data drive (preserved across the calls to Parallel Lookup Multiplier in step 789), the Parallel Lookup Multiplier is again called, this time to initialize each of the failed check drive's check data to the corresponding component from the first surviving data drive. This completes the computations involving the first surviving data drive's 64 bytes of data, which were fetched with one access from main memory and preserved in the same four registers across steps 789 and 790.

Continuing with FIG. 7F, in step 791, the third middle loop is called, which processes the other surviving data drives' corresponding 64-byte chunks of data. As with the first surviving data drive, each of the other surviving data drives is processed separately, loading the respective 64 bytes of data into four registers (preserved across calls to the Parallel Lookup Multiplier).

In step 792, the first inner loop is called, in which the partial check data A×X is updated for each surviving check drive based on the next surviving data drive's 64 bytes of data. In this case, the Parallel Lookup Multiplier is called for each surviving check drive with the corresponding factor (from A) for the next surviving data drive.

In step 793, the second inner loop is called, in which the lost check data is updated for each failed check drive. Using the same 64 bytes of the next surviving data drive (preserved across the calls to Parallel Lookup Multiplier in step 792), the Parallel Lookup Multiplier is again called, this time to update each of the failed check drive's check data by the corresponding component from the next surviving data drive. This completes the computations involving the next surviving data drive's 64 bytes of data, which were fetched with one access from main memory and preserved in the same four registers across steps 792 and 793.

Next, in step 794, the computation of the partial check data A×X is complete, so the surviving check data W is added to this result (recall that W−A×X is equivalent to W+A×X in binary Galois Field arithmetic). This is done by the fourth middle loop, which for each surviving check drive adds the corresponding 64-byte component of surviving check data W to the (surviving) partial check data A×X (using the Parallel Adder) to produce the (lost) partial check data W−A×X.

Continuing with FIG. 7, in step 795, the fifth middle loop is called, which performs the two dimensional matrix multiplication $B^{-1} \times (W-A \times X)$ to produce the lost original data Y. The calculation is performed one row at a time, for a total of F rows, initializing the row to the first term of the corresponding linear combination of the solution matrix $B^{-1}$ and the lost partial check data W−A×X (using the Parallel Lookup Multiplier).

In step 796, the third inner loop is called, which completes the remaining F−1 terms of the corresponding linear combination (using the Parallel Lookup Multiplier on each term) from the fifth middle loop in step 690 and updates the running calculation (using the Parallel Adder) of the next row of $B^{-1} \times (W-A \times X)$. This completes the next row (and reconstructs the corresponding failed data drive's lost data) of lost original data Y, which can then be stored at an appropriate location.

In step 797, the fourth inner loop is called, in which the lost check data is updated for each failed check drive by the newly reconstructed lost data for the next failed data drive. Using the same 64 bytes of the next reconstructed lost data (preserved across calls to the Parallel Lookup Multiplier), the Parallel Lookup Multiplier is called to update each of the failed check drives' check data by the corresponding component from the next failed data drive. This completes the computations involving the next failed data drive's 64 bytes of reconstructed data, which were performed as soon as the data was reconstructed and without being stored and retrieved from main memory.

Finally, in step 798, the sixth middle loop is called. The lost check data has been regenerated, so in this step, the newly regenerated check data is stored at an appropriate location (if desired).

Aspects of the present invention can be also realized in other environments, such as two-byte quantities, each such two-byte quantity capable of taking on $2^{16}=65,536$ possible values, by using similar constructs (scaled accordingly) to those presented here. Such extensions would be readily apparent to one of ordinary skill in the art, so their details will be omitted for brevity of description.

Exemplary techniques and methods for doing the Galois field manipulation and other mathematics behind RAID error correcting codes are described in Appendix A, which contains a paper "Information Dispersal Matrices for RAID Error Correcting Codes" prepared for the present application.

Figure 8:
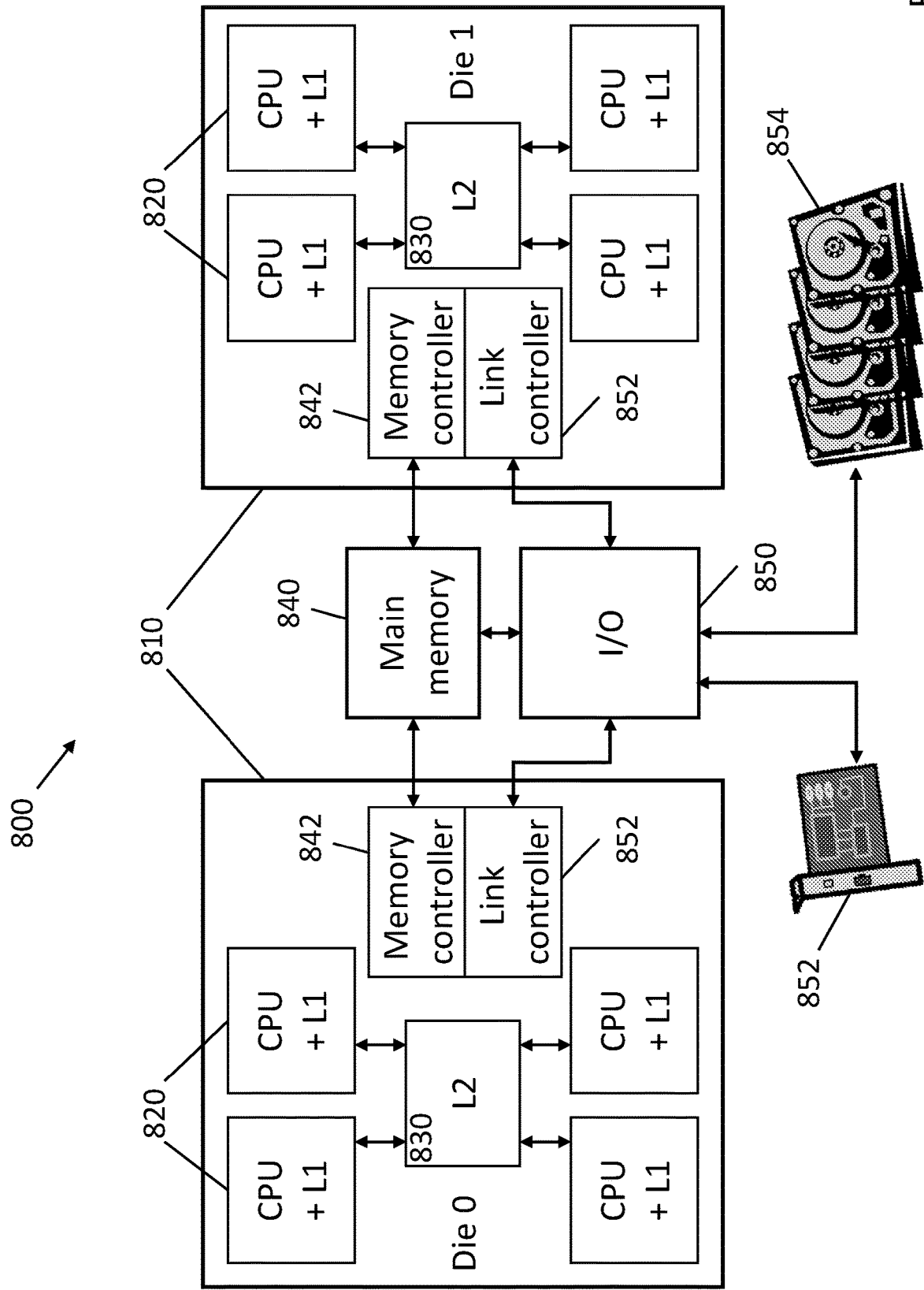
FIG. 8 illustrates a multi-core architecture system according to an embodiment of the present invention.

FIG. 8 illustrates a multi-core architecture system 800 having two processor dies 810 (namely, Die 0 and Die 1), although embodiments of the present disclosure are not limited thereto and may include more than two processor dies 810.

Referring to FIG. 8, each die 810 includes four central processing units (CPUs or cores) 820 each having a local level 1 (L1) cache. While FIG. 8 shows embodiments where each die 810 includes four cores, embodiments of the present disclosure are not limited thereto, and each die 810 may include two or more cores. In addition, in some embodiments, each die 810 includes only a single core and, in some cases, the processor includes only a single core. The multiple cores within each die 810 may have the same architecture (a homogeneous computing architecture) or different architectures (a heterogeneous computing architecture), such as where some cores are designed for low power and exhibit low performance while other cores are designed for high performance and exhibit high power consumption. Each core 820 may have separate functional units, for example, an x86 execution unit (for traditional instructions or scalar instructions) and a vector execution unit (for software designed for vector instruction sets such as SSE or AVX). An example application of these function units is that the x86 execution unit can be used for the RAID control logic software while the SSE execution unit can be used for the GF operation software. Each die 810 also has a level 2 (L2) cache/memory bus interface 830 shared between the four cores 820. Main memory 840, in turn, is shared between the multiple dies (e.g., two dies) 810, which access the main memory 840 through corresponding memory controllers 842, which may be integrated into the dies 810 or separate from the dies 810. The dies 810 and the main memory 840 are connected to the input/output (I/O) controllers 850 that access external devices such as network interfaces 852 and data storage drives 854 (e.g., disk drives) or other non-volatile storage devices via interfaces such as Peripheral Component Interconnect (PCI). Main memory 840 includes, for example, the memory between the last-level cache of a processor and non-volatile storage medium (e.g., HDD, etc.).

As one example, the system 800 may receive data via network interface 852 (e.g., over a computer network such as a local are network and/or the internet), which passes through I/O controller 850 and may be stored in main memory 840 (e.g., either after passing through one or more processor dies 810 or being written directly to main memory 840 using direct memory access or DMA). The received data may then be processed (e.g., analyzed, modified, tagged, etc.) based on operations performed by the processor dies 810. The received data and/or a processed version thereof is then encoded and written to the data storage drives 854 in accordance with embodiments of the present disclosure as implemented by the one or more processor dies 810. Similarly, data may be read from the data storage drives 854, stored into main memory 840, and possibly processed by the processor dies 810 in accordance with various program instructions specific to an application, and transmitted to other computing devices via the network interface 852. In the event of data loss or the failure of one or more data storage drives 854, the lost data may be recovered using decoding techniques implemented by the instructions controlling the one or more processor dies 810 as described herein according to various embodiments of the present disclosure.

Redundant array of independent disks (RAID) controller processing can be described as a series of states or functions. These states may include: (1) Command Processing, to validate and schedule a host request (for example, to load or store data from disk storage); (2) Command Translation and Submission, to translate the host request into multiple disk requests and to pass the requests to the physical disks; (3) Error Correction, to generate check data and reconstruct lost data when some disks are not functioning correctly; and (4) Request Completion, to move data from internal buffers to requestor buffers. Note that the final state, Request Completion, may only be needed for a RAID controller that supports caching, and can be avoided in a cacheless design.

Parallelism is achieved in the embodiment of FIG. 8 by assigning different cores 820 to different tasks. For example, some of the cores 820 can be "command cores," that is, assigned to the I/O operations, which includes reading and storing the data and check bytes to and from memory 840 and the disk drives via the I/O interface 850. Others of the cores 820 can be "data cores," and assigned to the GF operations, that is, generating the check data from the original data, reconstructing the lost data from the surviving data, etc., including the Parallel Lookup Multiplier and the sequencers described above. For example, in exemplary embodiments, a scheduler can be used to divide the original data D into corresponding portions of each block, which can then be processed independently by different cores 820 for applications such as check data generation and lost data reconstruction.

One of the benefits of this data core/command core subdivision of processing is ensuring that different code will be executed in different cores 820 (that is, command code in command cores, and data code in data cores). Some empirical results show that the dies 810 perform best when only one core 820 on each die 810 does the GF operations (i.e., Sequencer 1 or Sequencer 2, with corresponding calls to Parallel Lookup Multiplier) and the other cores 820 do the I/O operations. This helps localize the Parallel Lookup Multiplier code and associated data to a single core 820 and not compete with other cores 820, while allowing the other cores 820 to keep the data moving between memory 840 and the disk drives via the I/O interface 850.

Embodiments of the present invention yield scalable, high performance RAID systems capable of outperforming other systems, and at much lower cost, due to the use of high volume commodity components that are leveraged to achieve the result. This combination can be achieved by utilizing the mathematical techniques and code optimizations described elsewhere in this application with careful placement of the resulting code on specific processing cores. Embodiments can also be implemented on fewer resources, such as single-core dies and/or single-die systems, with decreased parallelism and performance optimization.

The process of subdividing and assigning individual cores 820 and/or dies 810 to inherently parallelizable tasks will result in a performance benefit. For example, on a Linux system, software may be organized into "threads," and threads may be assigned to specific CPUs and memory systems via the kthread_bind function when the thread is created.

A thread is a set of instructions and their associated data values. For example, in the Linux kernel, a thread is represented as a data structure stored in the main memory, where the data structure stores information including program instructions, a pointer to a location in memory representing the stack (e.g., storing data associated with the thread). These instructions and data values may be present in physical processor registers of a core 820 or may be moved to or from main memory to physical registers, as performed by a scheduler, which controls the execution of the thread (e.g., when each thread is executed and which core executes the thread, in the case of a multi-core system, where a core executes a thread by performing the instructions of the thread and updating of data associated with the thread based on the instructions).

Different threads can be executed concurrently by the same processor core and/or in parallel across multiple processor cores on a same die or spread across multiple dies, as managed by the scheduler. In addition, some processor cores support simultaneous multithreading (SMT) (e.g., referred to as Hyper-Threading Technology in Intel® processors), where one such physical core appears as multiple virtual cores that perform operations in parallel. Furthermore, threads enable multiple cores to perform operations concurrently, such as where one thread may execute on a core while another thread is blocked (e.g., while waiting for data to be loaded via the I/O controller).

Accordingly, an application program, such as a data encoding system, can create multiple threads to spread computational work across those multiple threads, which are assigned to different cores (and/or virtual cores in the case of cores supporting SMT) by a scheduler to make use of a larger portion of the parallel and concurrent processing capabilities of computer systems, where the scheduler may maintain a table of the associations between threads and assigned cores. Creating separate threads to process the GF arithmetic allows parallel computations to take place, which multiplies the performance of the system. For example, in some embodiments, encoding processes and/or decoding processes, as described above, may be operated in a pipelined manner, where the output of an earlier stage in a processing pipeline is supplied to a next stage in the processing pipeline. For example, referring to FIG. 6, supplying the received symbols of the input message (with the errors set to 0) to a sequencer (e.g., an LFSR or a Horner sequencer) can be used to generate a first set of results (e.g., check symbols) in one stage of the pipeline (e.g., corresponding to operation 603) and the results from the sequencer may be supplied to another stage of the processing pipeline (e.g., to add the computed check symbols to the received parity symbols) and that output (e.g., the check symbols of the erased data) can be supplied to yet another stage of the pipeline (e.g., to compute the dot product of the check symbols with a solution matrix, which may include performing parallel multiplication using a parallel multiplier according to embodiments of the present disclosure. Because the different stages of the pipeline can be performed independently (e.g., there is no need to return to the previous stage of the pipeline), different stages of the pipeline can be performed by different threads (e.g., each thread having a set of instructions corresponding to its stage of the pipeline). Furthermore, as discussed above, in some embodiments the scheduler distributes these threads among multiple different processing cores such that the different stages of the pipeline are performed concurrently or simultaneously, such as where one thread executing one stage of the pipeline computes check symbols for a first set of data while (e.g., concurrently with or simultaneously with) another thread executing another stage of the pipeline computes recovered symbols for a second set of data by computing a dot product of check symbols with a corresponding solution matrix.

Further, creating multiple threads for command processing allows for fully overlapped execution of the command processing states. One way to accomplish this is to number each command, then use the arithmetic MOD function (% in C language) to choose a separate thread for each command. Another technique is to subdivide the data processing portion of each command into multiple components, and assign each component to a separate thread.

Figure 9:
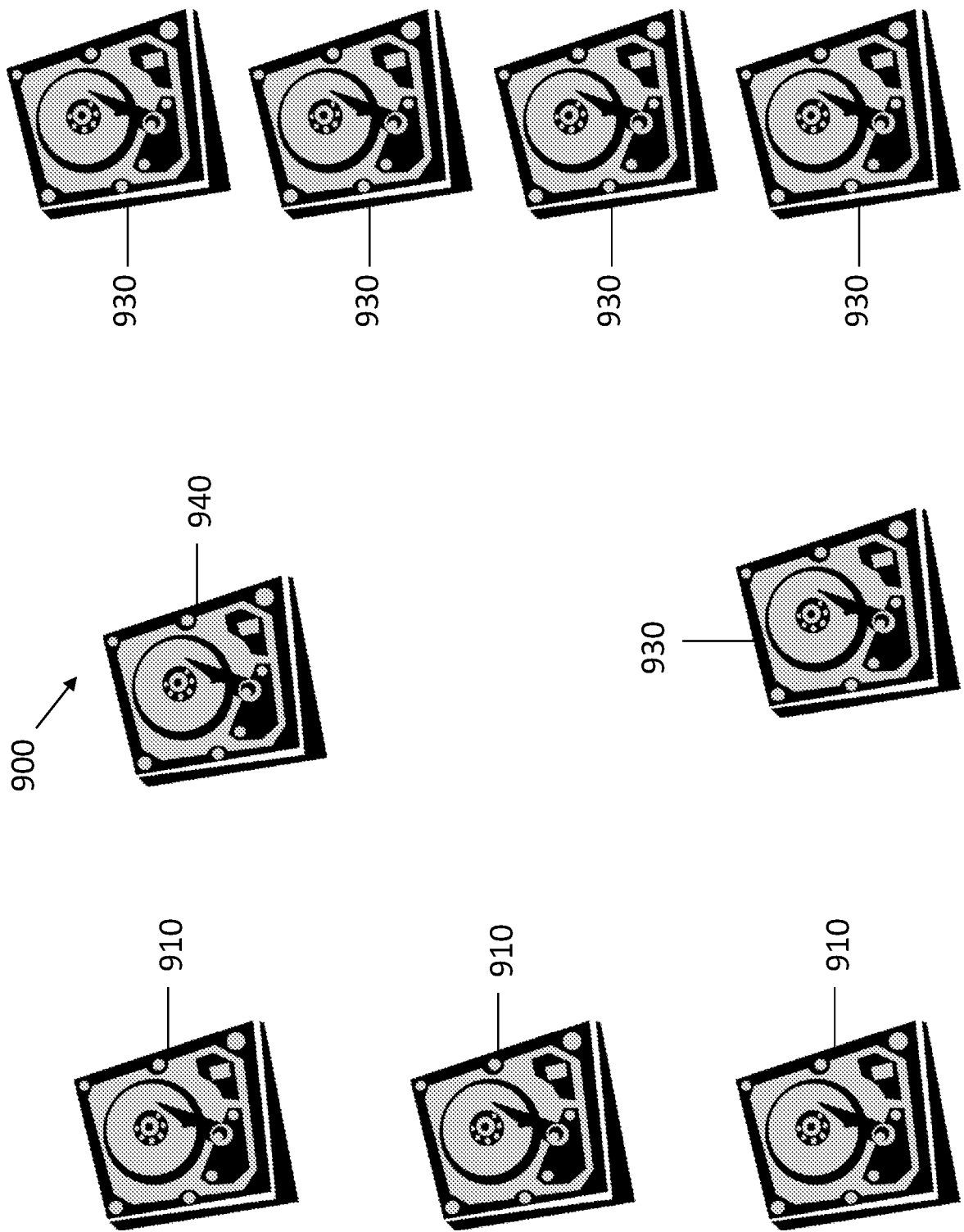
FIG. 9 shows an exemplary disk drive configuration according to an embodiment of the present invention.

FIG. 9 shows an exemplary disk drive configuration 900 according to an embodiment of the present invention.

Referring to FIG. 9, nine disks are shown, though this number can vary in other embodiments. The disks are divided into four types: data drives 910, check drives 930, and system drives 940. The eight disks break down as three data drives 910, fivecheck drives 930, and one system drive 940 in the embodiment of FIG. 9.

Each of the data drives 910 is used to hold a portion of data. The data is distributed uniformly across the data drives 910 in stripes, such as 192 KB stripes. For example, the data for an application can be broken up into stripes of 192 KB, and each of the stripes in turn broken up into three 64 KB blocks, each of the three blocks being written to a different one of the three data drives 910.

Each of the check drives 930 stores the check symbols computed in accordance with embodiments of the present disclosure. For example, in some embodiments, the T check symbols associated with a given input message are distributed across the T check drives.

With the addition of the check drives 930, eight drives are used in the example RAID system 900 of FIG. 9. Such a system 900 is capable of recovering all of the original data provided any three of these eight drives survive. That is, the system 900 can withstand a concurrent failure of up to any five drives and still preserve all of the original data.

The system drive 940 (or system drives) is a non-volatile computer readable medium that stores program instructions that, when executed by a processor, implements embodiments of the present invention as described above. These program instructions may include SIMD instructions that control a SIMD CPU code of the processor to perform SIMD (or vector) operations on input arguments to implement, for example, a parallel multiplier, a parallel lookup multiplier, a parallel LFSR as discussed above. In various embodiments, the system drive 940 is connected to the processor via a local bus such as PCIe (e.g., over a PCI Express slot, SATA Express, or Thunderbolt), NVMe (Non-Volatile Memory Express), serial ATA (SATA), universal serial bus (USB), serial attached SCSI (SAS), and the like. In some embodiments, the system drive 940 is connected to the processor remotely or via a computer network such as Ethernet and using a computer network protocol such as Transmission Control Protocol/Internet Protocol (TCP/IP), where the system drive 940 may be network attached storage or other network accessible data. As some further examples, in various embodiments the system drive 940 stores computer instructions in a format suitable for supporting network boot of a client computer system, in a format suitable for booting of a virtual machine (e.g., as a virtual disk image) managed by a hypervisor, in a format for starting a user space isolated instance or container (e.g., as a container image), or the like.

Figure 10A:
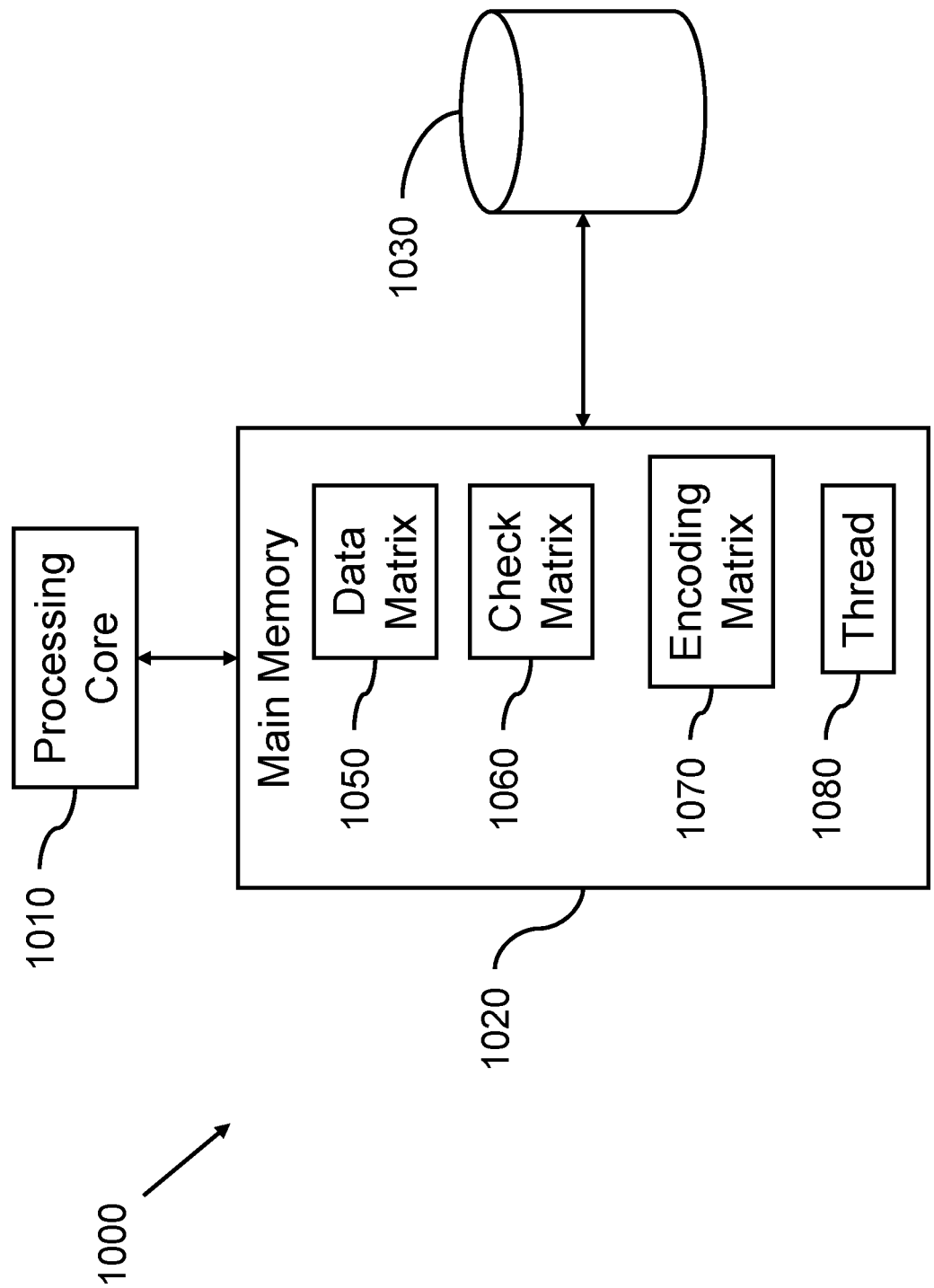
FIG. 10A illustrates an exemplary system for implementing software error-correcting code (ECC) protection or compression of original data using ECC according to an embodiment of the present invention.

FIG. 10A illustrates an exemplary system 1000 for implementing software error-correcting code (ECC) protection or compression of original data using ECC data according to an embodiment of the present invention.

The system 1000 (for example, a computer or computing system) includes a computer processing core 1010 (which can include a multi-core processor) for executing computer instructions and accessing data from a main memory 1020 (such as a random access memory), and a non-volatile storage medium 1030 (such as a disk drive) for storing the computer instructions. The processing core 1010, the storage medium 1030, and the computer instructions are configured to implement the software ECC protection or compression of the original data using the ECC data.

The software ECC protection or compression includes a data matrix 1050 for holding the original data in the main memory 1020, a check matrix 1060 for holding the ECC data in the first memory, and an encoding matrix 1070 for holding Galois Field multiplication factors in the main memory 1020. The multiplication factors are for encoding the original data into the ECC data (an example embodiment of which is described in detail in the Benefit application and included above). The software ECC protection or compression also includes a thread 1080 for executing on the processing core 1010. The thread 1080 includes a Galois Field multiplier for multiplying entries of the data matrix 1050 by an entry of the encoding matrix 1070, and a sequencer for ordering operations through the data matrix 1050 and the encoding matrix 1070 using the Galois Field multiplier to generate the ECC data (further details of which are provided in the Benefit application and included above).

The Galois Field multiplier may be a parallel multiplier for concurrently multiplying the entries of the data matrix 1050 by the entry of the encoding matrix 1070 (as described further in the Benefit application and included above). The thread 1080 may also include a plurality of threads for executing on a multi-core processing unit. To this end, the software ECC protection or compression may further include a scheduler for generating the ECC data by dividing the data matrix 1050 into a plurality of data matrices, dividing the check matrix 1060 into a plurality of check matrices, assigning corresponding ones of the data matrices and the check matrices to the threads, and assigning the threads to the processing cores to concurrently generate portions of the ECC data corresponding to the check matrices from respective ones of the data matrices. Further details of the scheduler can be found in the Benefit application that has been included above.

Figure 10B:
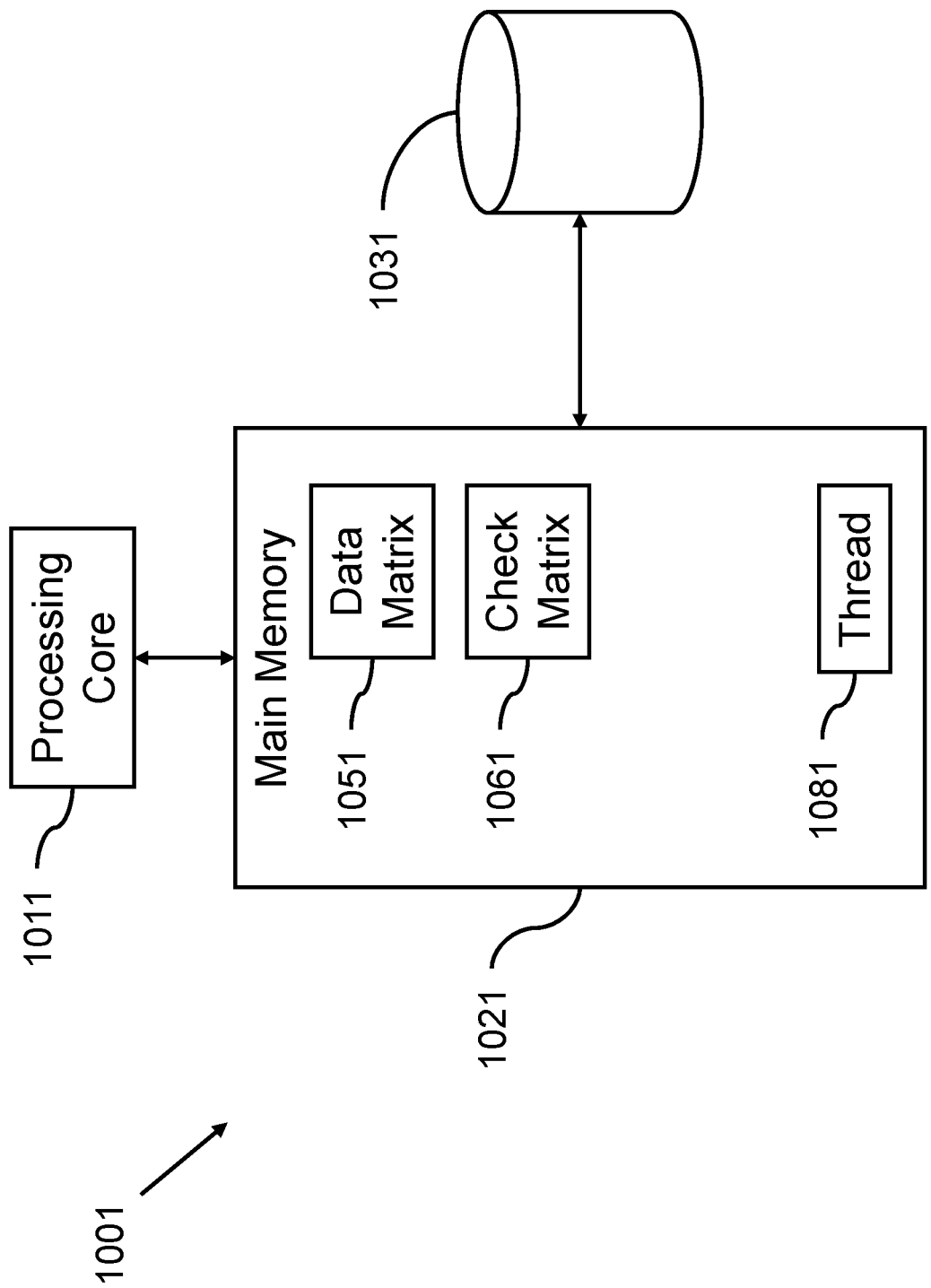
FIG. 10B illustrates an exemplary system for implementing software error-correcting code (ECC) protection or compression of original data using ECC data according to an embodiment of the present invention.

FIG. 10B illustrates an exemplary system 1001 for implementing software error-correcting code (ECC) protection or compression of original data using ECC data according to an embodiment of the present invention.

The system 1001 (for example, a computer or computing system) includes a computer processing core 1011 (which can include a multi-core processor) for executing computer instructions and accessing data from a main memory 1021 (such as a random access memory), and a non-volatile storage medium 1031 (such as a disk drive) for storing the computer instructions. The processing core 1011, the storage medium 1031, and the computer instructions are configured to implement the software ECC protection or compression of the original data using the ECC data.

The software ECC protection or compression includes a data matrix 1051 for holding the original data in the main memory 1021, a check matrix 1061 for holding the ECC data in the first memory. In contrast to the embodiment shown in FIG. 10A, the main memory does not store an encoding matrix for holding Galois Field multiplication factors in the main memory 1020. Instead, in embodiments using the exemplary system shown in FIG. 10B, the main memory 1021 stores instructions that implement and configure a linear feedback shift register (LFSR) or a method based on Horner's technique to perform the encoding of the data values stored in the data matrix 1051 to compute the values of the check matrix 1061. The LFSR, the technique based on Horner's technique, and the constants for encoding the original data into the ECC data are described above and may be stored in the vector registers. The software ECC protection or compression also includes a thread 1081 for executing on the processing core 1011. The thread 1081 includes a Galois Field multiplier for multiplying entries of the data matrix 1051 by the coefficients of the taps of the LFSR (or coefficients for applying Horner's technique), and a sequencer for ordering operations through the data matrix 1051 and the LFSR (or through Horner's technique) using the Galois Field multiplier to generate the ECC data (further details of which are provided in the Benefit application and included above).

The Galois Field multiplier may be a parallel multiplier for concurrently multiplying the entries of the data matrix 1051 by the coefficients of the LFSR (as described further above). The thread 1081 may also include a plurality of threads for executing on a multi-core processing unit. To this end, the software ECC protection or compression may further include a scheduler for generating the ECC data by dividing the data matrix 1051 into a plurality of data matrices, dividing the check matrix 1061 into a plurality of check matrices, assigning corresponding ones of the data matrices and the check matrices to the threads, and assigning the threads to the processing cores to concurrently generate portions of the ECC data corresponding to the check matrices from respective ones of the data matrices. Further details of the scheduler can be found in the Benefit application that has been included above.

Embodiments of the present disclosure using a LFSR and using a parallel syndrome sequencer do not require accessing an encoding matrix stored in main memory during the encoding or decoding process. Empirical tests using such embodiments show a substantial performance improvement over embodiments that access an encoding matrix stored in main memory on the order of approximately 8:1 to 10:1.

In more detail, many processors, including processors in the x86 family, have wide execution pipelines where a single CPU core of the processor can execute multiple instructions at the same time (in parallel). In particular, when the program instructions are ordered in a particular way and when register usage is interleaved properly, a CPU core can execute more than one instruction per clock cycle (sometimes two or more instructions per clock cycle) on a single core using multiple execution units that exist with a CPU core.

However, an access to a memory address, even if resolved in the L1 cache that is closest to the CPU core, takes at least four clock cycles, resulting at a 400% performance penalty that may actually be 800% or more because of the lost opportunity. As such, avoiding accessing data in memory (or cached in the L1 cache) by ensuring that all of the necessary constants for the operations are loaded into the registers, such as in the case of an LFSR or parallel syndrome sequencer according to embodiments of the present disclosure, where all of the necessary constants fit within the vector registers, provides a performance improvement of approximately 8:1 to 10:1.

In more detail and as one example, when performing an encoding process using an LFSR or parallel syndrome sequencer according to embodiments of the present disclosure, the CPU core accesses the main memory only once to retrieve the original data and then repeatedly uses constants that are stored in the vector registers to generate the check symbols for the original data (or to decode the original data in the case of decoding). Therefore, embodiments of the present disclosure eliminate the memory load instruction associated with retrieving rows of the encoding matrix (or the rows of the decoding matrix in the case of decoding operation). The elimination of these memory load operations in embodiments of the present disclosure therefore significantly improves performance at least because the CPU core does not need to wait several cycles to retrieve constants from the main memory.

As one specific example, the RS Polynomial Code of (255, 239) (239 data symbols, 16 check symbols, for a total of 255 symbols) would have an encoding matrix that is 239 members wide and 16 members deep. That is, for each of the 239 data values, 16 different values must be loaded from the encoding matrix in main memory into a register, where each of these loads requires a 4 cycle delay.

In contrast, using an LFSR to generate 16 check values for some input data symbols involves the use of an LFSR with 16 taps, where each tap is supplied with a corresponding constant. These 16 constants are reused for the entire message of 239 data values, and therefore an LFSR does not need to incur a delay (e.g., at least four cycle delay) to retrieve constants from the main memory (or L1 cache) because the 16 constants can reside continuously (for example) in 16 of the 32 AVX-512 SIMD registers of the CPU core. A parallel syndrome sequencer exhibits similar benefits in that the same constants are reused throughout the encoding or decoding process. Accordingly, using an LFSR and/or a parallel syndrome sequencer provides 400% to 800% (or more) performance improvement over a comparative technique using an encoding matrix by avoiding or omitting or eliminating memory load operations from an inner loop of the encoding or decoding process.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A system adapted to use accelerated error-correcting code (ECC) processing to improve the storage and retrieval of digital data distributed across a plurality of drives, comprising:
  at least one processor comprising at least one single-instruction-multiple-data (SIMD) processing core that executes SIMD instructions loaded from at least one non-volatile storage medium and loads original data from a memory and stores check data to the memory, the SIMD processing core comprising a plurality of vector registers, each of the vector registers storing at least 16 bytes;
  a plurality of data drives each comprising at least one non-volatile storage medium that stores at least one block of the original data, the at least one block comprising at least 512 bytes;
  more than two check drives each comprising at least one non-volatile storage medium that stores at least one block of the check data; and
  at least one input/output (I/O) controller that stores the at least one block of the check data from the memory to the check drives, wherein the processor, the SIMD instructions, the at least one non-volatile storage medium, and the I/O controller implement a polynomial coding system comprising:
  a data matrix comprising at least one vector and comprising a plurality of rows of at least one block of the original data in the memory, each of the rows being stored on a different one of the data drives;
  a check matrix comprising more than two rows of the at least one block of the check data in the memory, each of the rows being stored on a different one of the check drives; and
  a thread that executes on the SIMD processing core and comprising:
    at least one parallel multiplier that multiplies the at least one vector of the data matrix by a single factor to compute parallel multiplier results comprising at least one vector; and
    a parallel linear feedback shift register (LFSR) sequencer wherein the parallel LFSR sequencer orders load operations of the original data into at least one of the vector registers and computes the check data with the at least one parallel multiplier and stores the computed check data from the vector registers to the memory.

2. The system of claim 1, wherein:
the SIMD processing core comprises a plurality of processing cores;
the thread comprises a plurality of threads; and
the polynomial coding system further comprises a scheduler for generating the check data by:
  dividing the data matrix into a plurality of data matrices;
  dividing the check matrix into a plurality of check matrices;
  assigning corresponding ones of the data matrices and the check matrices to the threads; and
  assigning the threads to the processing cores to concurrently generate portions of the check data corresponding to the check matrices from respective ones of the data matrices.

3. The system of claim 1, wherein the SIMD instructions implementing the at least one parallel multiplier of the thread comprise a GF2P8MULB instruction.

4. The system of claim 1, wherein a primitive polynomial of a Galois field of a Galois field multiplication instruction of the processing core is different from a primitive polynomial of a Galois field of a polynomial code of the polynomial coding system, and
  wherein the SIMD instructions comprise instructions corresponding to the at least one parallel multiplier comprise instructions that, when executed by the processing core, cause the processing core to implement a parallel lookup Galois field multiplier.

5. The system of claim 4, wherein the instructions that implement the parallel lookup Galois field multiplier include a SIMD shuffle instruction.

6. The system of claim 1, wherein the LFSR sequencer computes T check symbols of the check data by supplying K data symbols of the original data to a LFSR having T coefficients supplied to T taps of the LFSR, wherein the T coefficients are coefficients of a generator polynomial.

7. A system adapted to use accelerated error-correcting code (ECC) processing to improve the storage and retrieval of digital data distributed across a plurality of drives, comprising:
  at least one processor comprising at least one single-instruction-multiple-data (SIMD) processing core that executes SIMD instructions loaded from at least one non-volatile storage medium and loads original data from a memory and stores check data to the memory, the SIMD processing core comprising a plurality of vector registers, each of the vector registers storing at least 16 bytes;
  a plurality of data drives each comprising at least one non-volatile storage medium that stores at least one block of the original data, the at least one block comprising at least 512 bytes;
  more than two check drives each comprising at least one non-volatile storage medium that stores at least one block of the check data; and
  at least one input/output (I/O) controller that stores the at least one block of the check data from the memory to the check drives,
  wherein the processor, the SIMD instructions, the at least one non-volatile storage medium, and the I/O controller implement a polynomial coding system comprising a linear feedback shift register (LFSR) sequencer that:
    initializes a plurality of values of the LFSR, the plurality of values being ordered from a least significant value to a most significant value, the plurality of values being stored in one or more of the vector registers;
    for each data symbol of a sequence of data symbols of the original data:
      adds the data symbol to the most significant value to compute a new input to the LFSR;
      shifts the new input into the LFSR; and
      updates the plurality of values of the LFSR based on previous values of the LFSR; and
    outputs the plurality of values of the LFSR as a plurality of check symbols of the check data.

8. The system of claim 7, wherein the polynomial coding system computes T symbols of check data from K symbols of the original data, wherein the plurality of values of the LFSR comprises T symbols.

9. The system of claim 8, wherein the LFSR sequencer has T coefficients supplied to T taps of the LFSR, wherein the T coefficients are coefficients of a generator polynomial of the polynomial coding system.

10. The system of claim 7, wherein the instructions to add the data symbol to the most significant value comprise instructions to compute a bitwise exclusive OR of the data symbol with a symbol stored in the most significant state to compute a carry value.

11. The system of claim 10, wherein the instructions to shift the new input into the LFSR and to update the plurality of values of the LFSR based on previous values of the LFSR comprise instructions to:
  Galois field (GF) multiply a plurality of coefficients of a generator polynomial of the polynomial coding system by the carry value to compute a plurality of GF products corresponding to the plurality of values of the LFSR; and
  for each value the plurality of values of the LFSR other than the least significant value, update the value stored in the one or more vector registers based on the bitwise exclusive OR of a symbol of an adjacent, less significant value of the LFSR and a corresponding GF product of the plurality of GF products.

12. The system of claim 11, wherein the SIMD instructions comprise a GF2P8MULB instruction to GF multiply the plurality of coefficients by the carry value.

13. The system of claim 11, wherein a primitive polynomial of a Galois field of a Galois field multiplication instruction of the processing core is different from a primitive polynomial of a Galois field of a polynomial code of the polynomial coding system, and wherein the SIMD instructions comprise instructions corresponding to at least one parallel multiplier comprising instructions that, when executed by the processing core, cause the processing core to implement a parallel lookup Galois field multiplier to multiply the plurality of coefficients by the carry value.

14. The system of claim 13, wherein the instructions that implement the parallel lookup Galois field multiplier include a SIMD shuffle instruction.

15. The system of claim 13, wherein the LFSR is a parallel LFSR that computes check symbols of multiple sequences of symbols of the original data in parallel.

16. A system adapted to use accelerated error-correcting code (ECC) processing to improve the storage and retrieval of digital data distributed across a plurality of drives, comprising:
- at least one processor comprising at least one single-instruction-multiple-data (SIMD) processing core that executes SIMD instructions loaded from at least one non-volatile storage medium and loads received original data and received check data from a memory and computes syndrome data, the SIMD processing core comprising at least 16 vector registers, each of the vector registers storing at least 16 bytes;
- a plurality of data drives each comprising at least one non-volatile storage medium that stores at least one block of the received original data, the at least one block comprising at least 512 bytes;
- more than two check drives each comprising at least one non-volatile storage medium that stores at least one block of the received check data; and
- at least one input/output (I/O) controller that reads at least one block of the received check data from the check drives and stores the at least one block of the received check data to the memory,
- wherein the processor, the SIMD instructions, the at least one non-volatile storage medium, and the I/O controller implement a polynomial coding system, comprising a parallel syndrome sequencer that:
  - initializes a first check vector with a first symbol of a sequence of symbols of a codeword comprising symbols of the received original data and symbols of the received check data;
  - initializes a second check vector with a Galois field (GF) product of the first symbol and a constant multiplicand stored in a vector register;
  - for each symbol other than the first symbol of the sequence of symbols of the codeword:
    - GF adds the symbol to the first check vector and the second check vector; and
    - GF multiplies the second check vector by the constant multiplicand;
  - computes error values based on the first check vector based on values that are non-zero; and
  - computes error locations by computing a log of a quotient of the first check vector and the second check vector.

17. The system of claim 16, wherein the SIMD instructions comprise a GF2P8MULB instruction to GF multiply the second check vector by the constant multiplicand.

18. The system of claim 16, wherein a primitive polynomial of a Galois field of a Galois field multiplication instruction of the processing core is different from a primitive polynomial of a Galois field of a polynomial code of the polynomial coding system, and wherein the SIMD instructions comprise instructions corresponding to at least one parallel multiplier comprising instructions that, when executed by the processing core, cause the processing core to implement a parallel lookup Galois field multiplier to multiply the second check vector by the constant multiplicand.

19. The system of claim 18, wherein the instructions that implement the parallel lookup Galois field multiplier include a SIMD shuffle instruction.

20. The system of claim 16, wherein the parallel syndrome sequencer computes error values and error locations for multiple codewords in parallel.

* * * * *